(12) United States Patent
Kim et al.

(10) Patent No.: US 8,470,454 B2
(45) Date of Patent: *Jun. 25, 2013

(54) MATERIAL FOR ORGANIC PHOTOELECTRIC DEVICE AND ORGANIC PHOTOELECTRIC DEVICE INCLUDING THE SAME

(75) Inventors: Nam-Soo Kim, Uiwang-si (KR); Myeong-Soon Kang, Uiwang-si (KR); Ho-Kuk Jung, Uiwang-si (KR); Eui-Su Kang, Uiwang-si (KR); Young-Sung Park, Uiwang-si (KR); Mi-Young Chae, Uiwang-si (KR); Jin-Seong Park, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/033,842

(22) Filed: Feb. 24, 2011

(65) Prior Publication Data
US 2011/0156014 A1  Jun. 30, 2011

Related U.S. Application Data

(63) Continuation of application No. PCT/KR2009/004730, filed on Aug. 25, 2009.

(30) Foreign Application Priority Data

Aug. 25, 2008 (KR) .................... 10-2008-0082905
Jun. 8, 2009 (KR) .................... 10-2009-0050580

(51) Int. Cl.
H01L 51/54 (2006.01)

(52) U.S. Cl.
USPC ........... 428/690; 428/917; 313/504; 313/506; 252/301.16; 257/40; 257/E51.05; 257/E51.051; 544/242

(58) Field of Classification Search
None
See application file for complete search history.

(56) References Cited

U.S. PATENT DOCUMENTS

| 7,629,060 | B2 | 12/2009 | Oshiyama et al. | |
|---|---|---|---|---|
| 2004/0086745 | A1 | 5/2004 | Iwakuma et al. | |
| 2004/0110031 | A1 | 6/2004 | Fukuda et al. | |
| 2004/0124766 | A1* | 7/2004 | Nakagawa et al. | 313/504 |
| 2007/0190355 | A1* | 8/2007 | Ikeda et al. | 428/690 |
| 2008/0199726 | A1 | 8/2008 | Schafer et al. | |

FOREIGN PATENT DOCUMENTS

| CN | 1934213 A | 3/2007 |
|---|---|---|
| CN | 1950479 A | 4/2007 |
| EP | 926216 A1 * | 6/1999 |
| EP | 1424381 A2 | 6/2004 |
| EP | 1724323 A1 | 11/2006 |
| JP | 2004-031004 A | 1/2004 |
| WO | WO 2005/105950 A1 | 11/2005 |

OTHER PUBLICATIONS

English language machine translation of JP 2004/031004 A, 2004.*
Tang, et al.; Organic electroluminescent diodes; Applied Physics Letters; Sep. 21, 1987; pp. 913-915; vol. 51; Issue 12; American Institute of Physics; United States.
O'Brien, et al.; Improved energy transfer in electrophosphorescent devices; Applied Physics Letters; Jan. 18, 1999; pp. 442-444; vol. 74; No. 3; American Institute of Physics; United States.
Baldo, et al.; Very high-efficiency green organic light-emitting devices based on electrophosphorescence; Jul. 5, 1999; pp. 4-6; vol. 75; No. 1; American Institute of Physics; United States.
European Search Report in EP 09810177.7-1235/2315753, dated Aug. 10, 2012 (Kim, et al.).
Chinese Search Report in CN 2009801269830.0, dated Nov. 29, 2012 (Kim, et al.).

* cited by examiner

Primary Examiner — Michael H Wilson
(74) Attorney, Agent, or Firm — Lee & Morse, P.C.

(57) ABSTRACT

A material for an organic photoelectric device and an organic photoelectric device including the same, the material including an asymmetric compound represented by the following Chemical Formula 1:

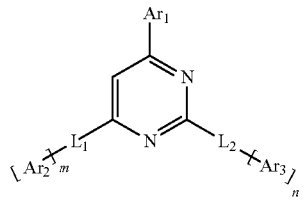

Chemical Formula 1 wherein, in Chemical Formula 1, $Ar_1$ is hydrogen or a substituted or unsubstituted aryl, provided that when $Ar_1$ is a substituted aryl having a substituent, $Ar_2$ is not the same as the substituent of $Ar_1$, $Ar_2$ and $Ar_3$ are each independently a substituted or unsubstituted carbazolyl, a substituted or unsubstituted C2 to C30 heteroaryl, a substituted or unsubstituted C2 to C30 arylamine, or a substituted or unsubstituted C2 to C30 heteroarylamine, $L_1$ and $L_2$ are each independently a substituted or unsubstituted phenylene, a substituted or unsubstituted naphthylene, or a substituted or unsubstituted anthracene, and m and n are each independently integers of 1 to 4.

17 Claims, 4 Drawing Sheets

MATERIAL FOR ORGANIC PHOTOELECTRIC DEVICE AND ORGANIC PHOTOELECTRIC DEVICE INCLUDING THE SAME

CROSS-REFERENCE TO RELATED APPLICATION

This application is a continuation of pending International Application No. PCT/KR2009/004730, entitled "Material for Organic Photoelectric Device and Organic Photoelectric Device Including the Same," which was filed on Aug. 25, 2009, the entire contents of which are hereby incorporated by reference for all purposes.

BACKGROUND

1. Field

Embodiments relate to a material for an organic photoelectric device and an organic photoelectric device including the same.

2. Description of the Related Art

An organic photoelectric device is a device in which a charge exchange occurs between an electrode and an organic material by using a hole or an electron.

An organic photoelectric device may be classified as follows in accordance with its driving principles. One type of organic photoelectric device is an electron device that may be driven as follows: excitons may be generated in an organic material layer by photons from an external light source; the excitons may be separated to electrons and holes; and the electrons and holes may be transferred to different electrodes from each other as a current source (voltage source).

Another organic photoelectric device is an electron device and may be driven as follows: a voltage or a current may be applied to at least two electrodes to inject holes and/or electrons into an organic material semiconductor positioned at an interface of the electrodes; and then the device may be driven by the injected electrons and holes.

The organic photoelectric device may include, e.g., an organic light emitting diode (OLED), an organic solar cell, an organic photo-conductor drum, an organic transistor, an organic memory device, etc.

SUMMARY

Embodiments are directed to a material for an organic photoelectric device and an organic photoelectric device including the same.

The embodiments may be realized by providing a material for an organic photoelectric device, the material comprising an asymmetric compound represented by the following Chemical Formula 1:

Chemical Formula 1

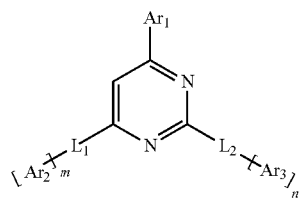

wherein, in Chemical Formula 1, $Ar_1$ may be hydrogen or a substituted or unsubstituted aryl, provided that when $Ar_1$ is a substituted aryl having a substituent, $Ar_2$ is not the same as the substituent of $Ar_1$, $Ar_2$ and $Ar_3$ may each independently be a substituted or unsubstituted carbazolyl, a substituted or unsubstituted C2 to C30 heteroaryl, a substituted or unsubstituted C2 to C30 arylamine, or a substituted or unsubstituted C2 to C30 heteroarylamine, $L_1$ and $L_2$ may each independently be a substituted or unsubstituted phenylene, a substituted or unsubstituted naphthylene, or a substituted or unsubstituted anthracene, and m and n may each independently be integers of 1 to 4.

$Ar_1$ may be a phenyl, a naphthyl, an anthracenyl, a phenanthrenyl, a pyrenyl, a perylenyl, or a chrysenyl.

$Ar_1$ may be substituted with a substituent, the substituent including at least one of a C1 to C30 alkyl, a C1 to C10 heteroalkyl, a C3 to C30 cycloalkyl, a C6 to C30 aryl, a C1 to C30 alkoxy, a fluoro, and a cyano.

$Ar_2$ and $Ar_3$ may each independently be an imidazolyl, a thiazolyl, an oxazolyl, an oxadiazolyl, a triazolyl, a pyridinyl, a pyridazine, a quinolinyl, an isoquinolinyl, an acridyl, an imidazopyridinyl, an imidazopyrimidinyl, a diphenyl amine, a dinaphthyl amine, a dibiphenyl amine, a phenyl naphthyl amine, a phenyl diphenyl amine, a ditolyl amine, a phenyl tolyl amine, a carbazoyl, a triphenylamine, or a dipyridylamine.

$L_1$ and $L_2$ may each be a phenylene.

The compound represented by Chemical Formula 1 may include at least one of the following compounds (1) to (90):

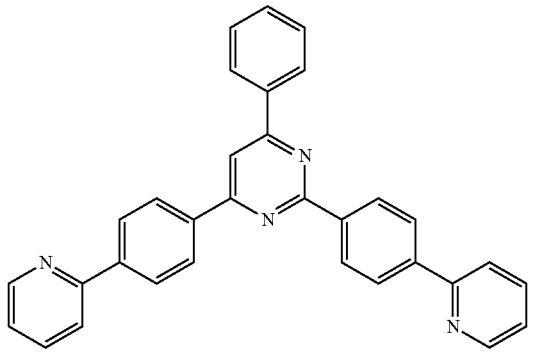

(1)

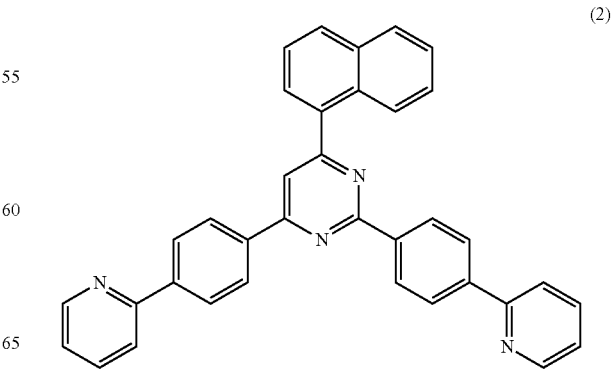

(2)

(3)
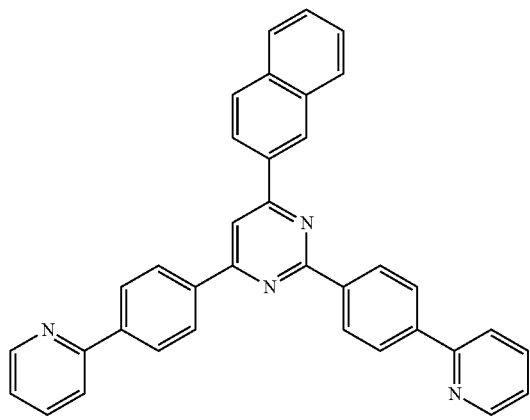
(4)
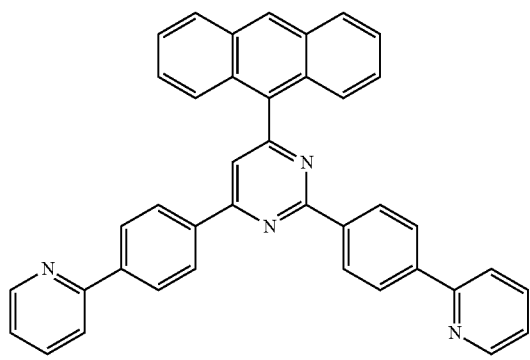
(5)
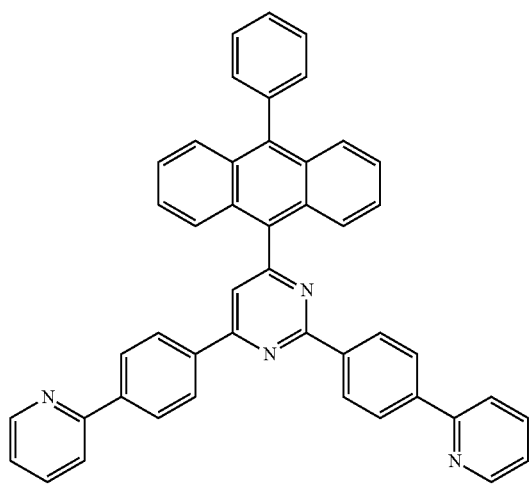
(6)
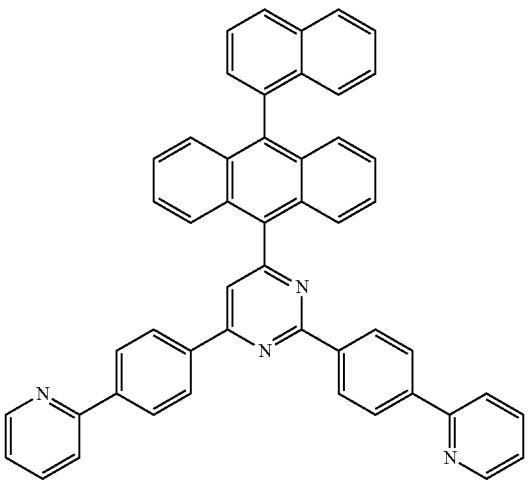
(7)
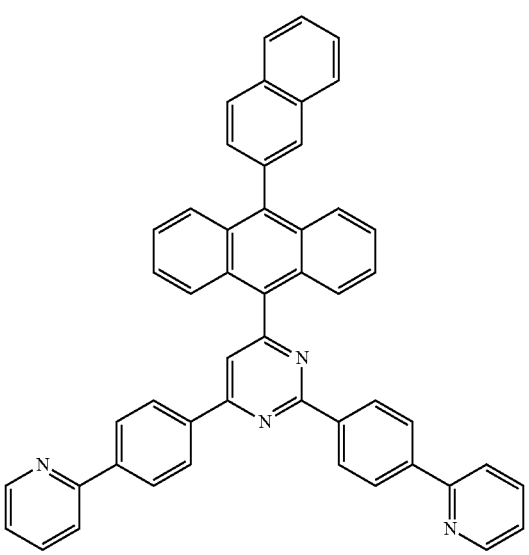
(8)
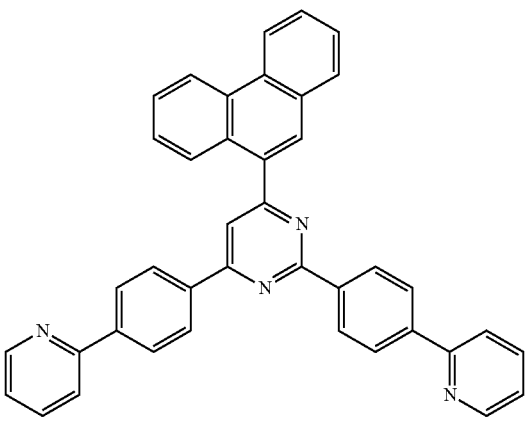

(9)
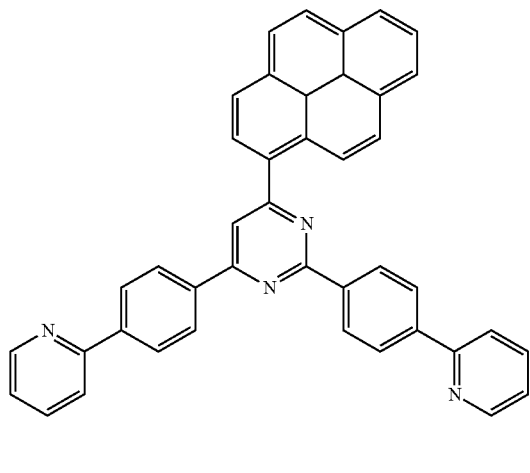
(10)
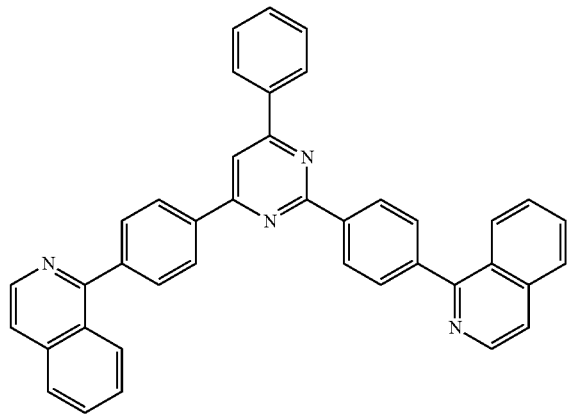
(11)
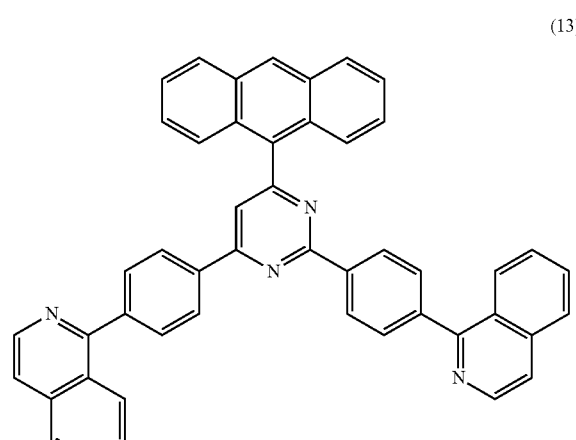
(12)
(13)
(14)
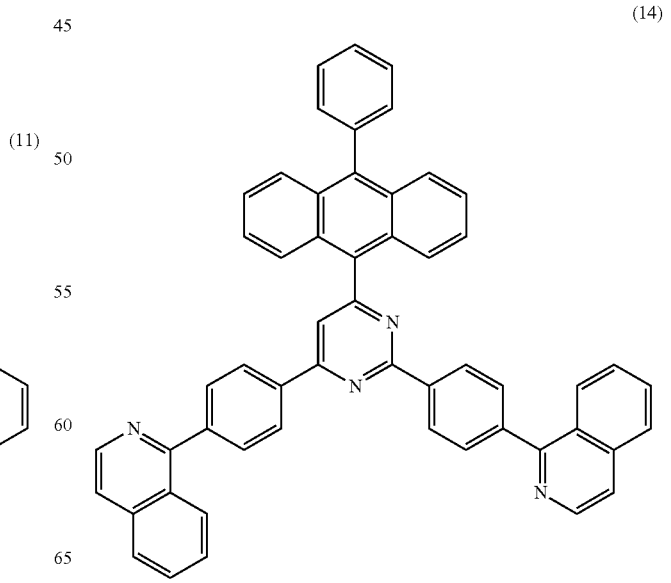

(15)
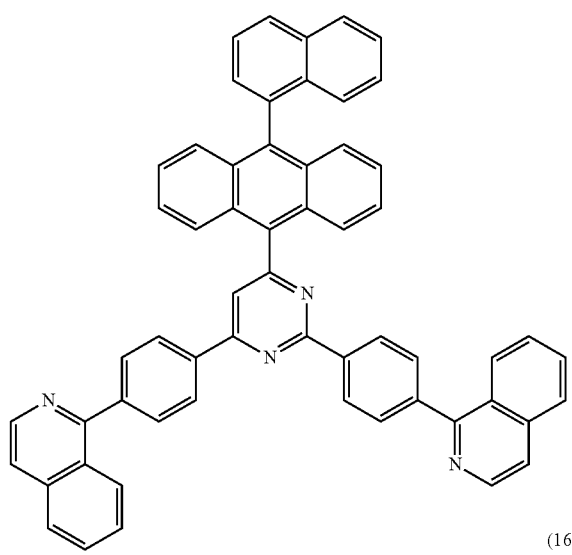
(16)
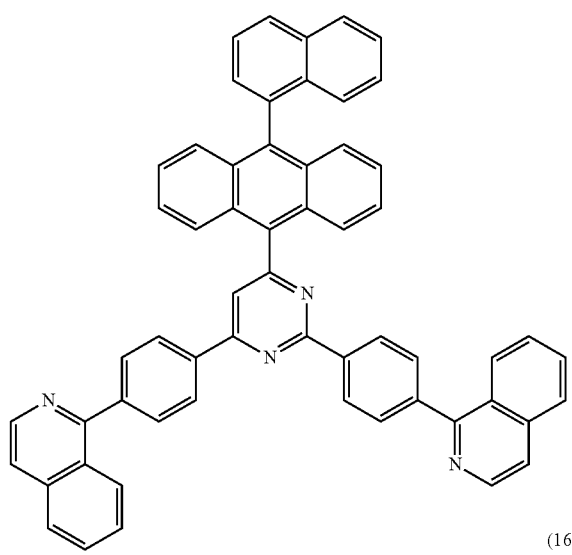
(17)
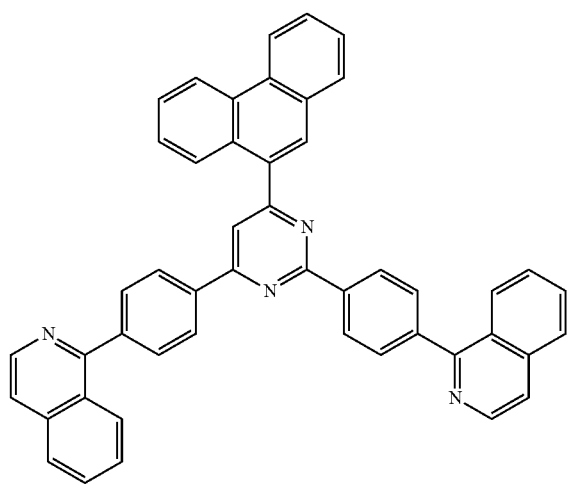
(18)
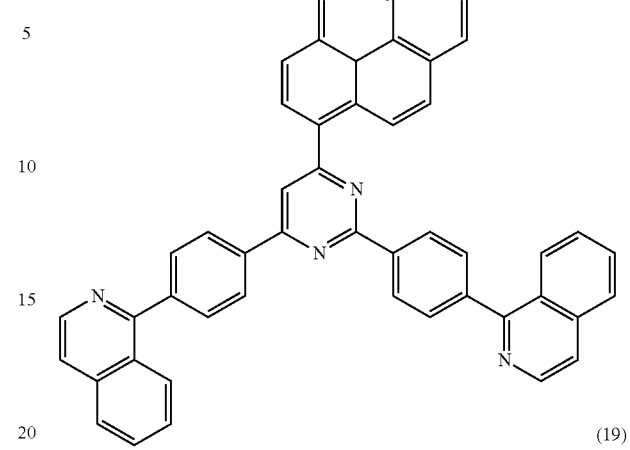
(19)
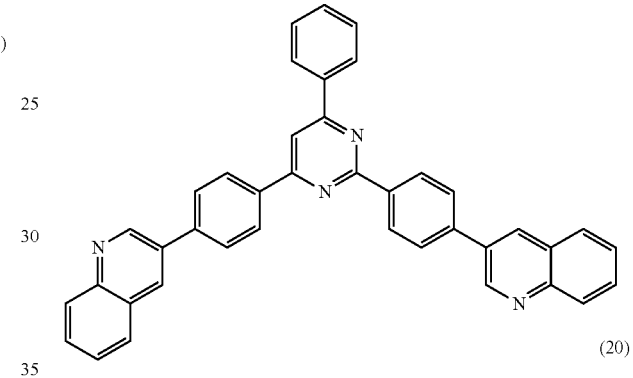
(20)
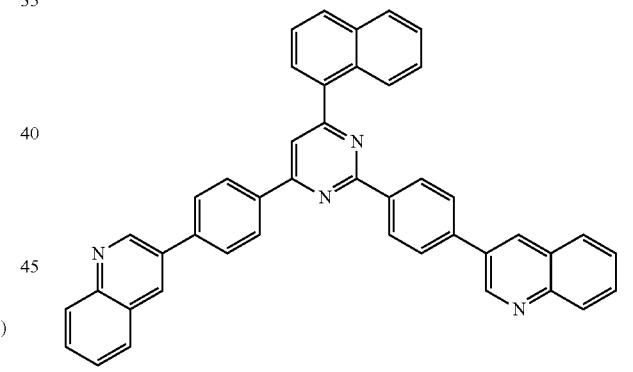
(21)
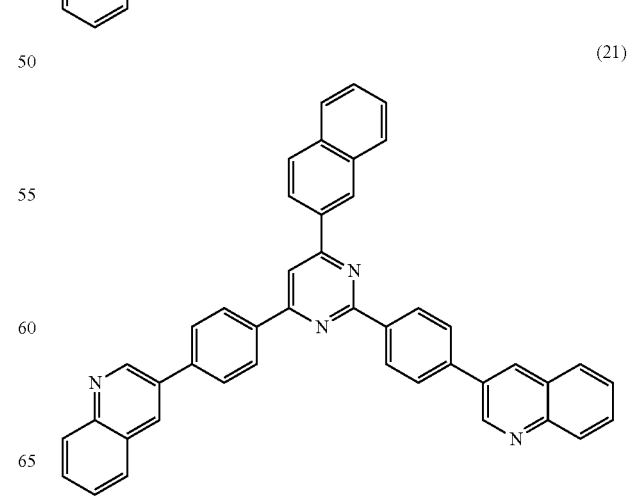

(22)
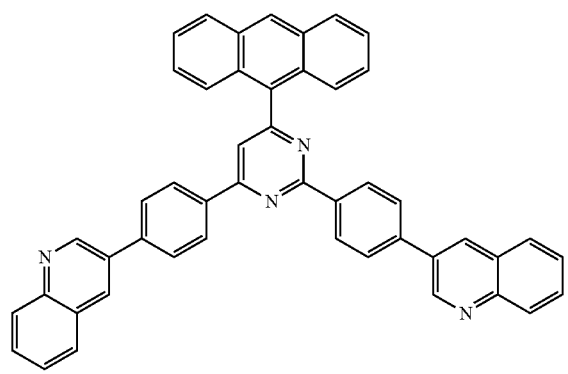
(23)
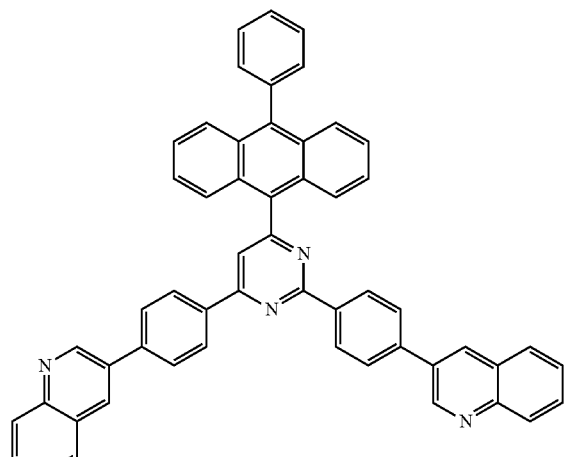
(24)
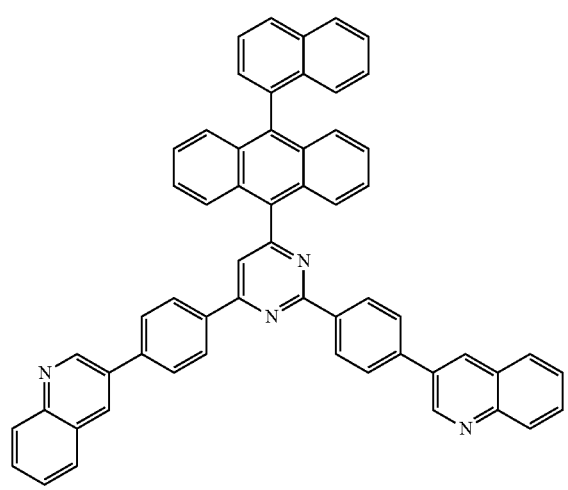
(25)
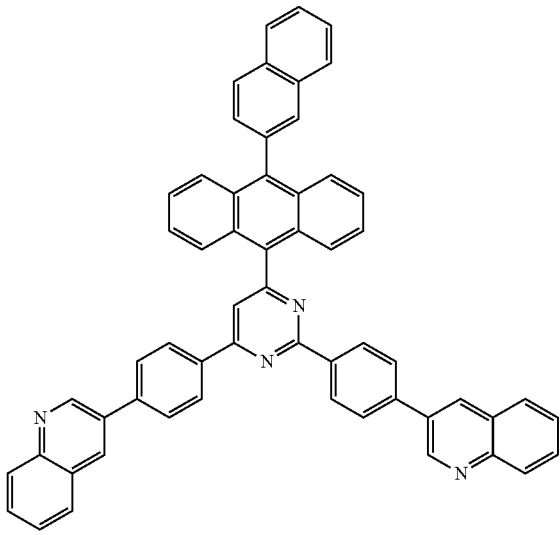
(26)
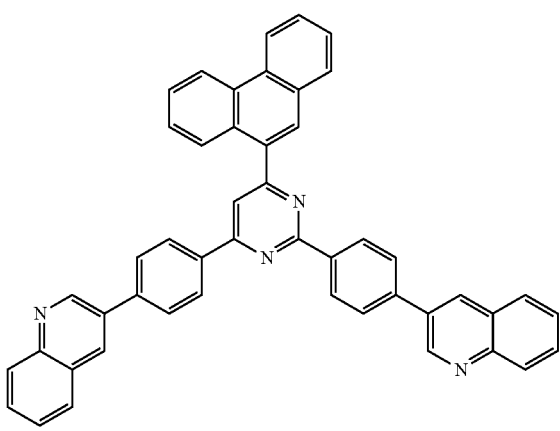
(27)
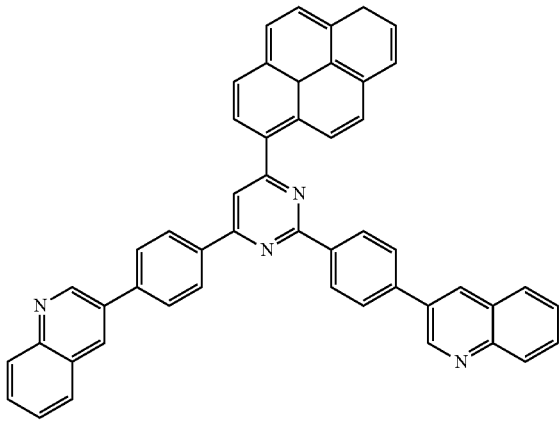

(28)
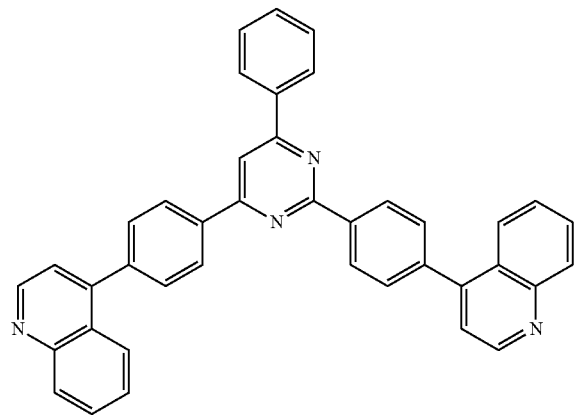
(29)
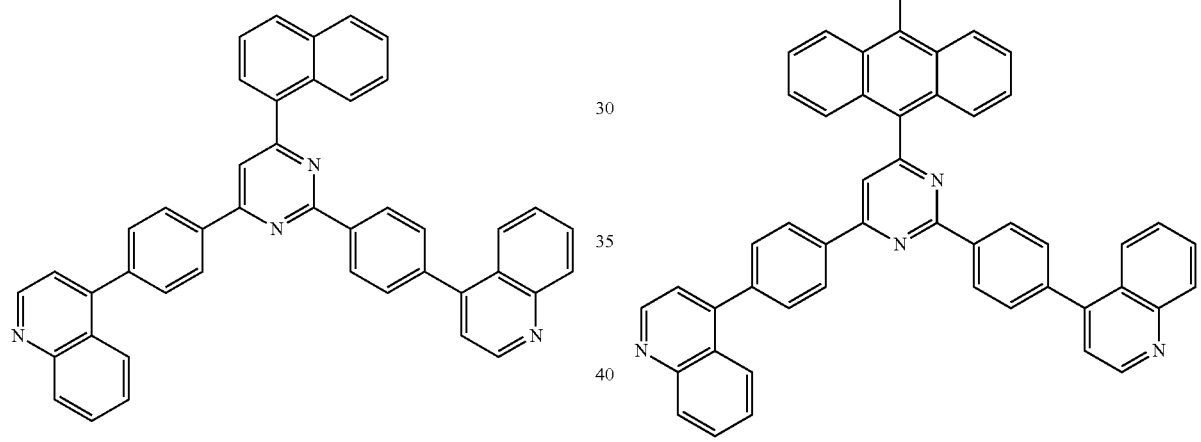
(30)
(31)
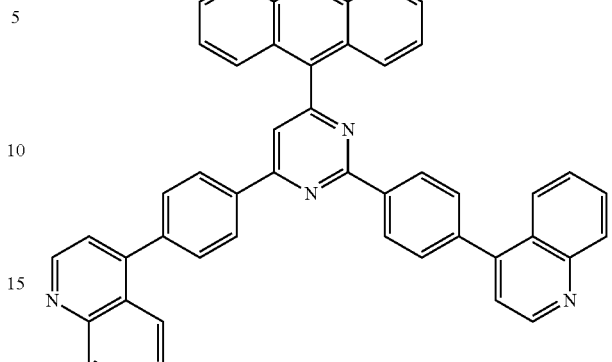
(32)
(33)
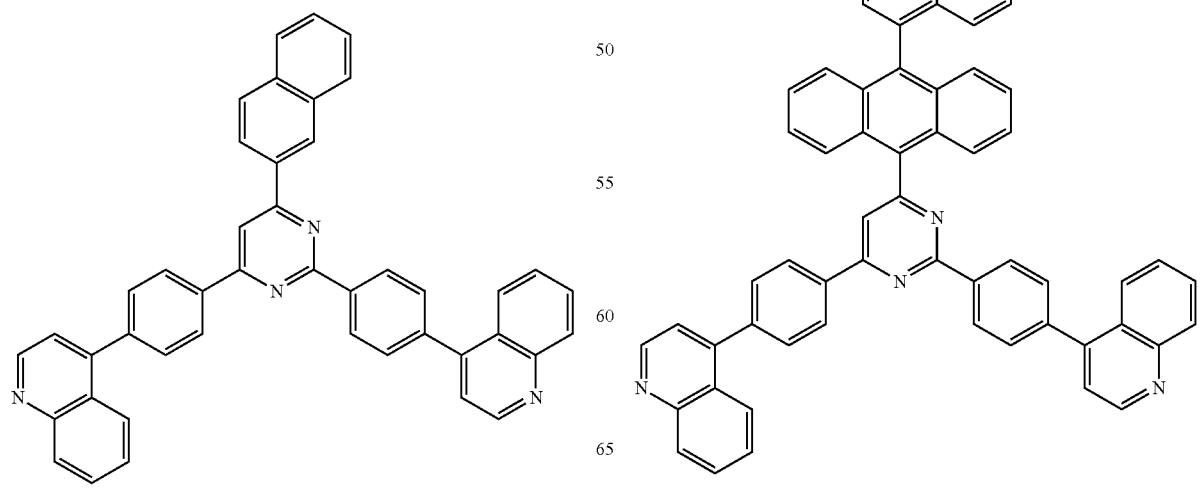

(34)
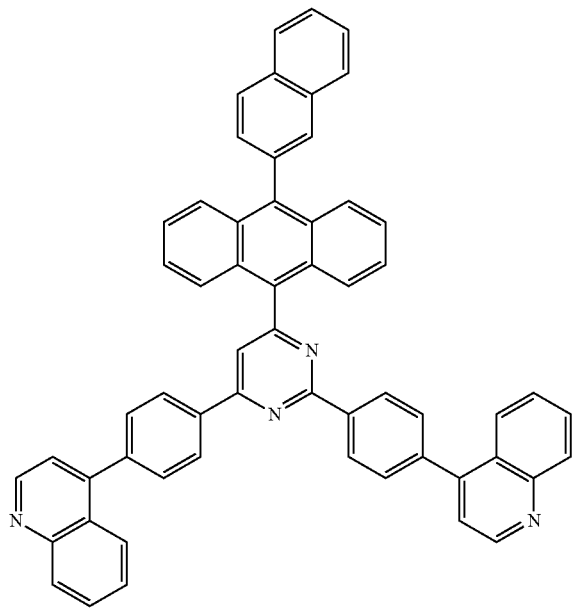
(35)
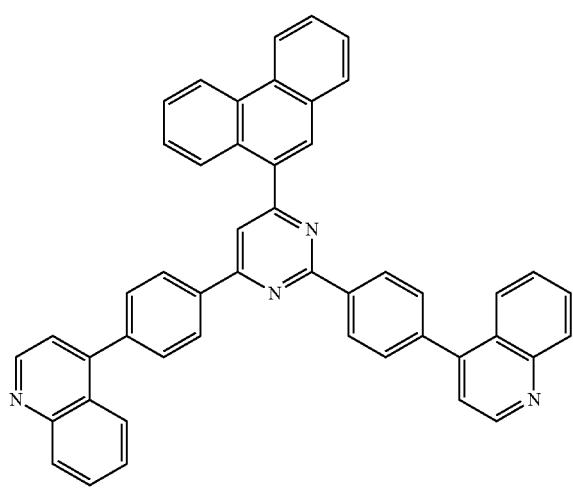
(36)
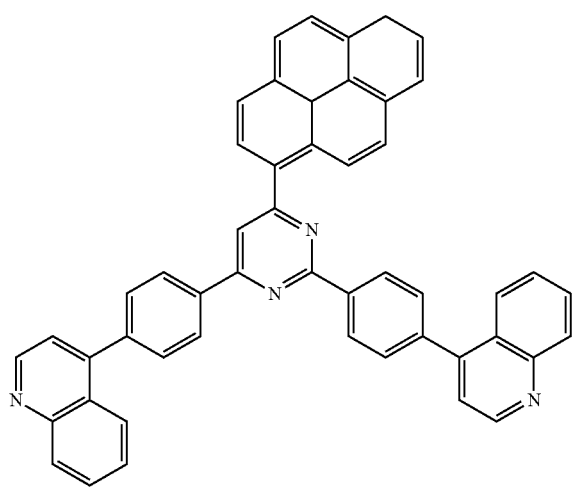
(37)
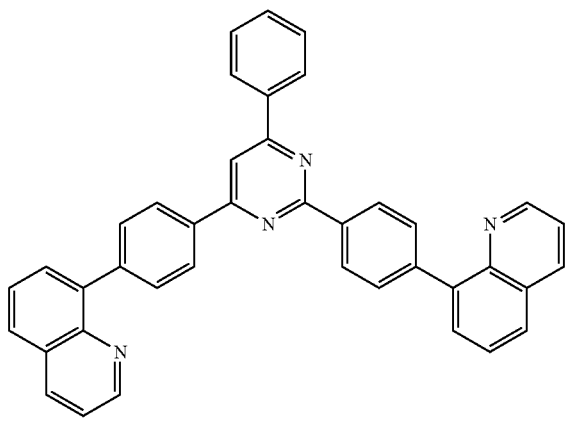
(38)
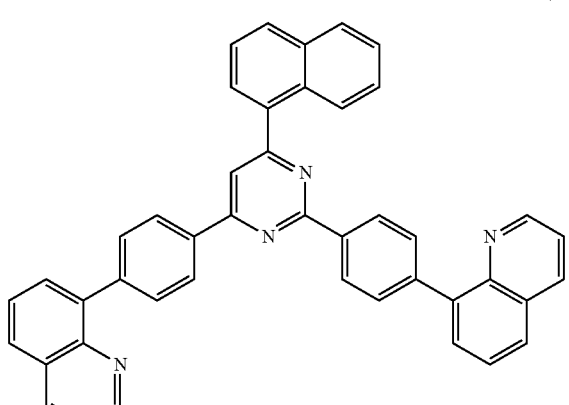
(39)
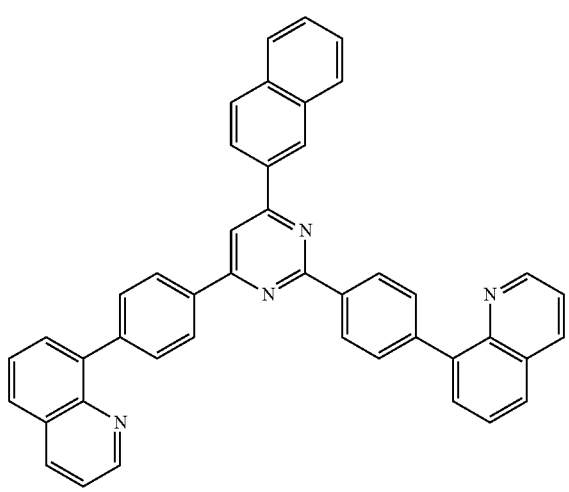

(40)
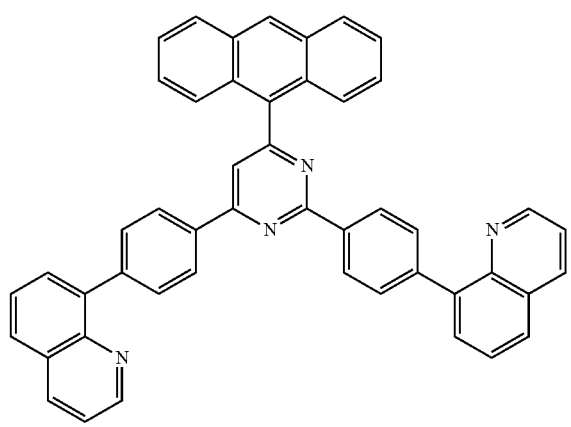
(41)
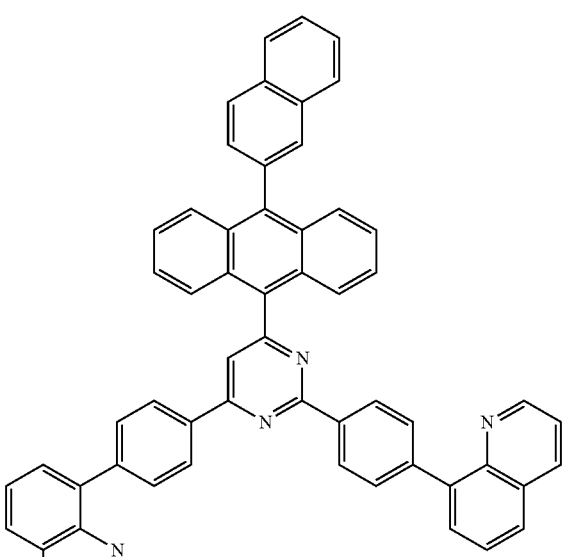
(42)
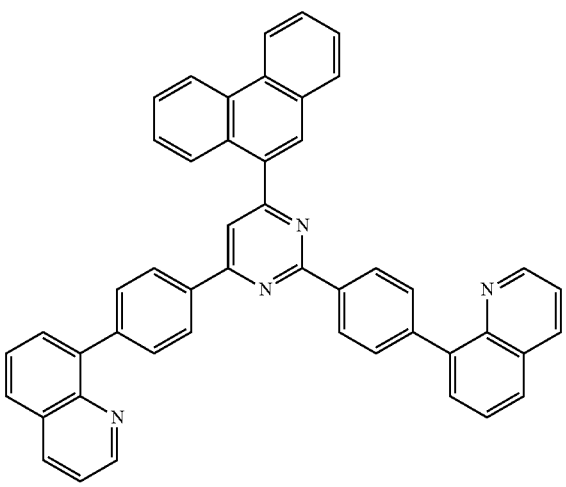
(43)
(44)
(45)
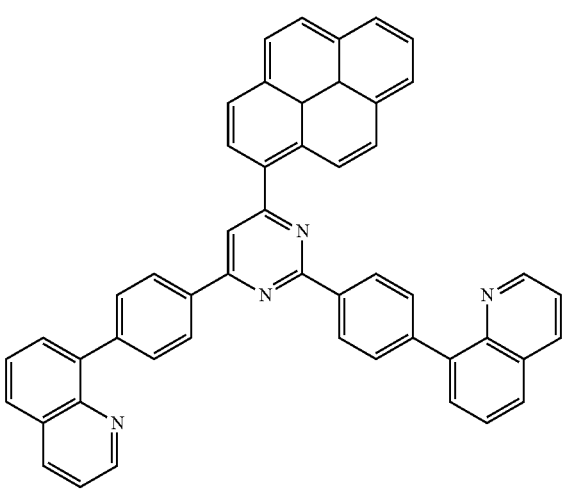

(46)
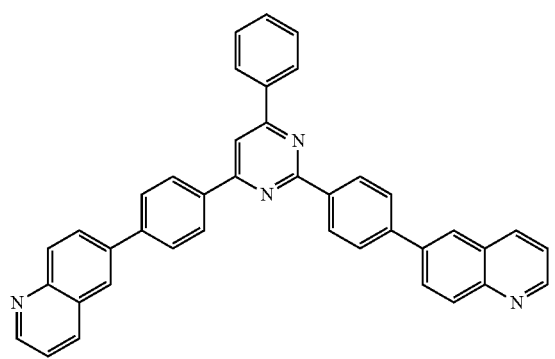
(47)
(48)
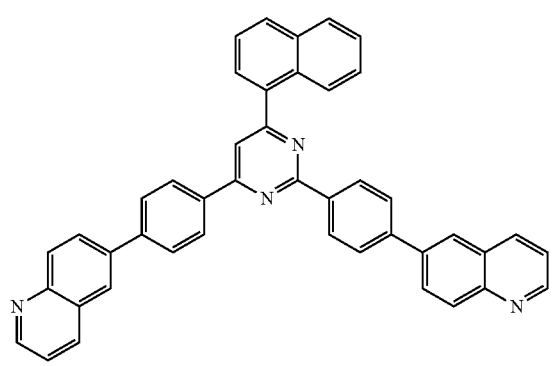
(49)
(50)
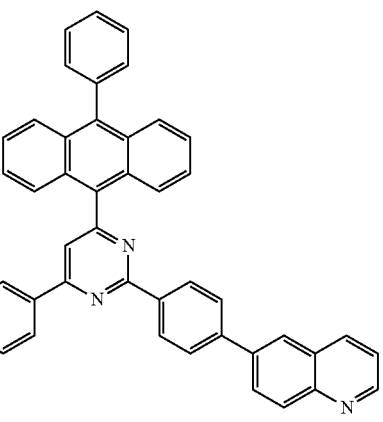
(51)
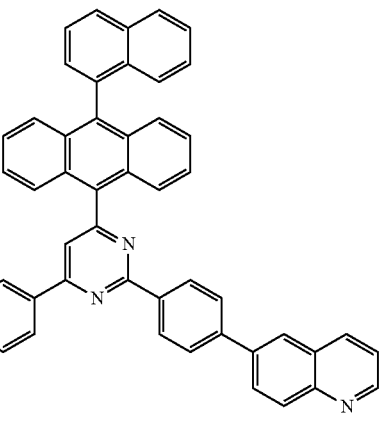
(52)
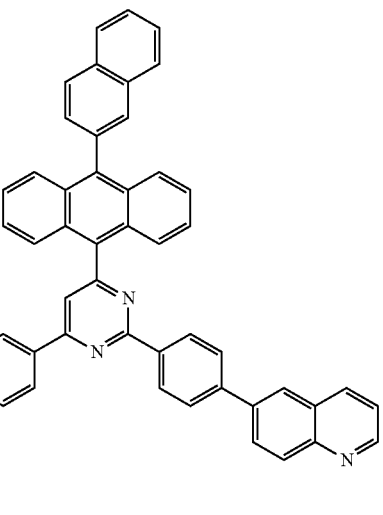

(53)
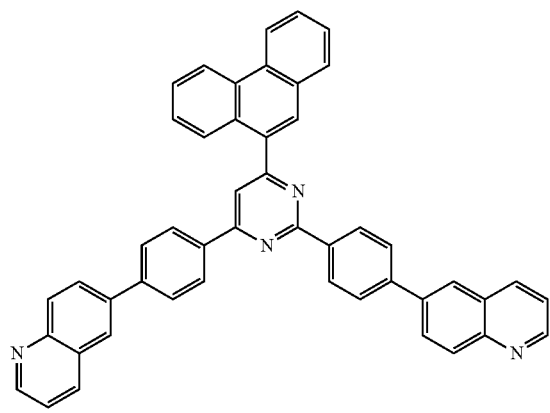
(54)
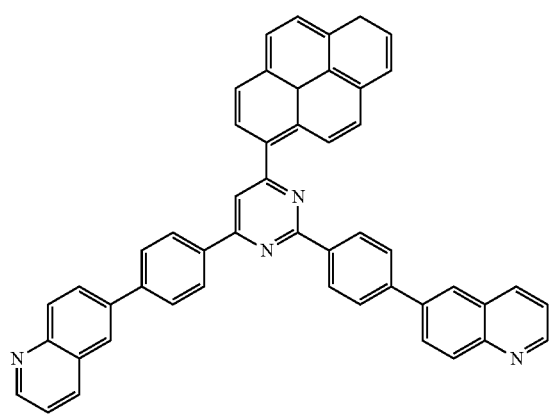
(55)
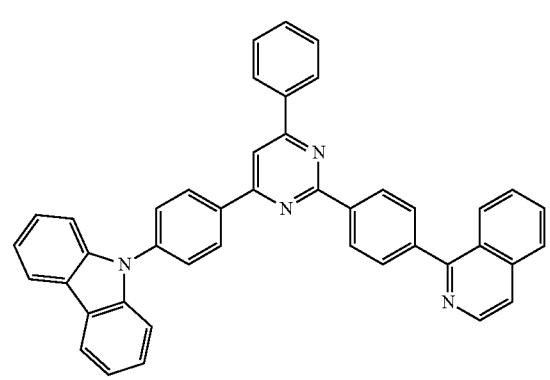
(56)
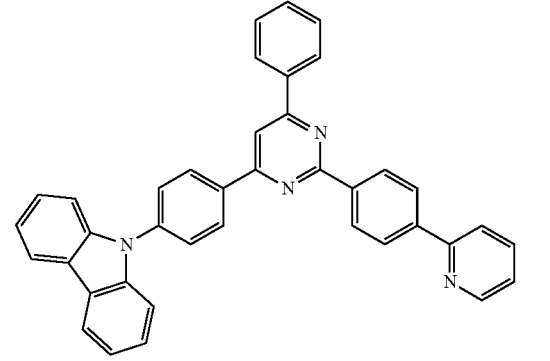
(57)
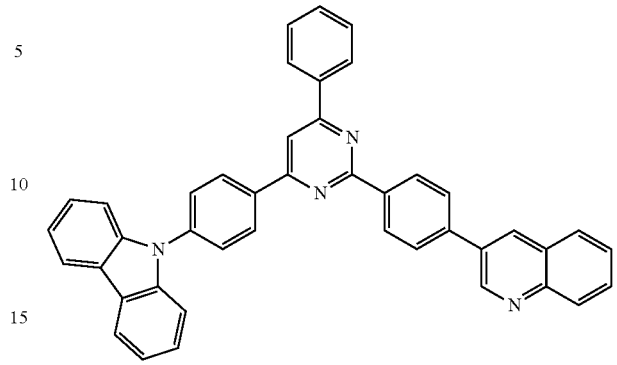
(58)
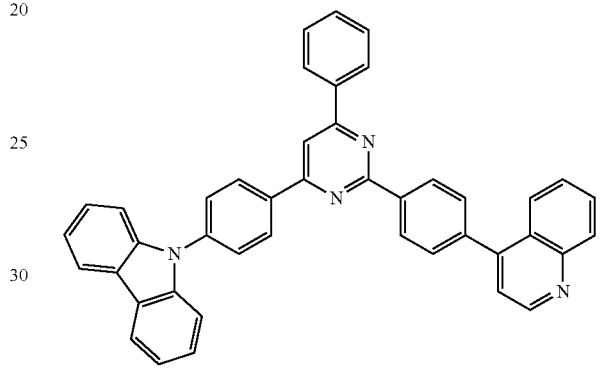
(59)
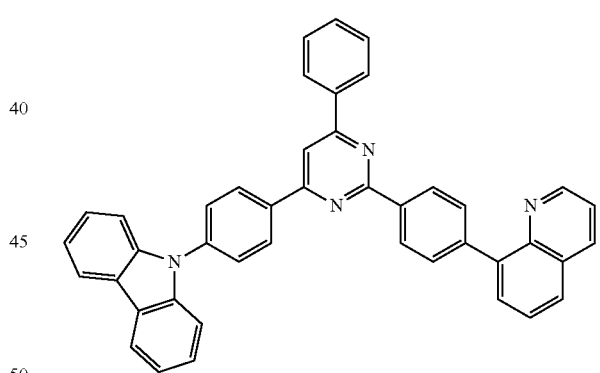
(60)
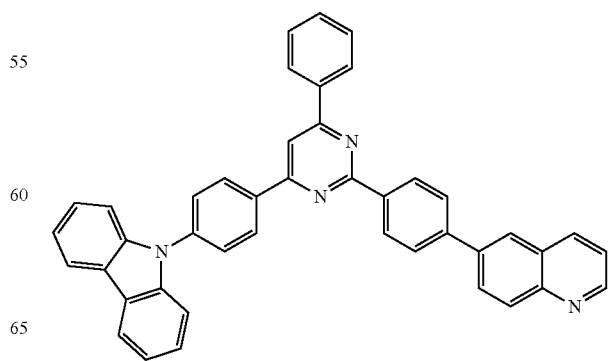

-continued
(61)
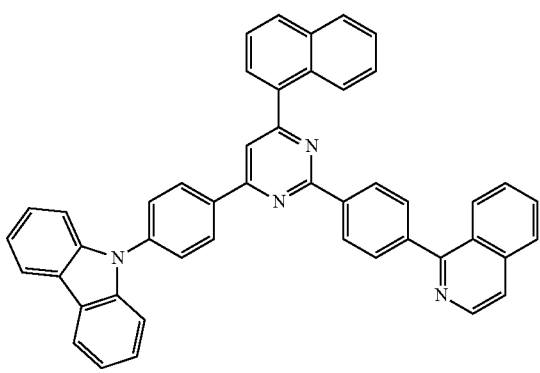
(62)
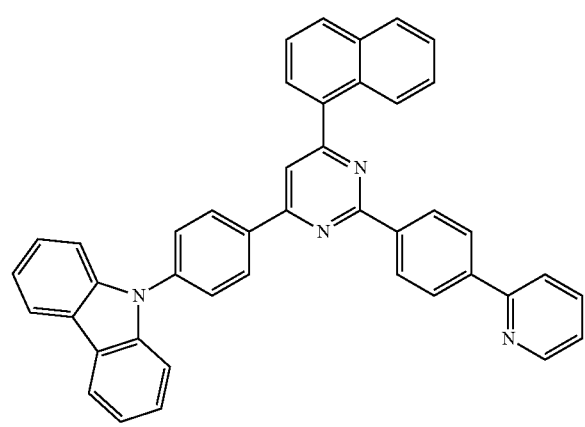
(63)
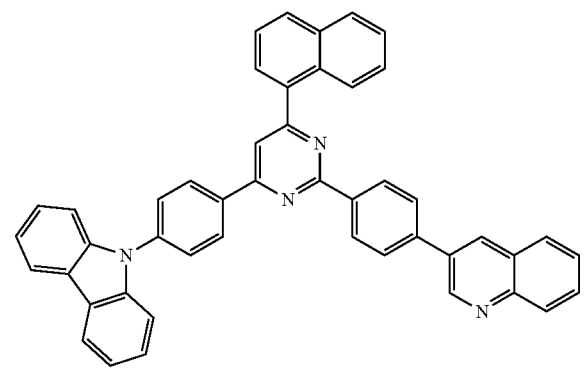
(64)
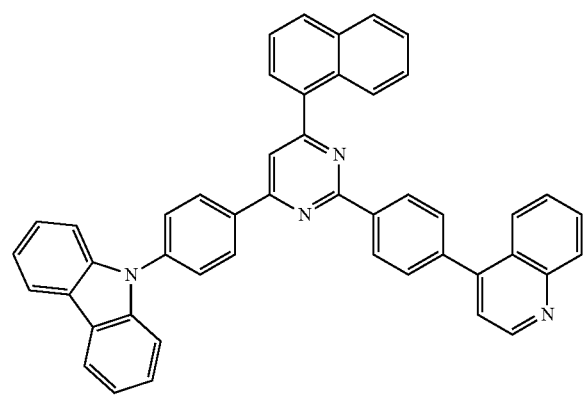
-continued
(65)
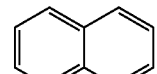
(66)
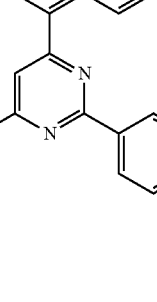
(67)
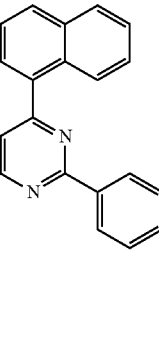
(68)
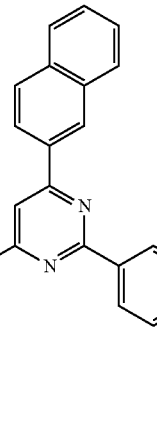

(69)
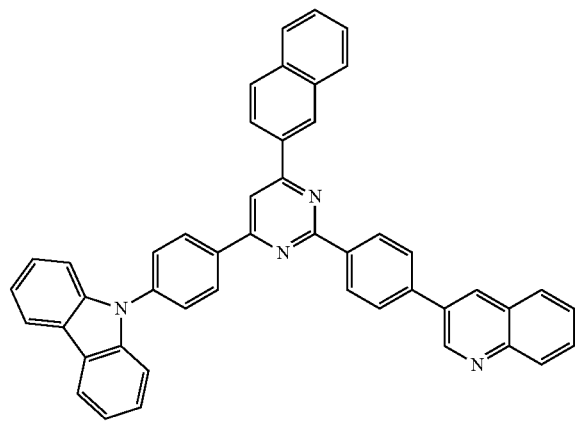
(70)
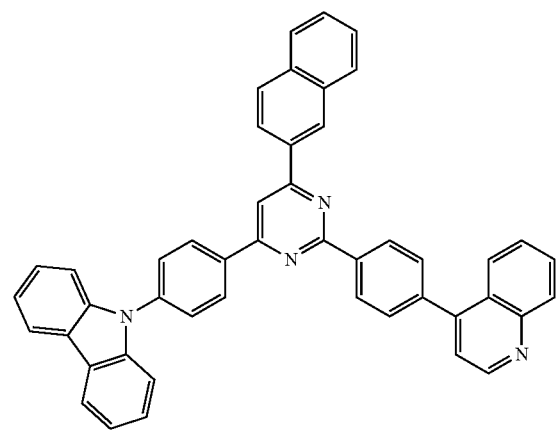
(71)
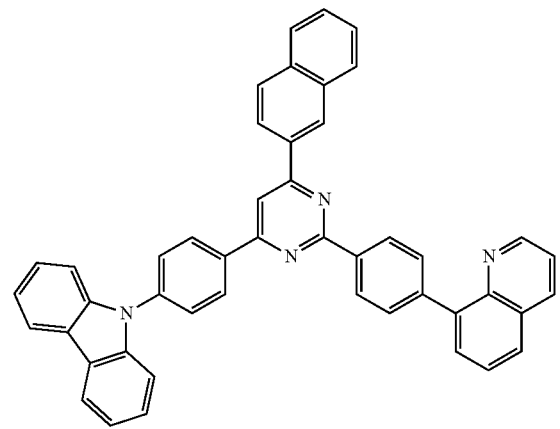
(72)
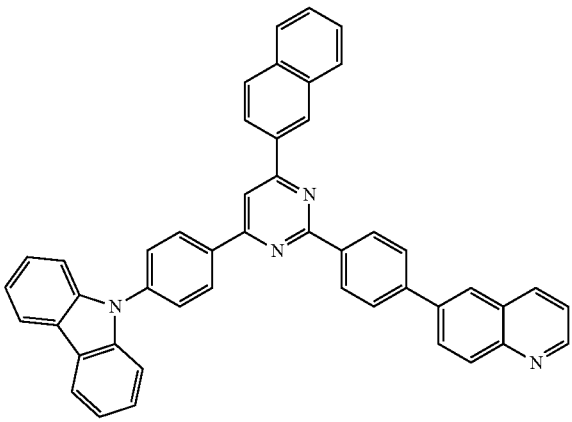
(73)
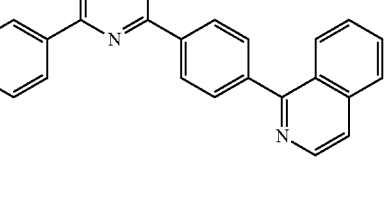
(74)
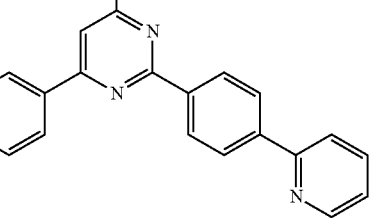
(75)
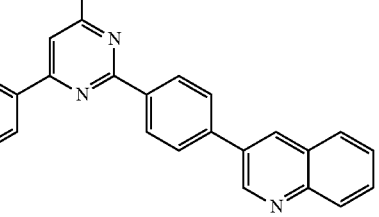

(76)
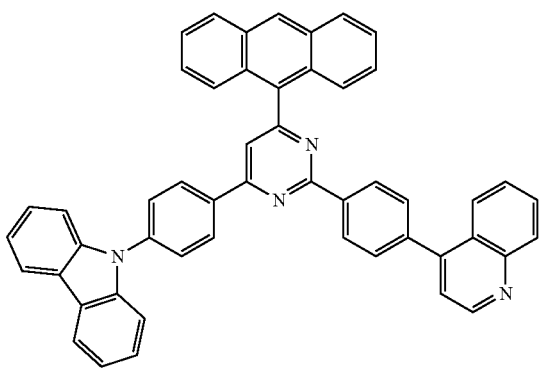
(77)
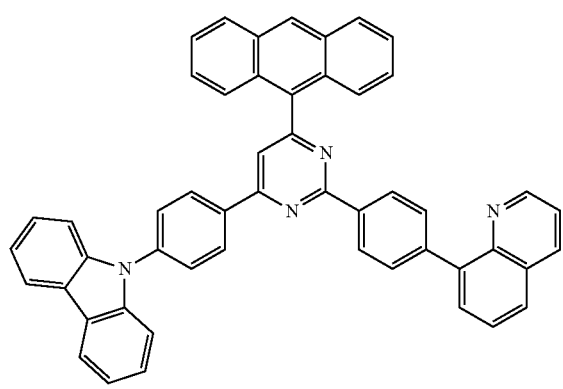
(78)
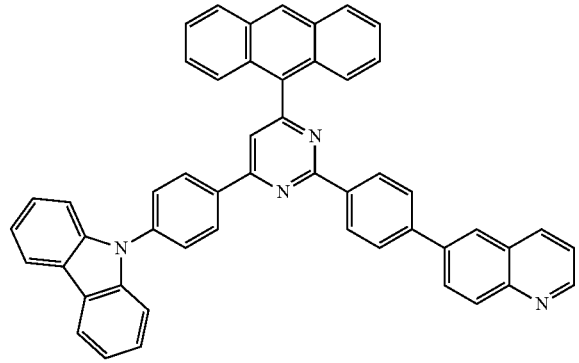
(79)
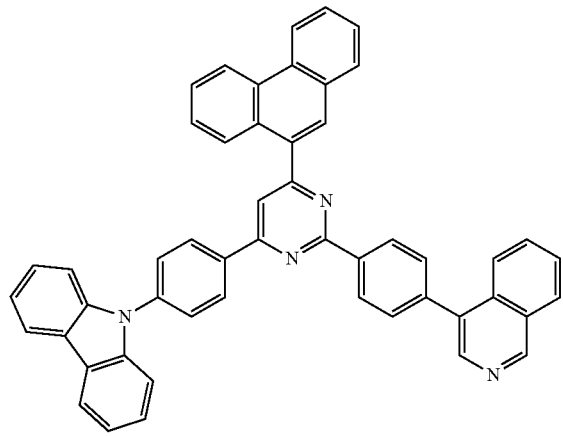
(80)
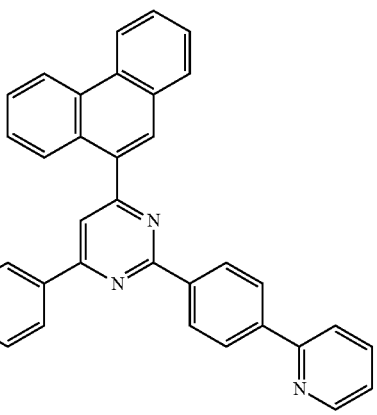
(81)
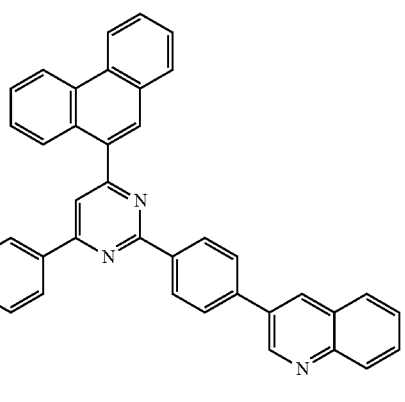
(82)
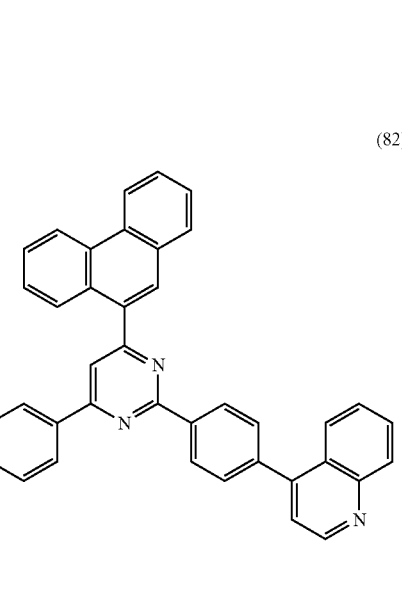

(83)
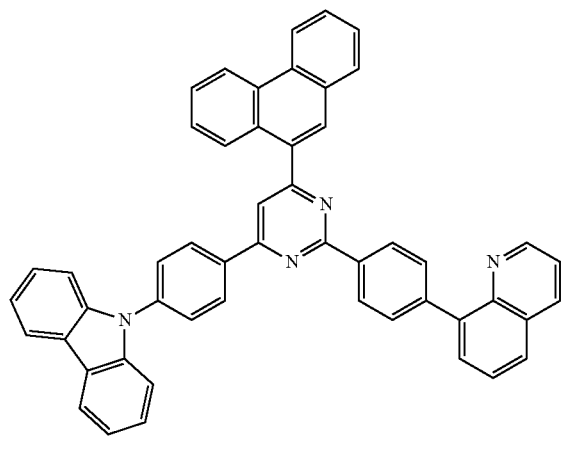
(86)
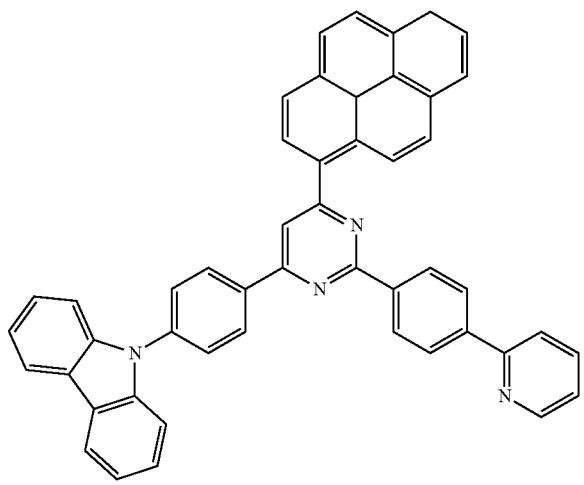
(84)
(87)
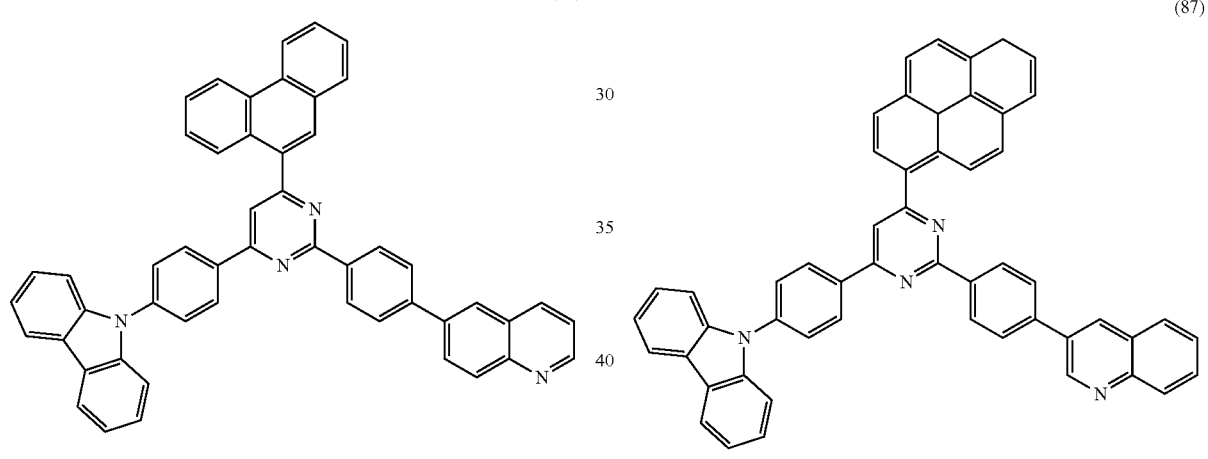
(85)
(88)
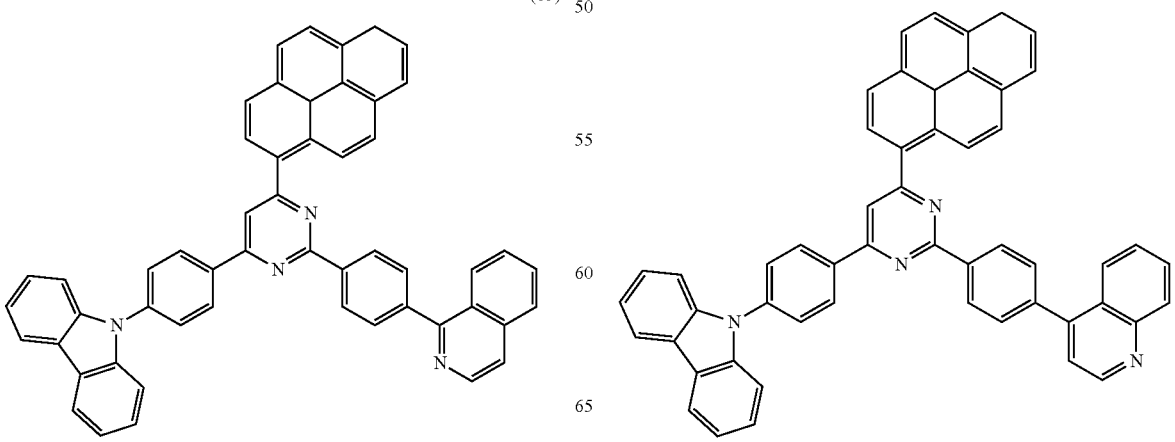

(89)
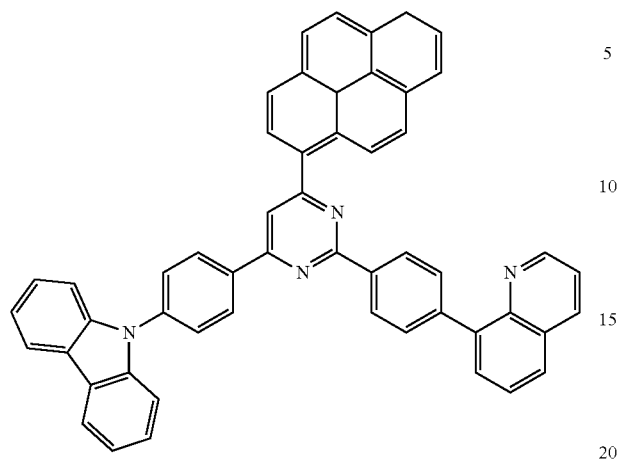
(90)
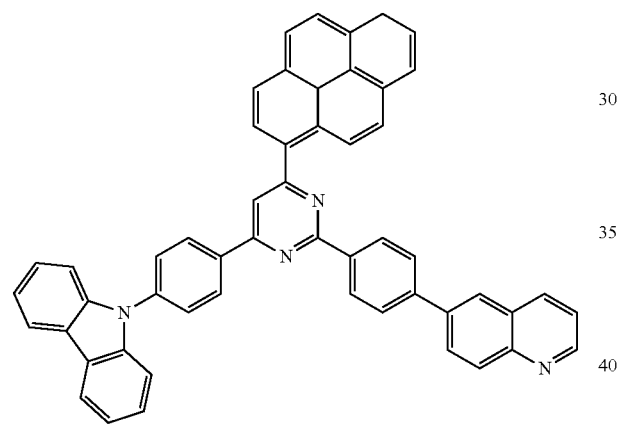
The compound represented by Chemical Formula 1 may include at least one of the following compounds (1) to (15):
(1)
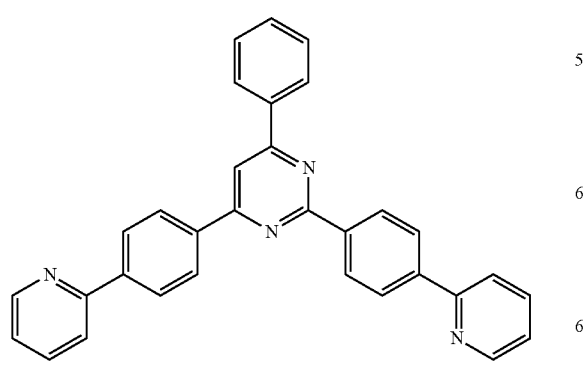
(2)
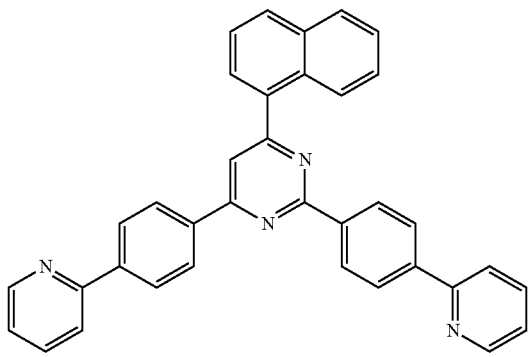
(3)
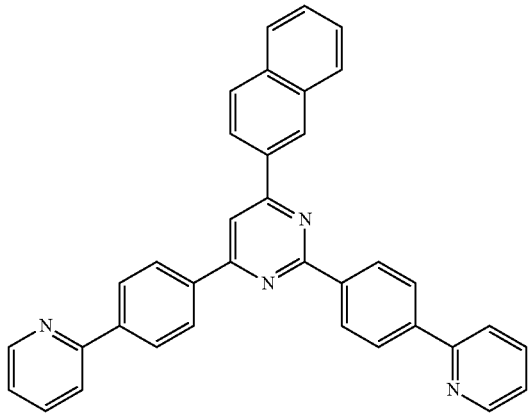
(4)
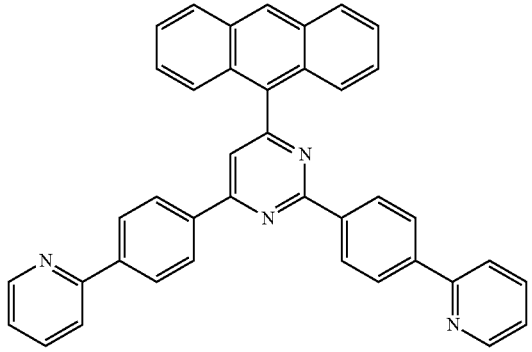

(5)
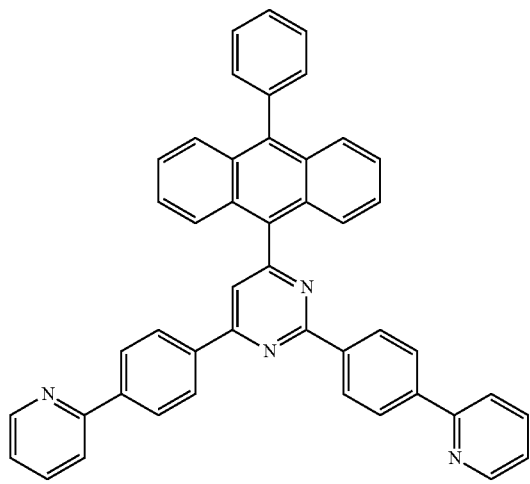
(6)
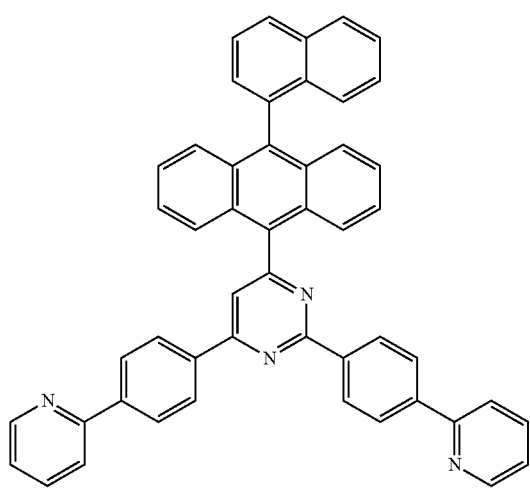
(7)
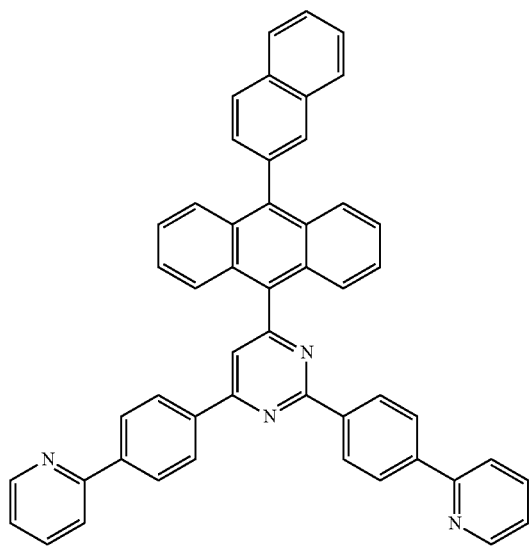
(8)
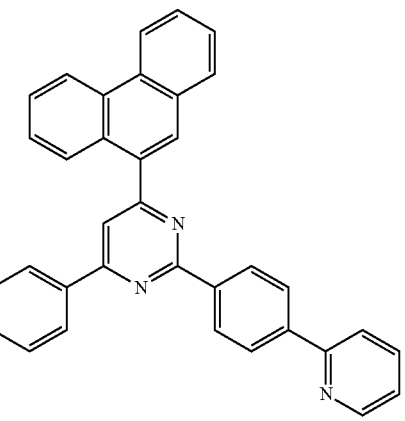
(9)
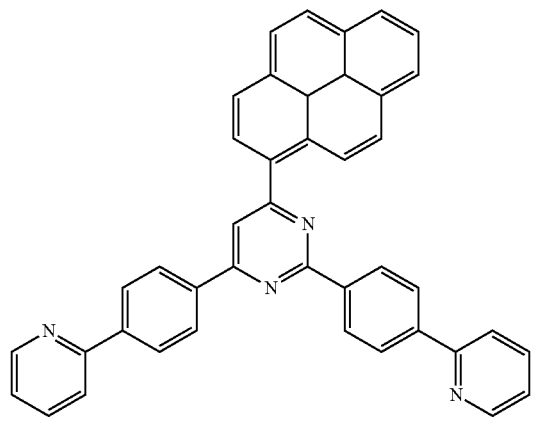
(10)
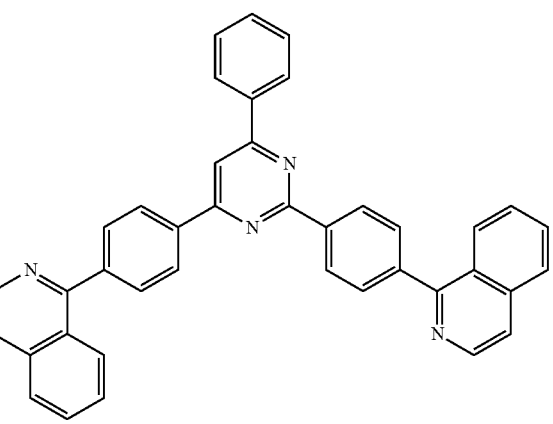

(11)
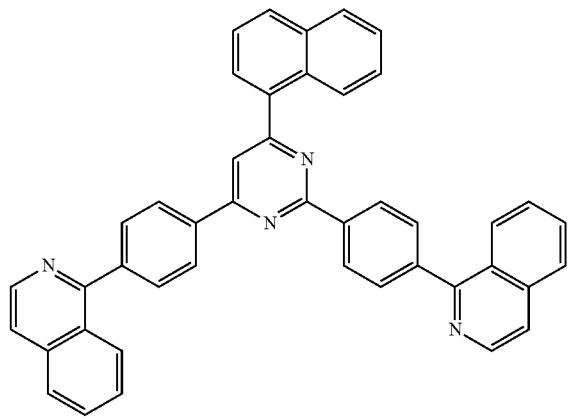
(12)
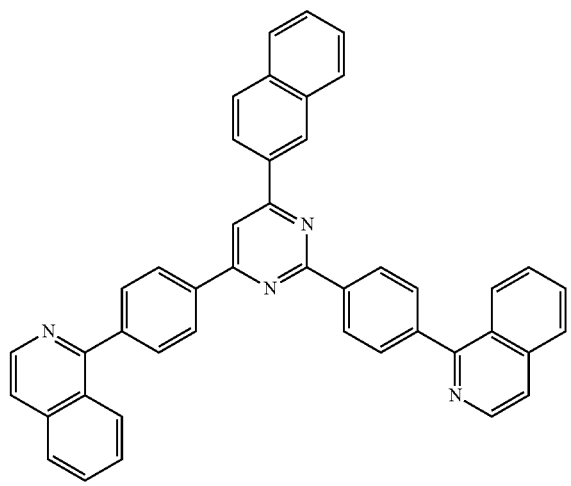
(13)
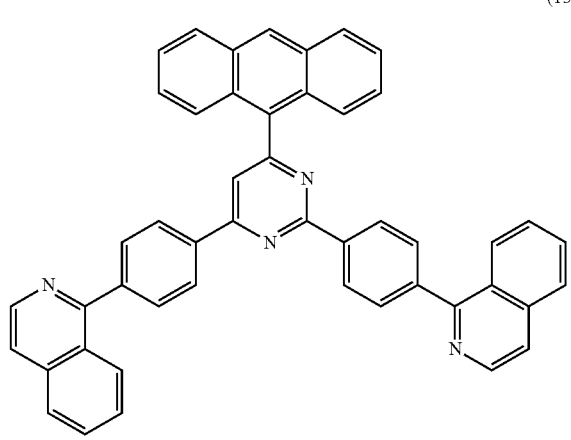
(14)
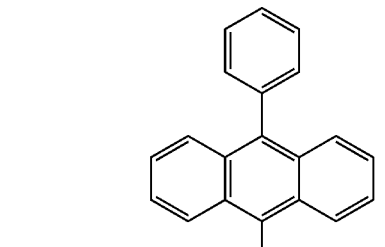
(15)
The compound represented by Chemical Formula 1 may include at least one of the following compounds (16) to (30):

(16)
(17)
(18)
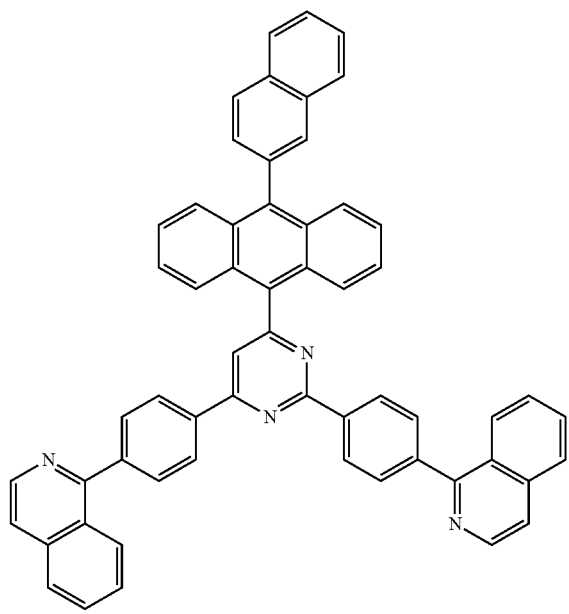
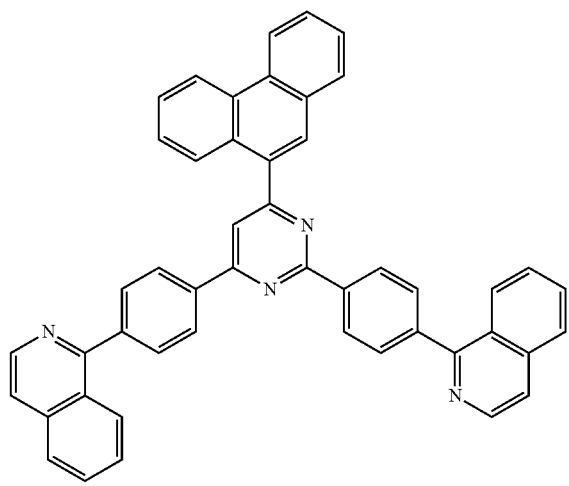
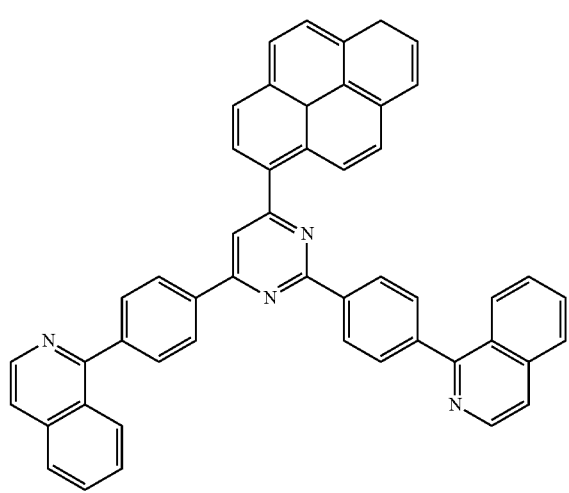
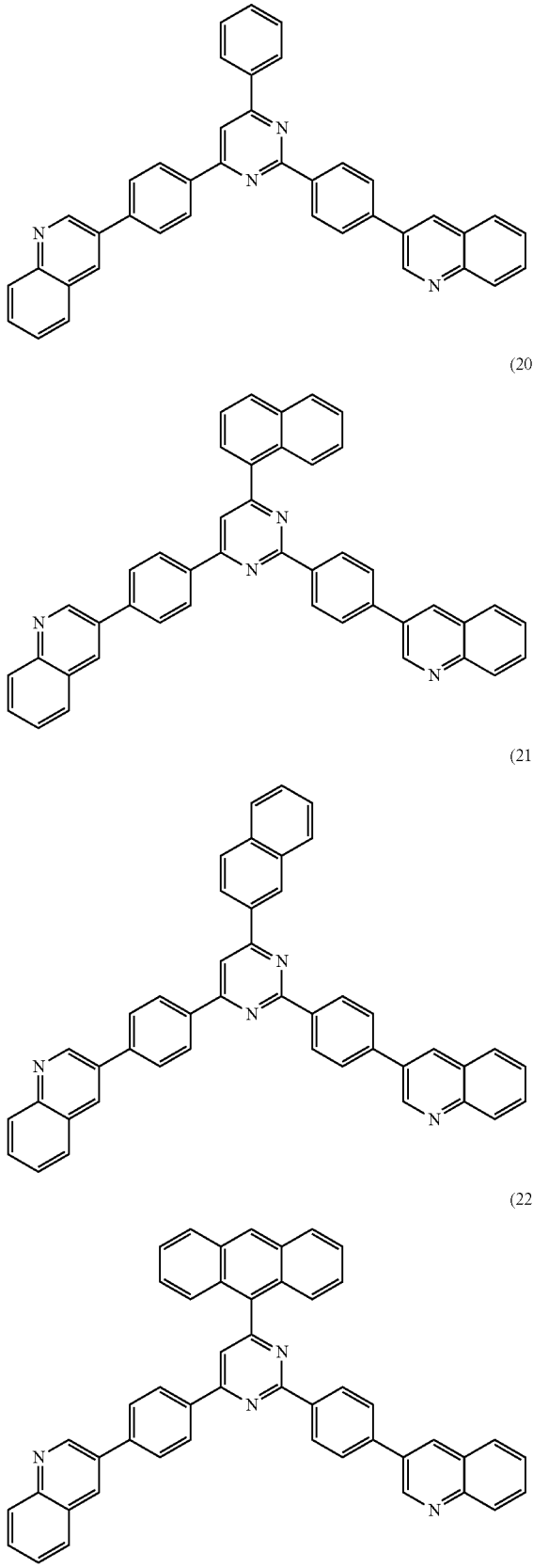
(19)
(20)
(21)
(22)

-continued
(23)
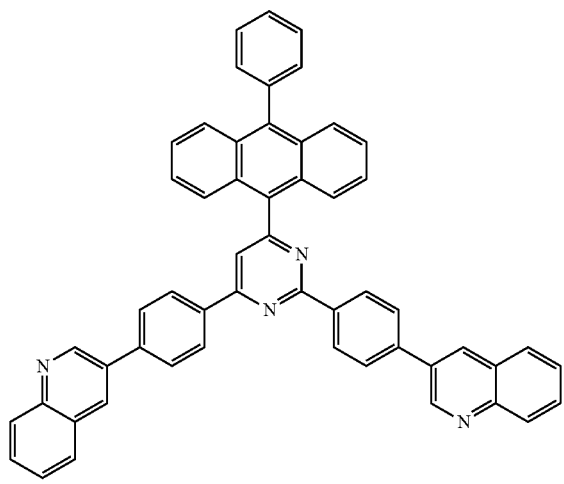
(24)
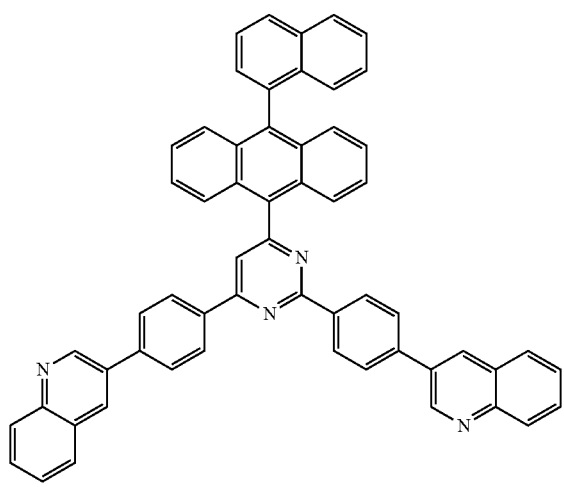
(25)
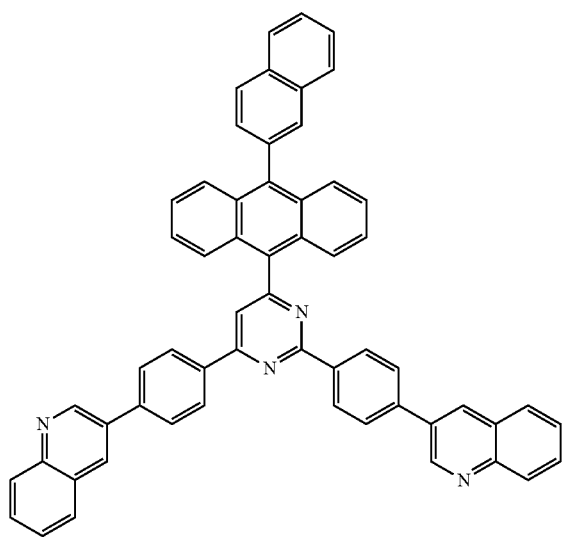
-continued
(26)
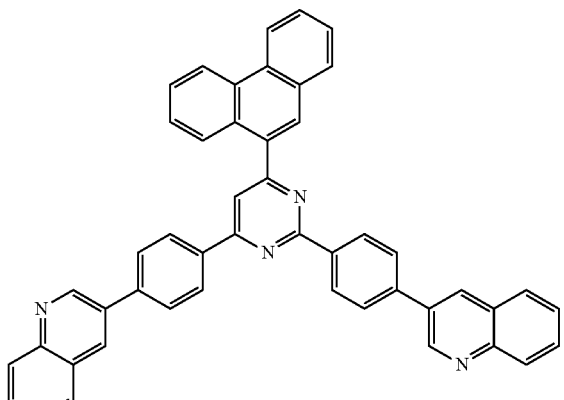
(27)
(28)
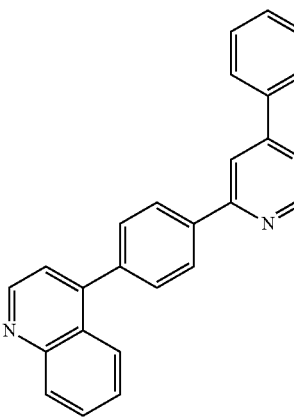

(29)
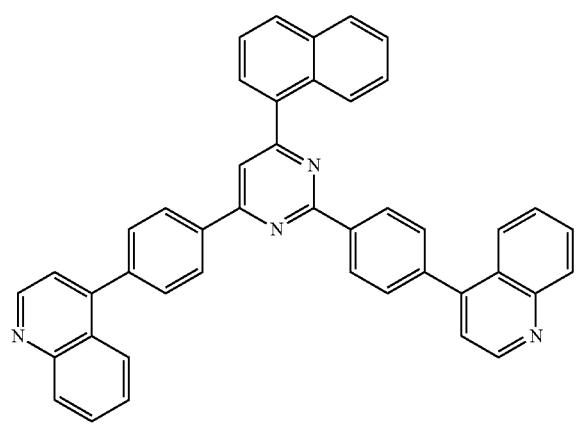
(30)
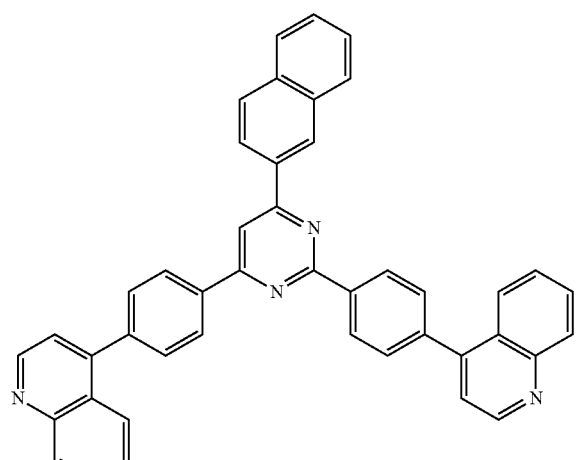
The compound represented by Chemical Formula 1 may include at least one of the following compounds (31) to (45):
(31)
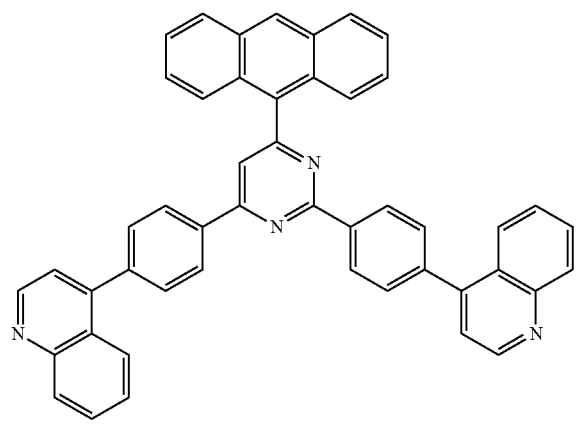
(32)
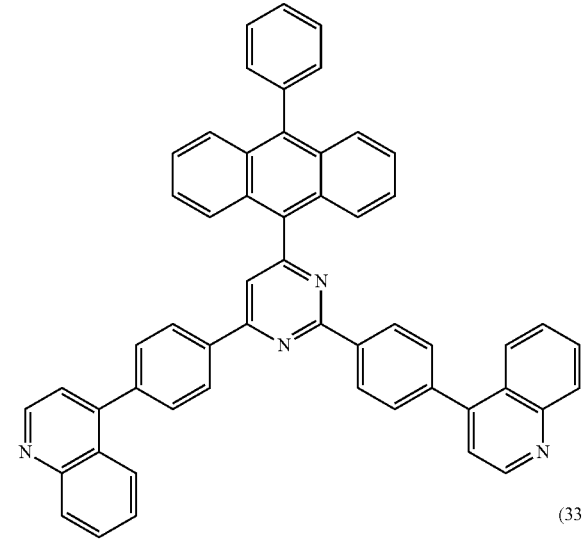
(33)
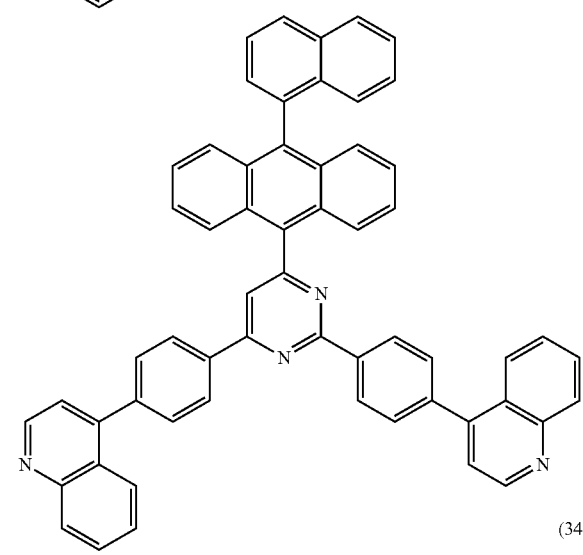
(34)
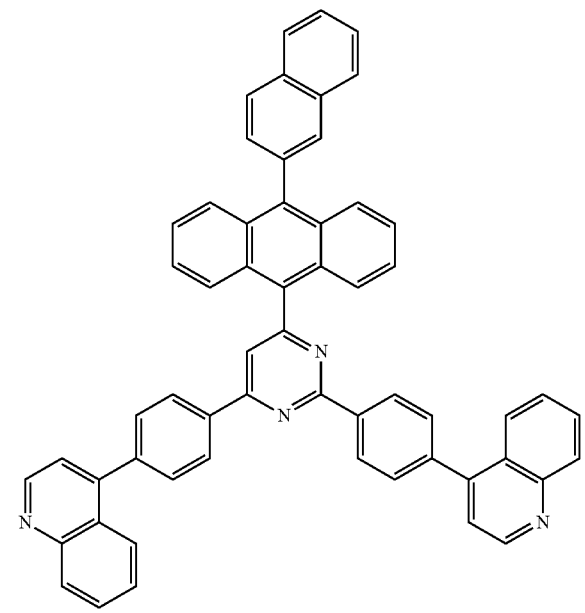

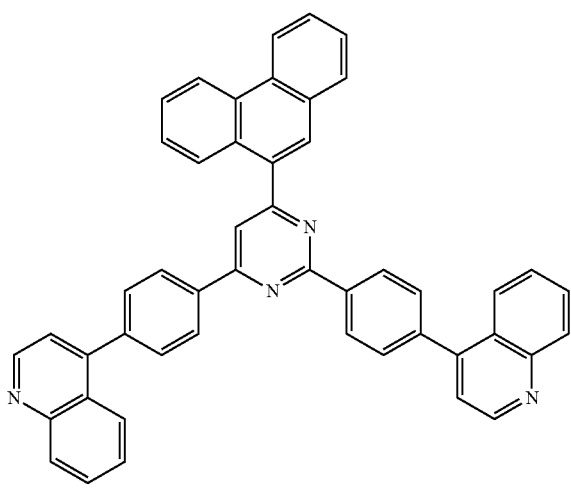
(35)
(36)
(37)
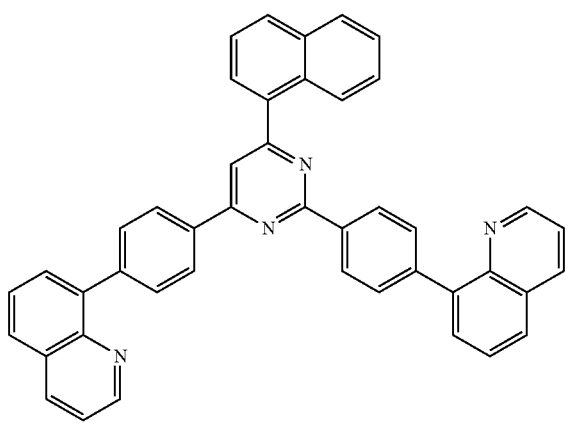
(38)
(39)
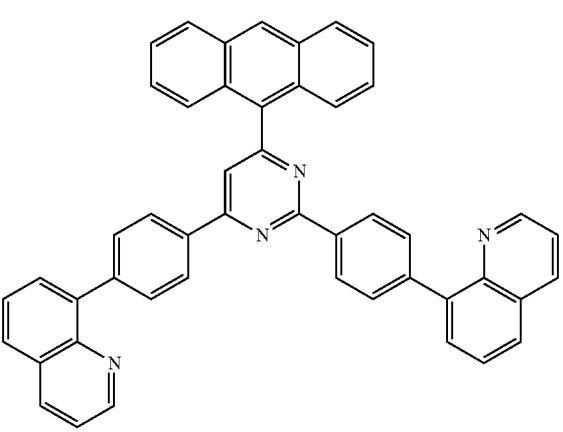
(40)

(41)
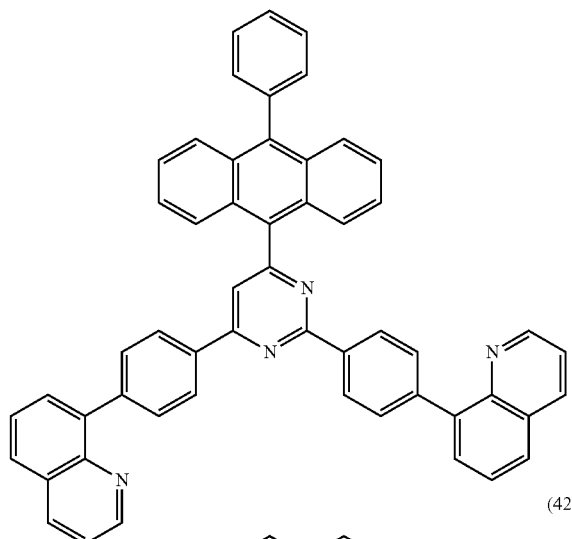
(42)
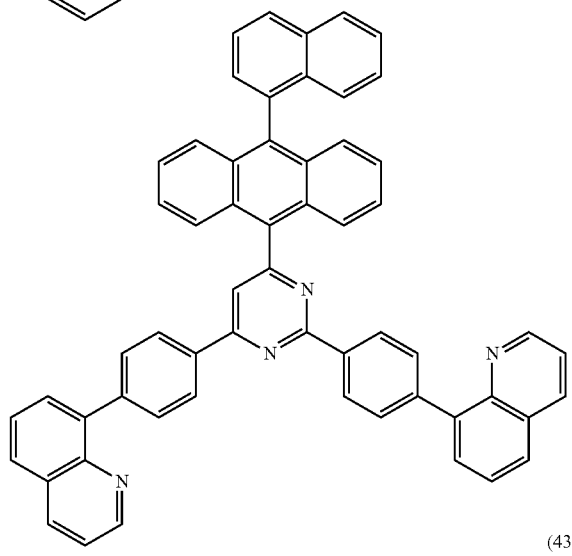
(43)
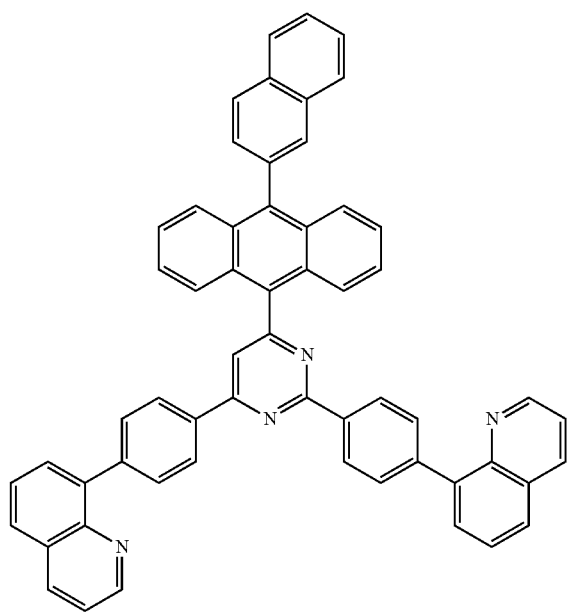
(44)
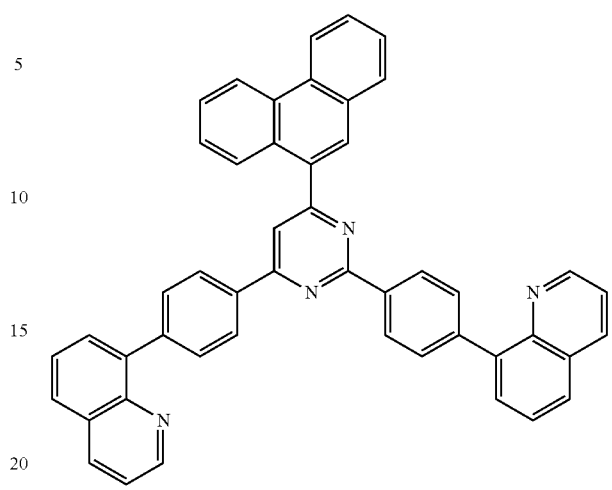
(45)
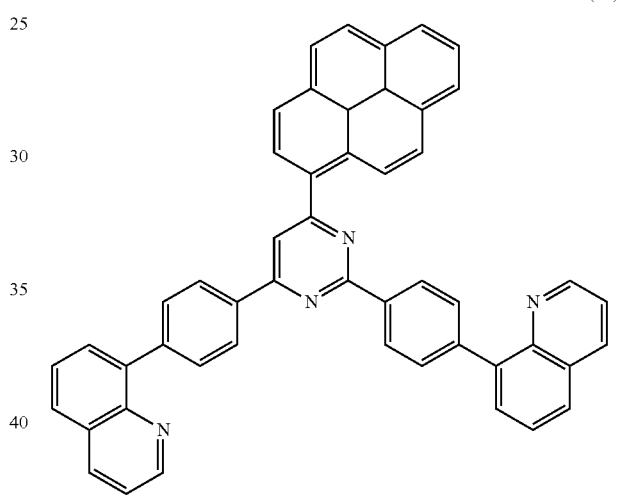
The compound represented by Chemical Formula 1 may include at least one of the following compounds (46) to (60):
(46)
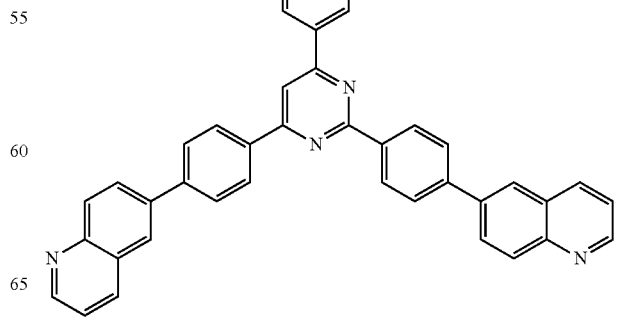

(47)
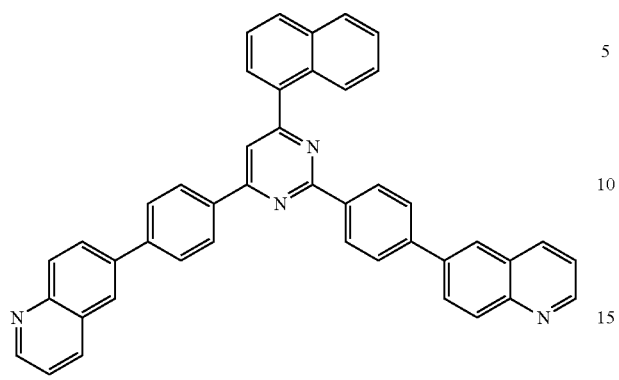
(48)
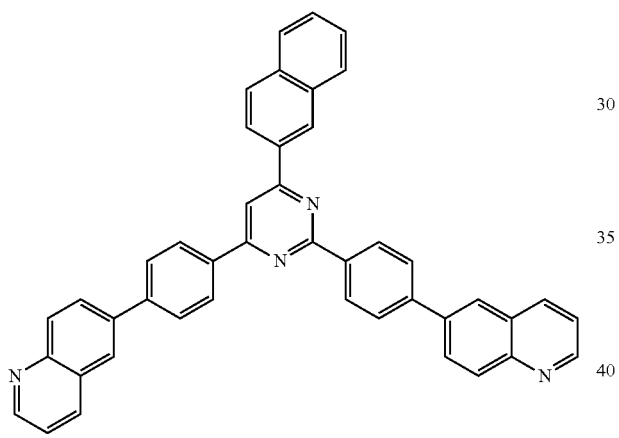
(49)
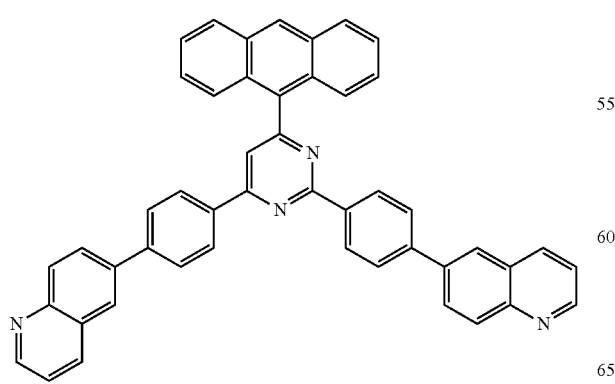
(50)
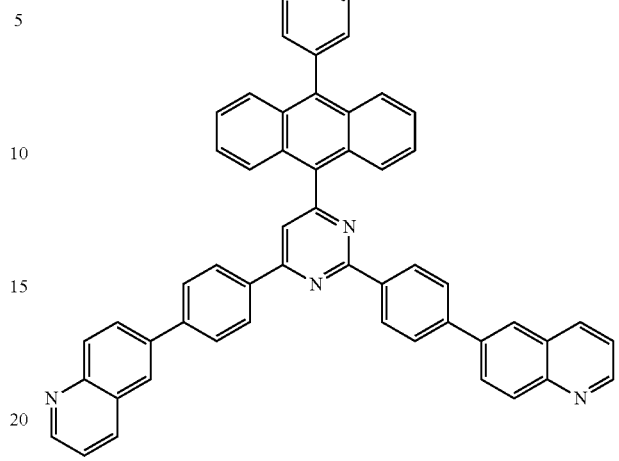
(51)
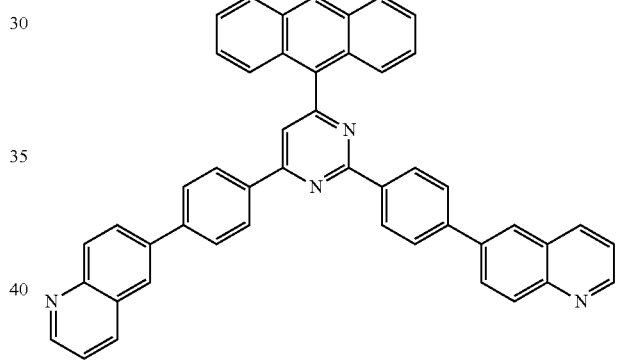
(52)
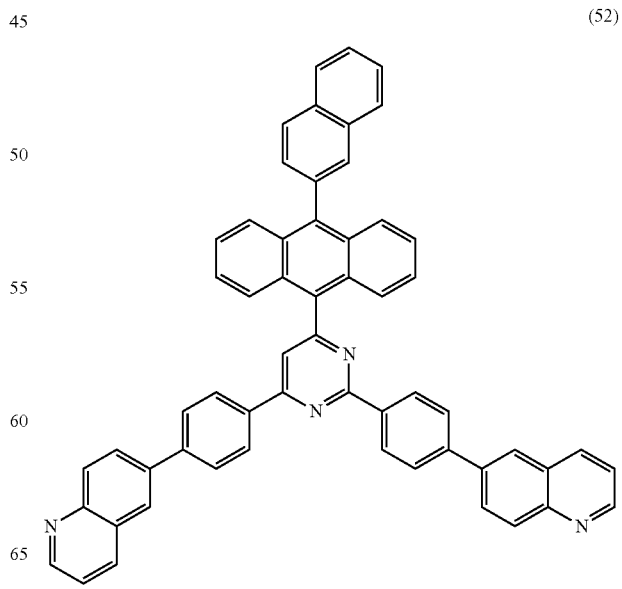

(53)
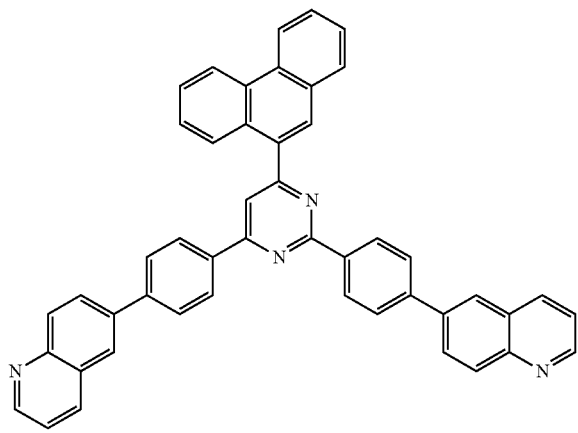
(54)
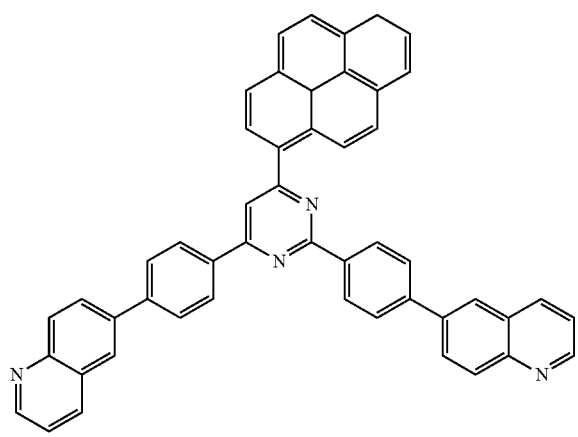
(55)
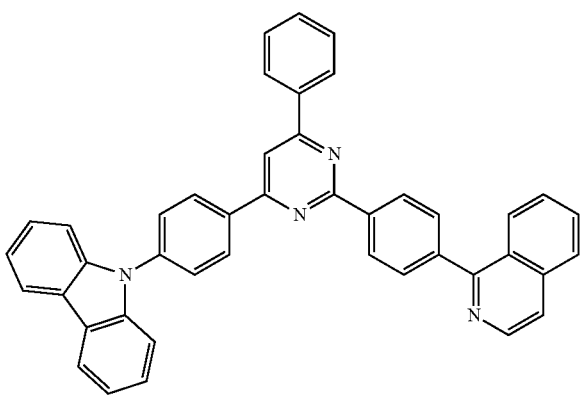
(56)
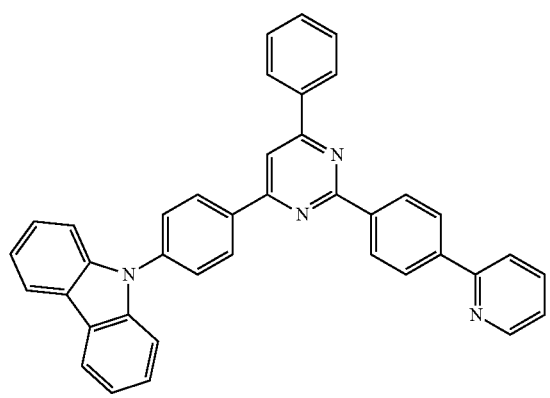
(57)
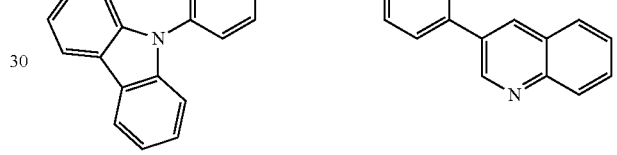
(58)
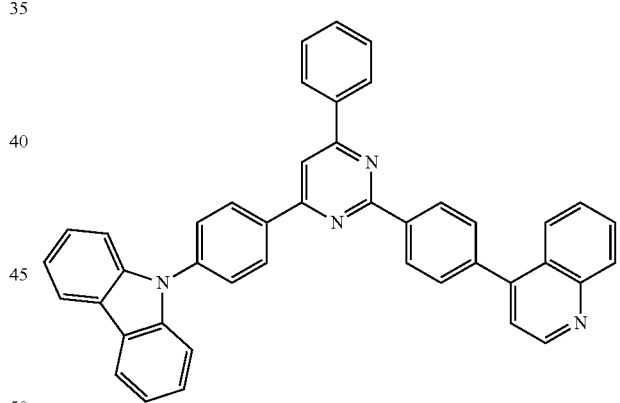
(59)
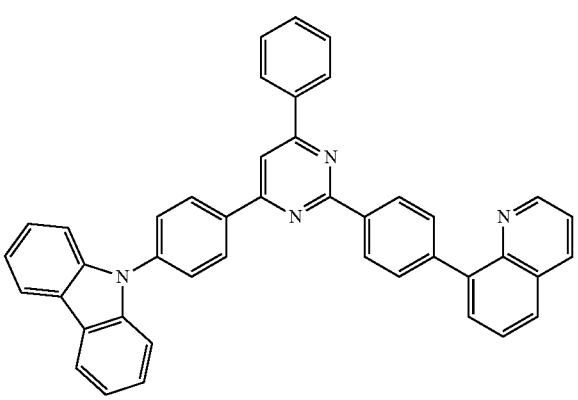

(60)
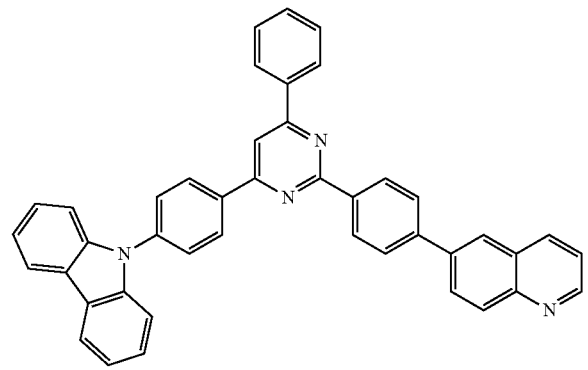
(63)
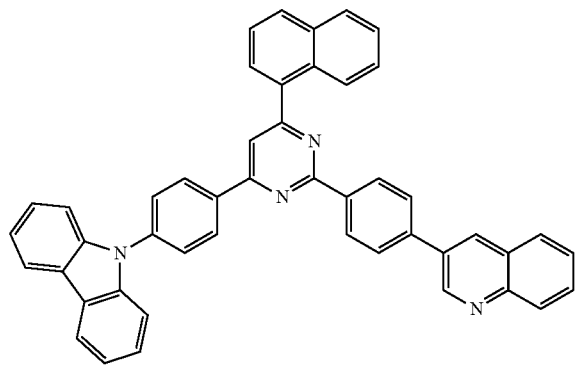
The compound represented by Chemical Formula 1 may include at least one of the following compounds (61) to (75):
(64)
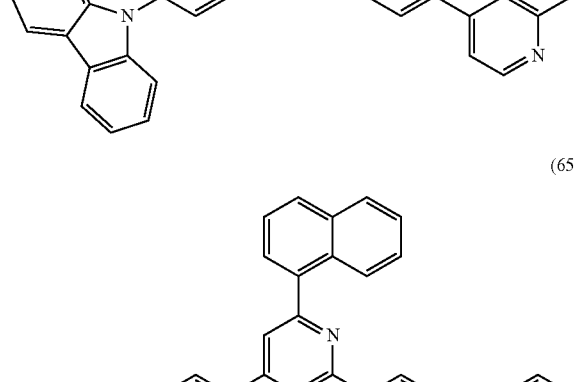
(61)
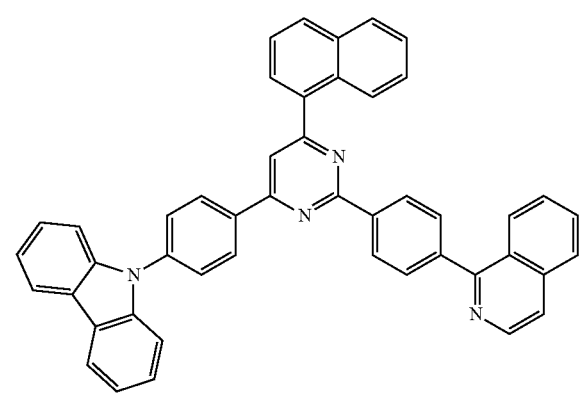
(65)
(62)
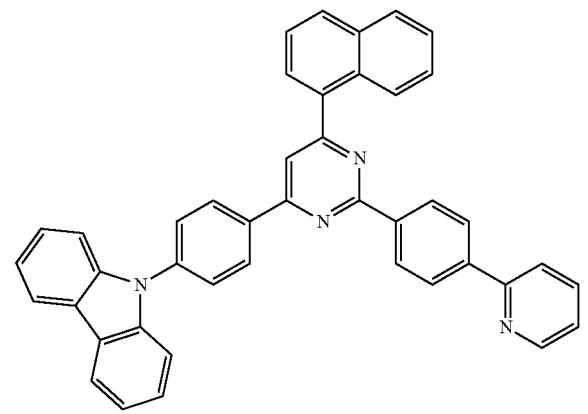
(66)
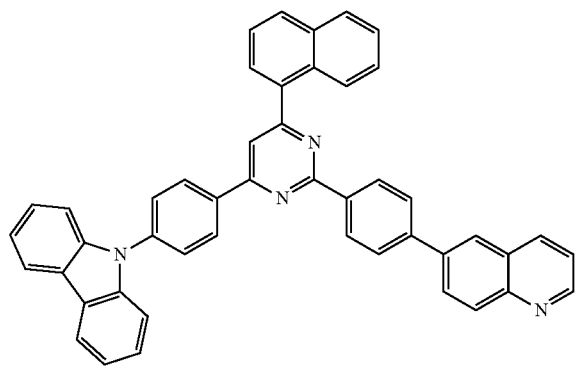

(67)
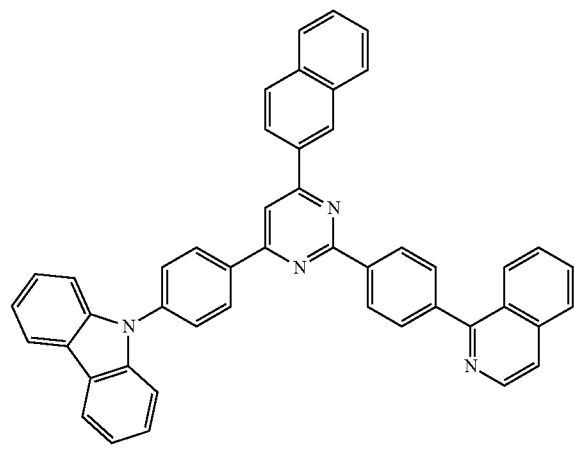
(68)
(69)
(70)
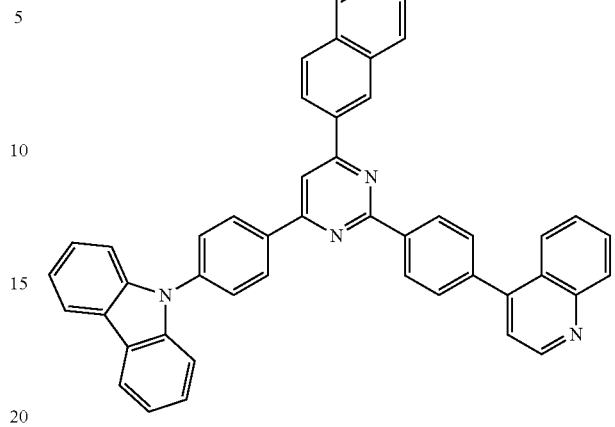
(71)
(72)
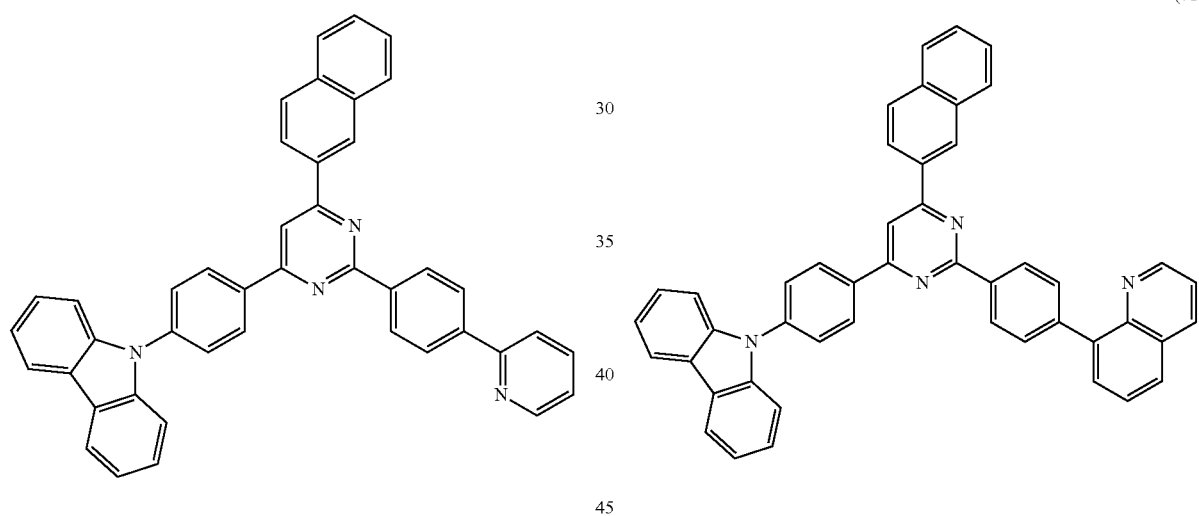
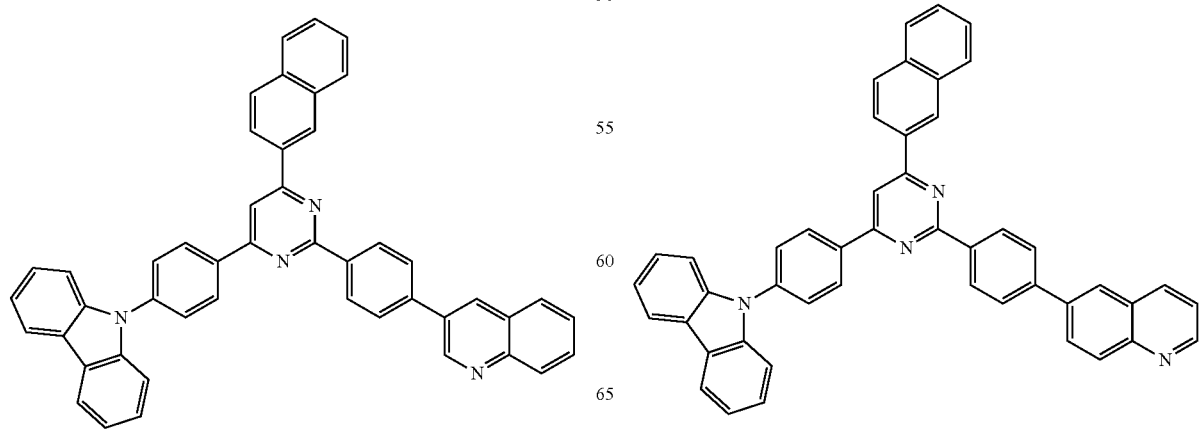

(73)
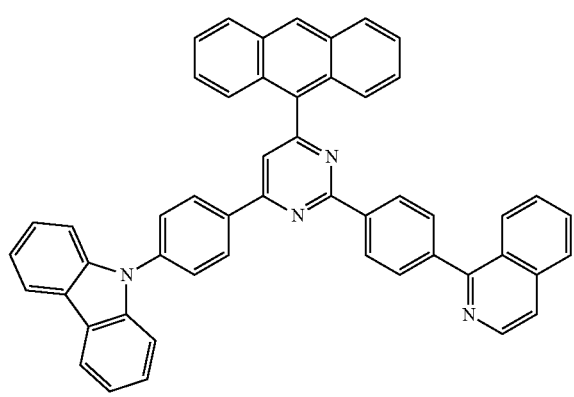
(74)
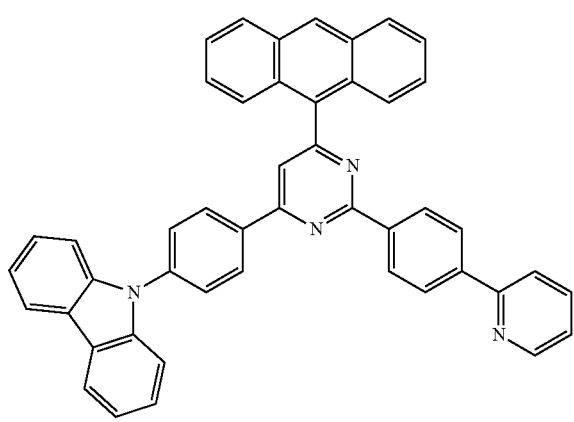
(75)
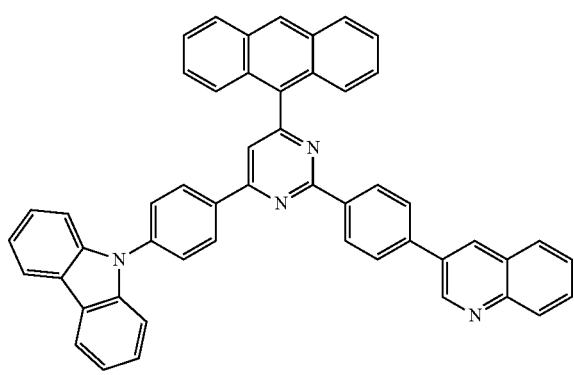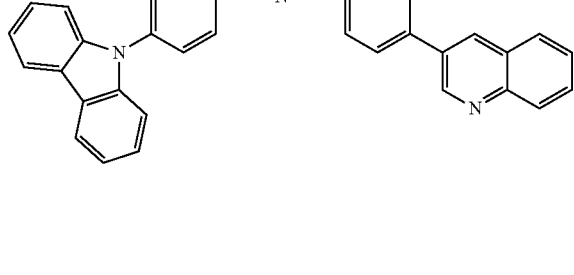
(76)
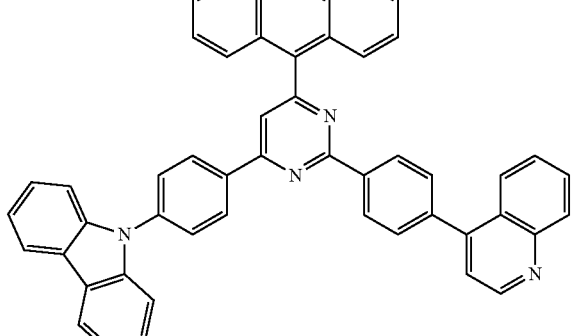
(77)
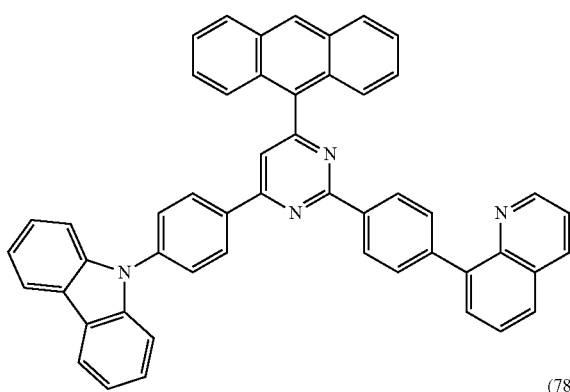
(78)
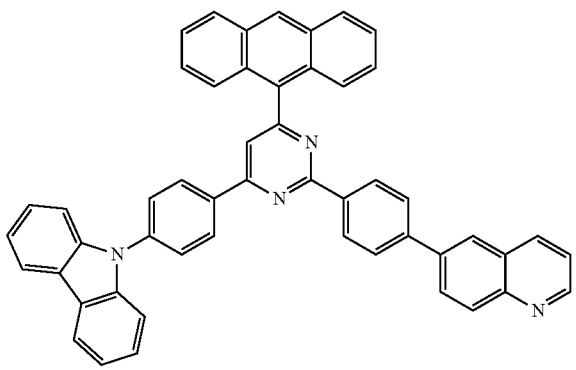
(79)
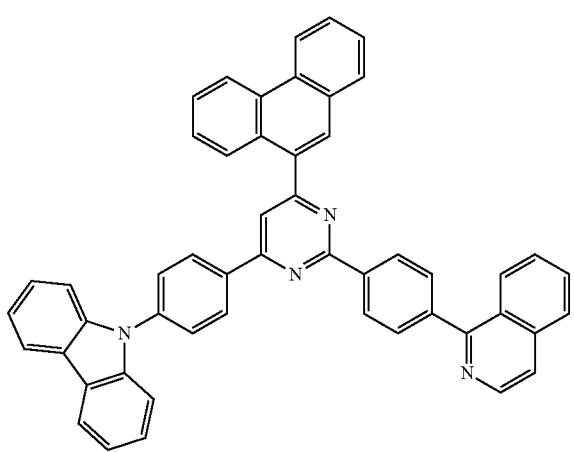
The compound represented by Chemical Formula 1 may include at least one of the following compounds (76) to (90):

(80)
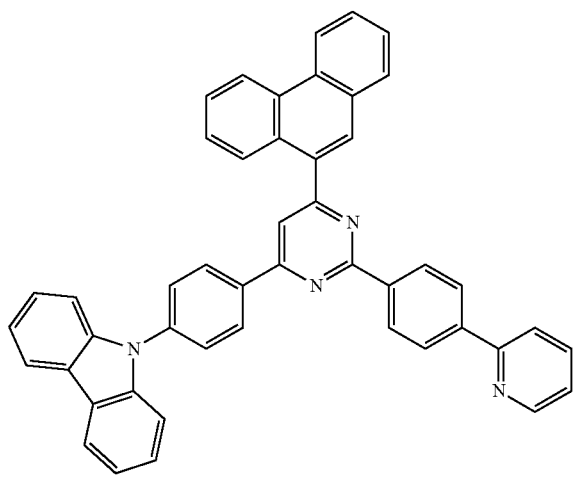
(83)
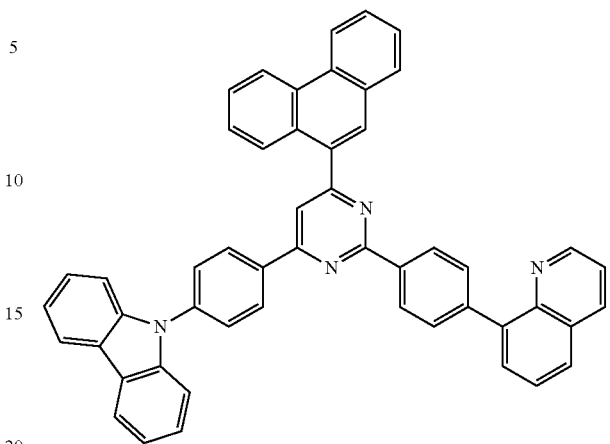
(81)
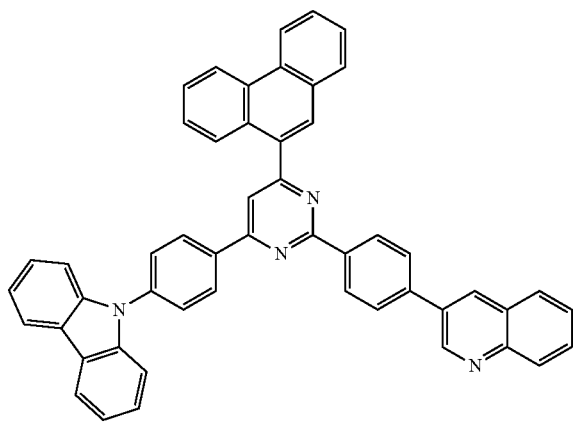
(84)
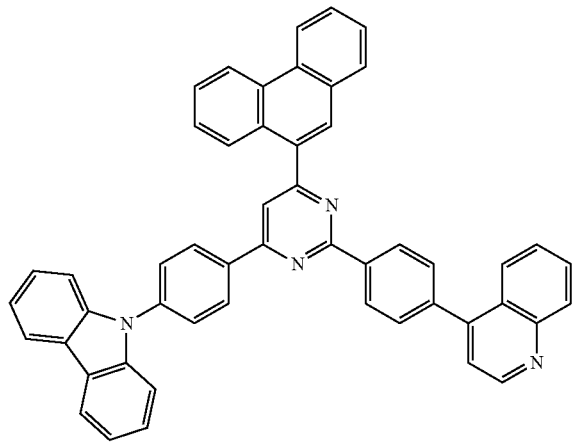
(82)
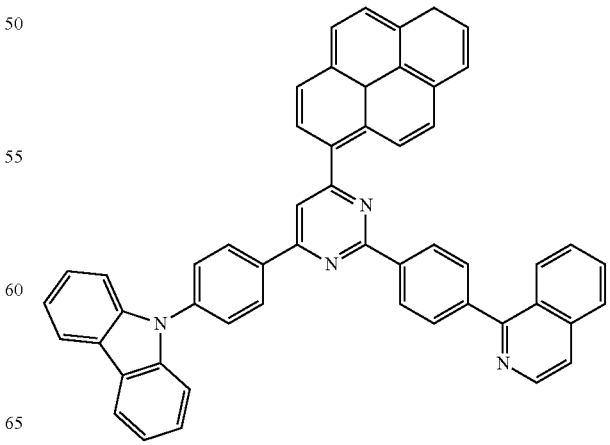
(85)

(86)
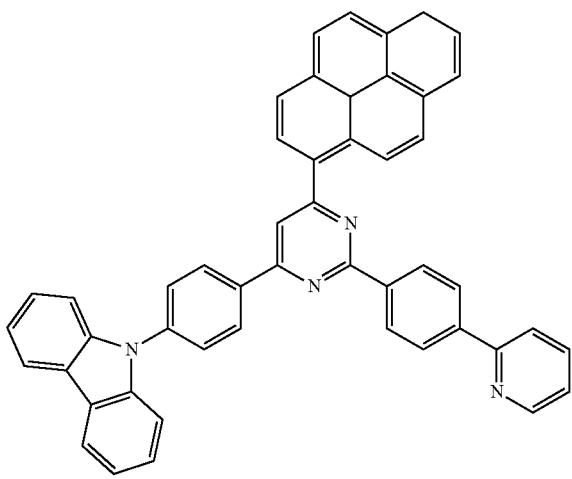

(87)
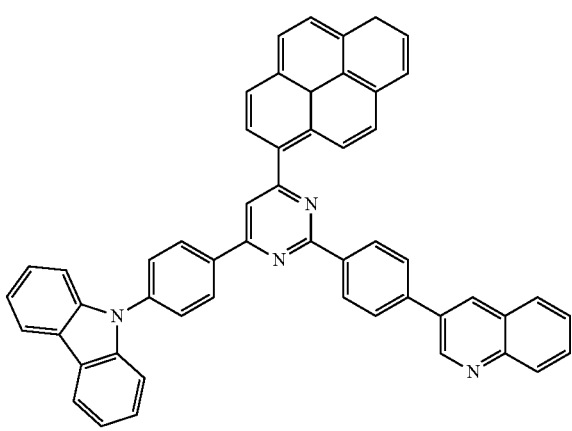

(88)
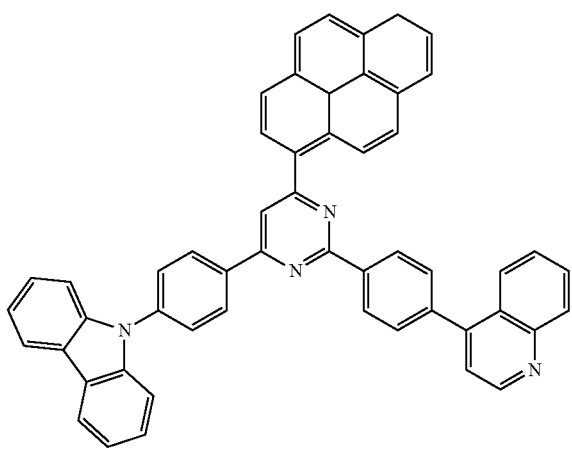

(89)
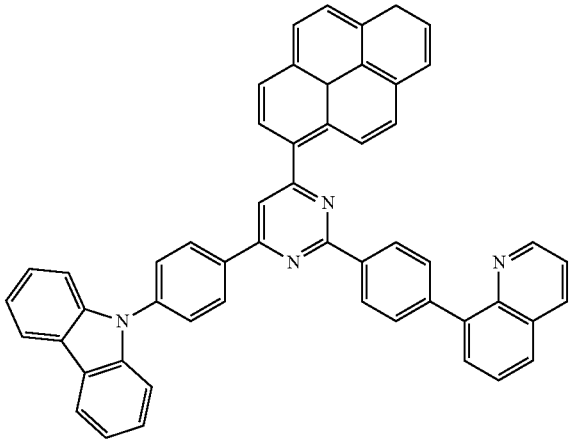

(90)
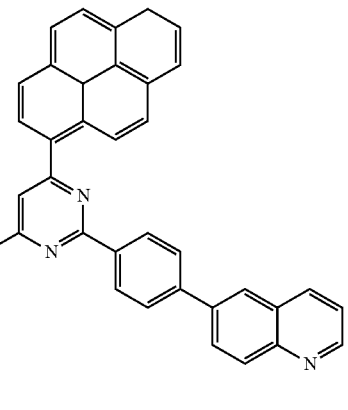

The embodiments may also be realized by providing an organic photoelectric device including an anode, a cathode, and at least one organic thin layer between the anode and cathode, wherein the at least one organic thin layer includes the material for an organic photoelectric device of an embodiment.

The at least one organic thin layer may include an emission layer and at least one of a hole transport layer (HTL), a hole injection layer (HIL), an electron injection layer (EIL), and a hole blocking layer.

The at least one organic thin layer may include an electron transport layer (ETL) or an electron injection layer (EIL), and the material for an organic photoelectric device may be included in the electron transport layer (ETL) or the electron injection layer (EIL).

The at least one organic thin layer may include an emission layer, and the material for an organic photoelectric device may be included in the emission layer.

The at least one organic thin layer may include an emission layer, and the material for an organic photoelectric device may be a phosphorescent or fluorescent host in the emission layer.

The at least one organic thin layer may include an emission layer, and the material for an organic photoelectric device may be a fluorescent blue dopant in the emission layer.

The organic photoelectric device may be one of an organic light emitting diode, an organic solar cell, an organic transistor, an organic photo-conductor drum, or an organic memory device.

The embodiments may also be realized by providing a display device including the organic photoelectric device of an embodiment.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1:
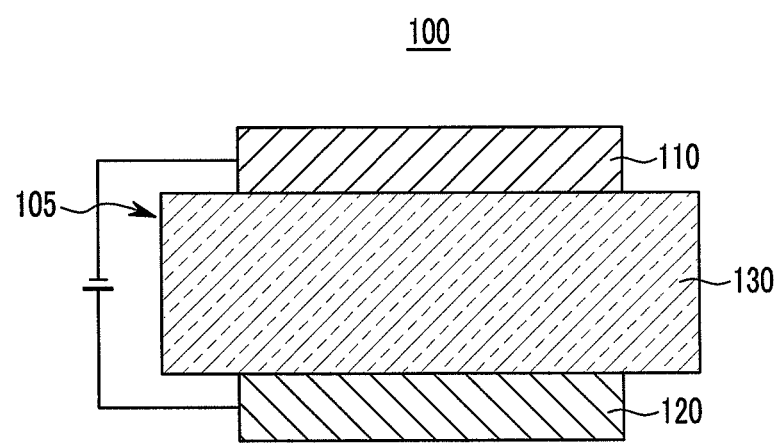
FIGS. 1 to 5 illustrate cross-sectional views showing organic light emitting diodes including compounds according to various embodiments.

Korean Patent Application No. 10-2008-0082905, filed on Aug. 25, 2008, and Korean Patent Application No. 10-2009-0050580, filed on Jun. 8, 2009 in the Korean Intellectual Property Office, and entitled: "Material for Organic Photoelectric Device and Organic Photoelectric Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not provided, the term "substituted" may refer to substitution with a substituent including at least one of a C1 to C30 alkyl, a C1 to C10 heteroalkyl, a C3 to C30 cycloalkyl, a C6 to C30 aryl, a C1 to C30 alkoxy, a fluoro, and a cyano.

As used herein, when specific definition is not provided, the term "hetero" may refer to a ring including 1 to 3 heteroatoms, e.g., N, O, S, P, or Si, and remaining carbons in the ring.

An organic light emitting diode (OLED) has drawn attention due to an increase in demand for flat panel displays. In general, organic light emission refers to transformation of electrical energy to photo-energy.

The organic light emitting diode may transform electrical energy into light by applying current to an organic light emitting material. It may have a structure in which a functional organic material layer is interposed between an anode and a cathode. The organic material layer may include a multi-layer including different materials from each other, e.g., a hole injection layer (HIL), a hole transport layer (HTL), an emission layer, an electron transport layer (ETL), and/or an electron injection layer (EIL), in order to improve efficiency and stability of an organic light emitting diode.

In such an organic light emitting diode, when a voltage is applied between an anode and a cathode, holes from the anode and electrons from the cathode may be injected to an organic material layer. The generated excitons may generate light having certain wavelengths while shifting to a ground state.

The light emitting material may be classified as blue, green, and red light emitting materials according to emitted colors, and yellow and orange light emitting materials to emit colors approaching natural colors.

An embodiment provides a material for an organic photoelectric device. The material may include a pyrimidine core having substituents at 4- and 6-positions thereof, the substituents at the 4- and 6-positions being different from one another. For example, the material for an organic photoelectric device according to an embodiment may include an asymmetric compound represented by the following Chemical Formula 1.

Chemical Formula 1

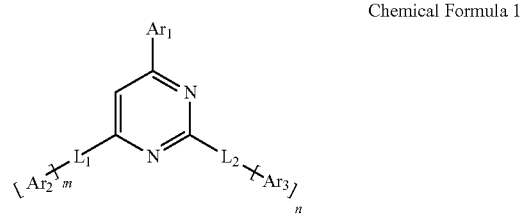

In the above Chemical Formula 1:

$Ar_1$ may include at least one of hydrogen and a substituted or unsubstituted aryl, provided that when $Ar_1$ is a substituted aryl, $Ar_2$ is not the same as the substituent of $Ar_1$, $Ar_2$ and $Ar_3$ may each independently include at least one of a substituted or unsubstituted carbazolyl, a substituted or unsubstituted C2 to C30 heteroaryl, a substituted or unsubstituted C2 to C30 arylamine, and a substituted or unsubstituted C2 to C30 heteroarylamine, $L_1$ and $L_2$ may each independently include at least one of a substituted or unsubstituted phenylene, a substituted or unsubstituted naphthylene, and a substituted or unsubstituted anthracene, and m and n may each independently be integers of 1 to 4.

In the above Chemical Formula 1, it is preferable that $Ar_1$ is an aryl or an aryl substituted aryl. Examples of the aryl may include a phenyl, a naphthyl, an anthracenyl, a phenanthrenyl, a pyrenyl, a perylenyl, a chrysenyl, and the like.

$Ar_1$ may be substituted with a substituent including at least one of a C1 to C30 alkyl, a C1 to C10 heteroalkyl, a C3 to C30 cycloalkyl, a C6 to C30 aryl, a C1 to C30 alkoxy, a fluoro, and a cyano. Examples of the aryl substituent may include a phenyl, a naphthyl, an anthracenyl, a phenanthrenyl, a pyrenyl, a perylenyl, and a chrysenyl. An example of the heteroalkyl substituent may include an alkylsilyl. However, the aryl and heteroalkyl substituents are not limited to the above described.

When $Ar_1$ is a substituted aryl, $Ar_2$ may not be the same as the substituent of $Ar_1$. When $Ar_1$ is a substituted aryl and the substituent of $Ar_1$ is not the same as $Ar_2$, an asymmetric structure with respect to the pyrimidine core may be obtained. The material for an organic photoelectric device having such an asymmetric structure may suppress crystallization, and thus may improve life-span characteristics of a resultant organic photoelectric device.

In the above Chemical Formula 1, the heteroaryl represented by $Ar_2$ and $Ar_3$ may include, e.g., an imidazolyl, a thiazolyl, an oxazolyl, an oxadiazolyl, a triazolyl, a pyridinyl, a pyridazine, a quinolinyl, an isoquinolinyl, an acridyl, an imidazopyridinyl, an imidazopyrimidinyl, and the like.

In the above Chemical Formula 1, the heteroarylamine represented by $Ar_2$ and $Ar_3$ may include, e.g., a diphenyl amine, a dinaphthyl amine, a dibiphenyl amine, a phenyl naphthyl amine, a phenyl diphenyl amine, a ditolyl amine, a phenyl tolyl amine, a carbazoyl, a triphenylamine, a dipyridyl amine, and the like.

Each of $Ar_2$ and $Ar_3$ in the above Chemical Formula 1 may be substituted or unsubstituted. When $Ar_2$ and $Ar_3$ are substituted, they may be substituted with at least one of a C1 to C30 alkyl, a C1 to C10 heteroalkyl, a C3 to C30 cycloalkyl, a C6 to C30 aryl, a C1 to C30 alkoxy, a fluoro, and a cyano. Examples of the aryl substituent may include a phenyl, a naphthyl, an anthracenyl, a phenanthrenyl, a pyrenyl, a perylenyl, and a chrysenyl. An example of the heteroalkyl substituent may include an alkylsilyl. However, the aryl and heteroalkyl substituents are not limited to the above described substituents.

In the above Chemical Formula 1, $L_1$ and $L_2$ are preferably a phenylene.

Thus, the compound of the above Chemical Formula 1 according to the present embodiment may include a pyrimidine core and substituents of $Ar_1$ to $Ar_3$. Pyrimidine is an aromatic compound and has an electron structure similar to benzene. The pyrimidine may exhibit thermal stability and/or relatively high resistance to oxidation. The pyrimidine may be used to synthesize an asymmetric compound due to a reactivity difference with respect to 2-, 4-, and 6-positions thereof.

In an implementation, the pyrimidine core may be substituted with substituents that are different from each other and thus may form an asymmetric structure. Amorphous characteristics may be enhanced in the pyrimidine core structure having asymmetric substituents; and crystallization may be suppressed to improve the life-span characteristic while driving a resultant organic photoelectric device. Thus, crystallization of the asymmetric compound having the different substituents may be avoided, thereby avoiding drawbacks associated with shortening of the life-span characteristic of an organic light emitting diode.

The various substituents ($Ar_1$ to $Ar_3$) may be introduced to the pyrimidine core having the above-mentioned characteristics to provide the resultant organic photoelectric device with the desired characteristics.

For example, it is possible to synthesize a thermally electrically stable n-type material by introducing a substituent having a n-type property, e.g., a pyridinyl group, a quinolinyl group, and/or an isoquinolinyl group, to $Ar_2$ and $Ar_3$, and it is possible to synthesize a p-type material by introducing substituents having the p-type property, e.g., a arylamine group, to $Ar_2$ and $Ar_3$. It is also possible to provide an amphiphilic material having both n-type and p-type properties by introducing both an n-type substituent and a p-type substituent.

The n-type property means a property of a conductive characteristic depending upon the LUMO level, so as to have an anionic characteristic due to the electron formation. The p-type property means a property of a conductive characteristic depending upon the HOMO level, so as to have a cationic characteristic due to the hole formation.

The compound represented by Chemical Formula 1 may be introduced or substituted with the various substituents, so a total molecular property thereof may be further enriched into an n-type or a p-type. For example, when a certain substituent is introduced to a substitution point (e.g., the 2, 4, or 6 position) in Chemical Formula 1 to enrich properties of the compound of Chemical Formula 1 to either one (e.g., n-type or p-type), the compound represented by Chemical Formula 1 may further satisfy desirable conditions for hole injection, hole transport, light emitting, electron injection, or electron transport.

For example, when $Ar_2$ and $Ar_3$ are substituted with a heteroarylamine group, the compound represented by Chemical Formula 1 may have wider application fields, such as a material for a hole injection layer (HIL) and a hole transport layer (HTL).

Alternatively, when $Ar_2$ and $Ar_3$ are substituted with materials having an excellent electron affinity, e.g., a hetero aryl group, the compound represented by Chemical Formula 1 may be applied to a material for an electron injection layer (EIL) or an electron transport layer (ETL).

Furthermore, when $Ar_1$ is substituted with a substituent, (e.g., a phenyl group, a naphthyl group, an anthracenyl group, a phenanthrenyl group, a pyrenyl group, a perylenyl group, a chrysenyl group, and so on), it is possible to increase thermal stability and/or resistance to oxidation. When $Ar_2$ or $Ar_3$ are simultaneously substituted with substituents of a heteroarylamine group and a heteroaryl group, respectively, it is possible to provide an amphiphilic material and to use the material for an emission layer.

As described above, it is possible to synthesize a compound having the various energy band gaps by introducing the various substituents in the $Ar_1$ to $Ar_3$ positions in Chemical Formula 1.

Thus, the compound represented by Chemical Formula 1 may be desirable for use in a hole injection layer (HIL), a hole transport layer (HTL), an emission layer, an electron injection layer, and/or a transport layer.

It is possible to provide a device having a low driving voltage and high photo efficiency by selecting a compound having a suitable energy level depending upon the substituent of Compound 1 and applying it to an organic electronic device.

Examples of the compound represented by the above Chemical Formula 1 may include the following compounds (1) to (90) or combinations thereof, but are not limited thereto.

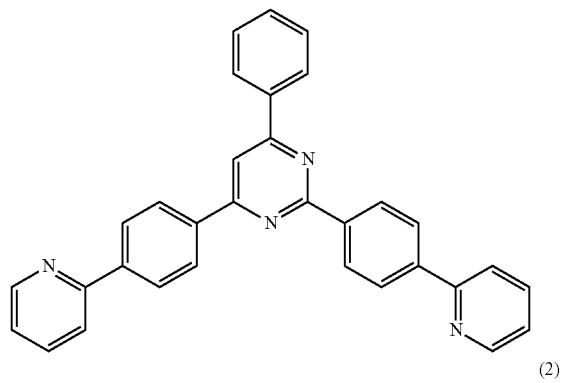

(1)

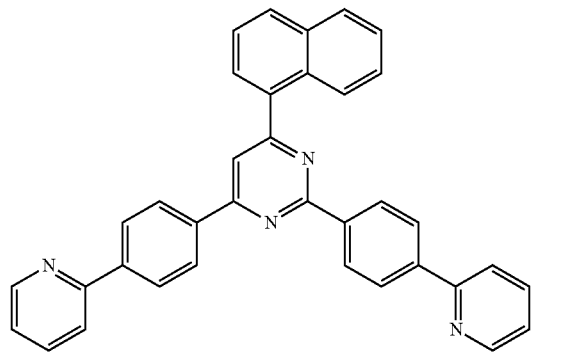

(2)

-continued
(3)
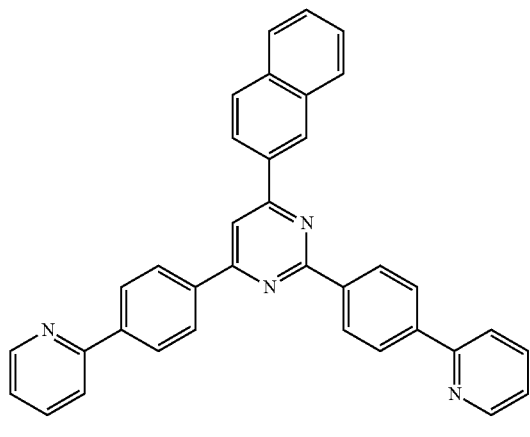
(4)
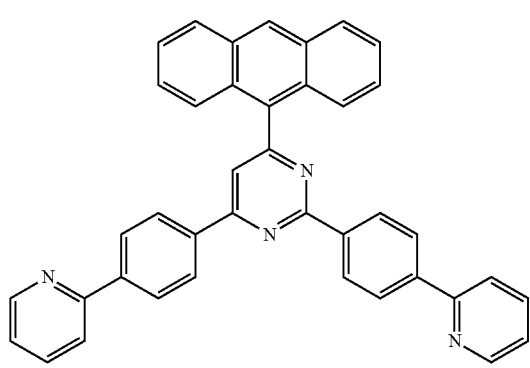
(5)
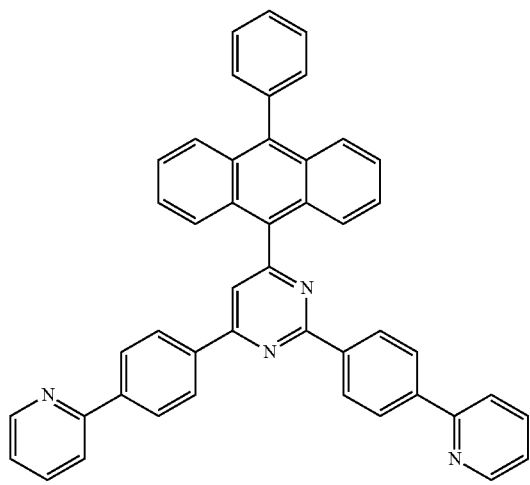
-continued
(6)
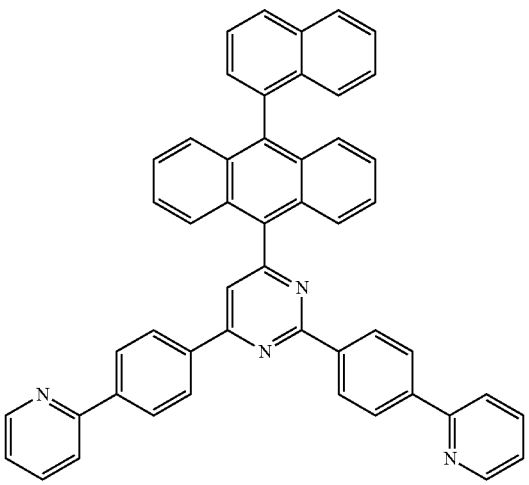
(7)
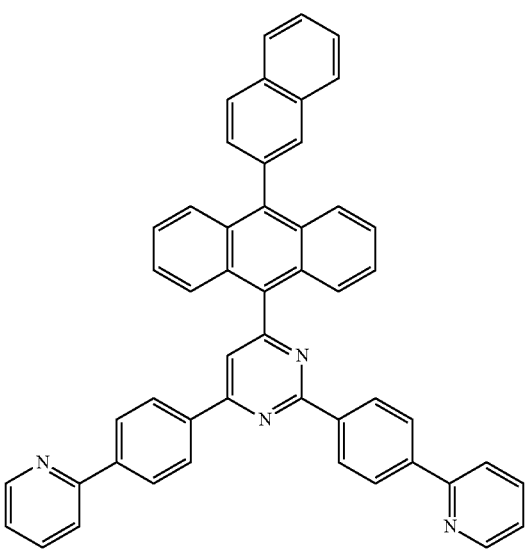
(8)
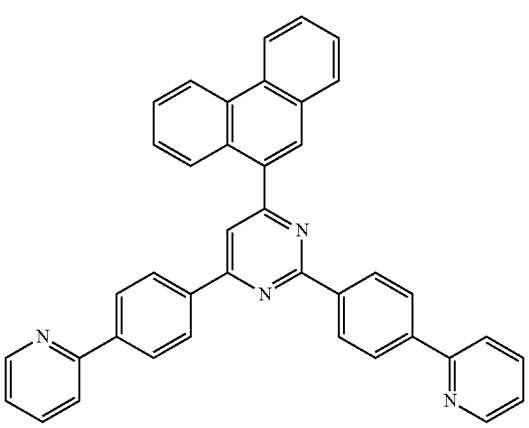

(9)
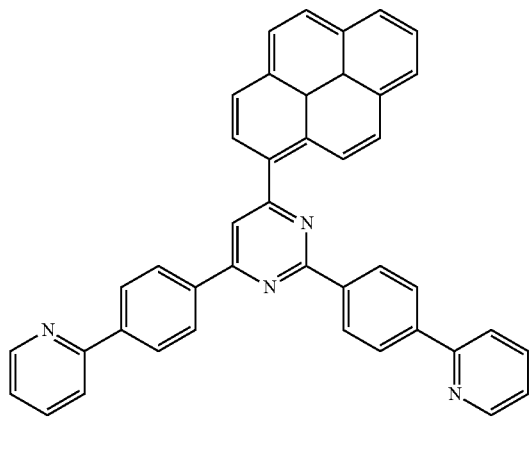
(12)
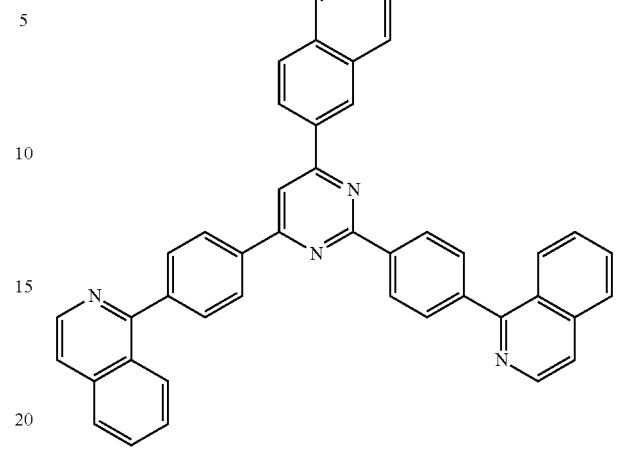
(10)
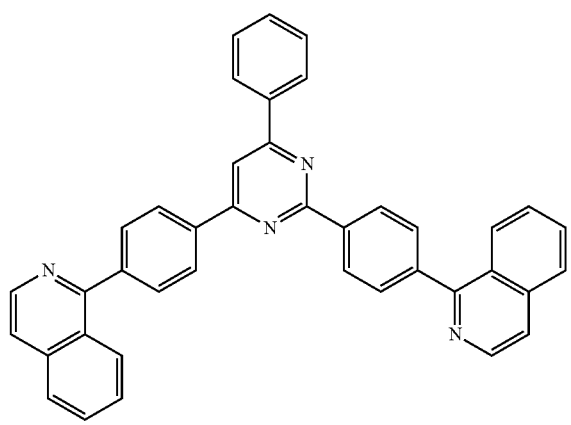
(13)
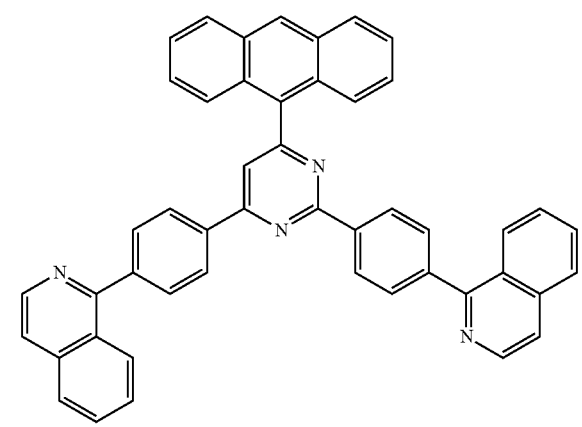
(11)
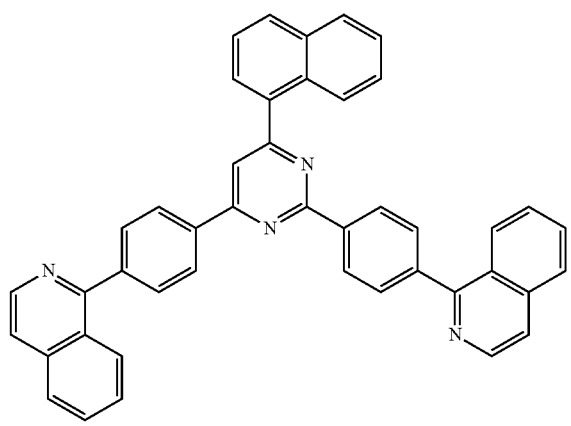
(14)
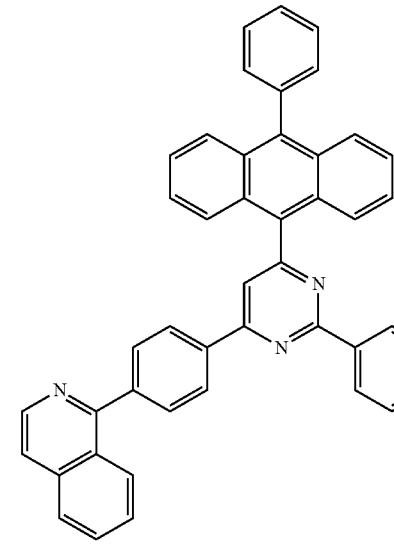

(15)
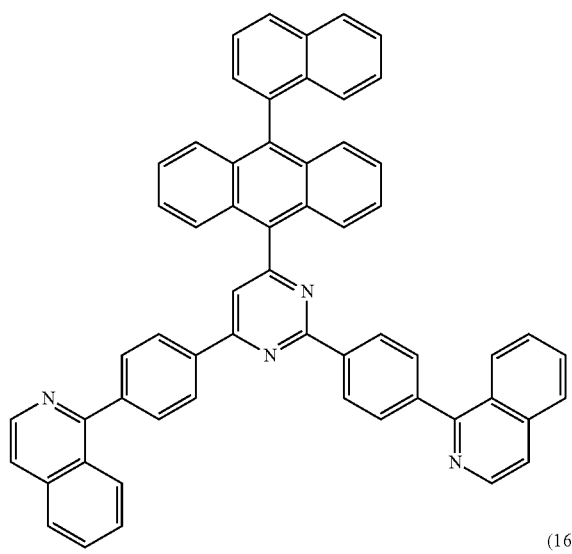
(18)
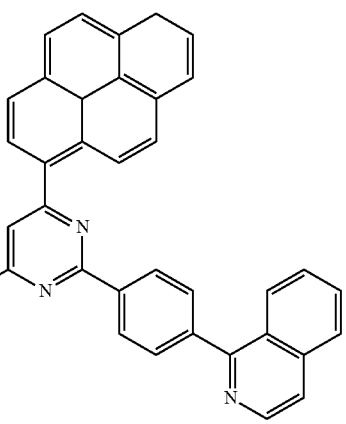
(16)
(19)
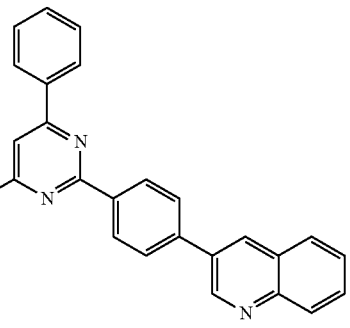
(17)
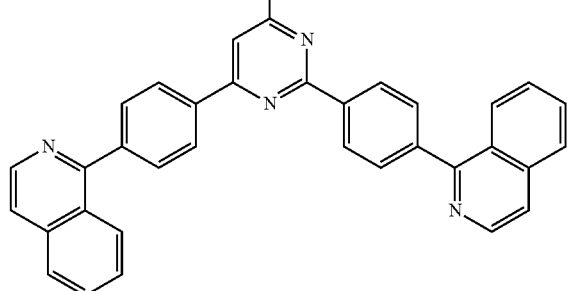
(20)
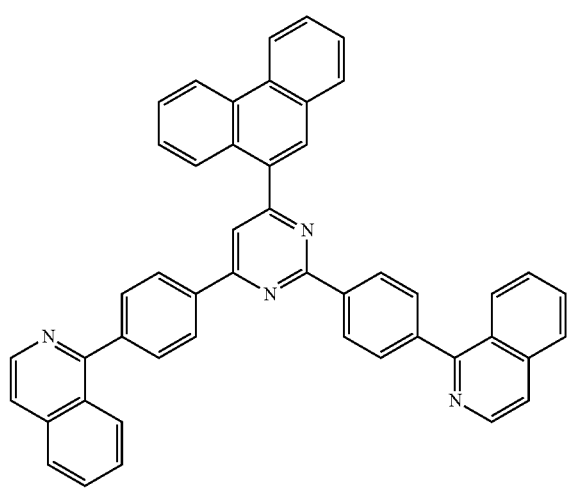
(21)
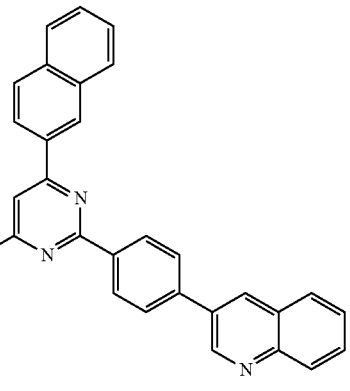

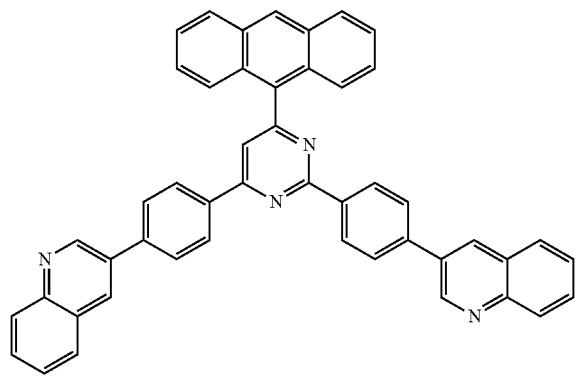
(22)
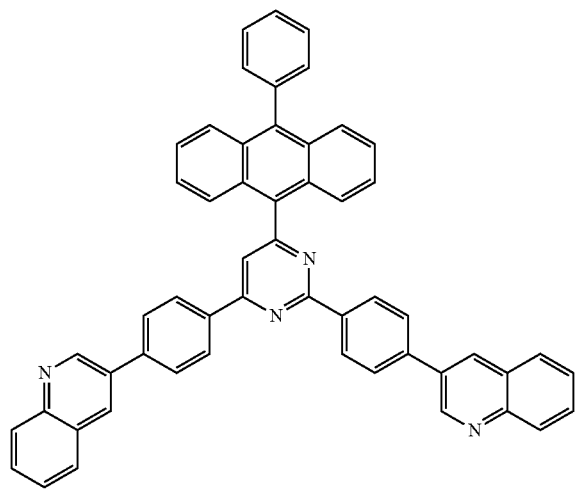
(23)
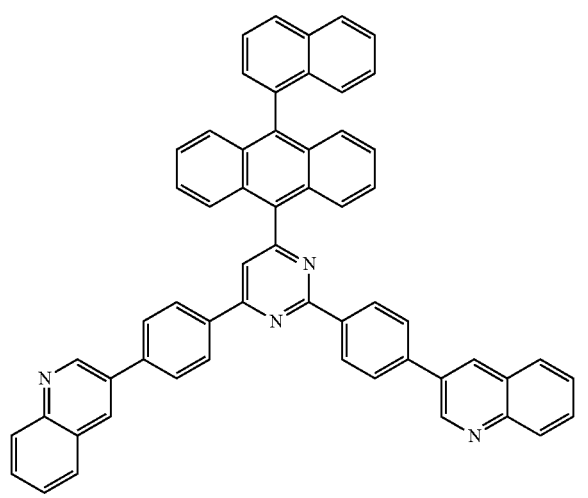
(24)
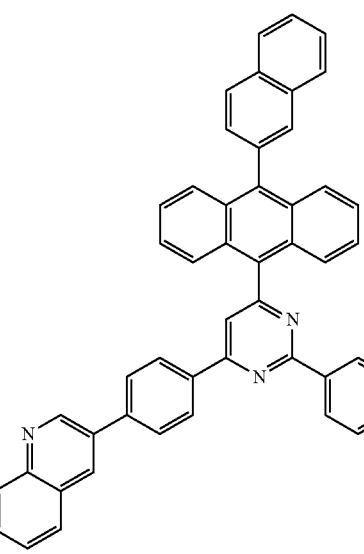
(25)
(26)
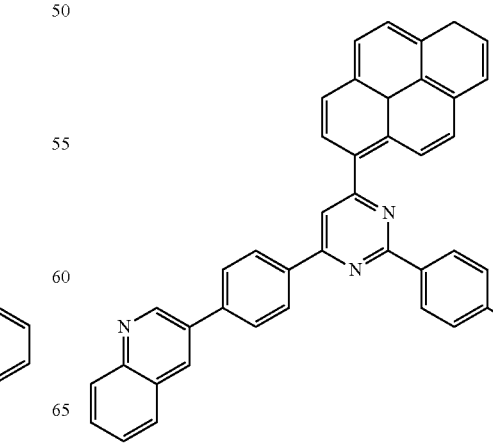
(27)

(28)
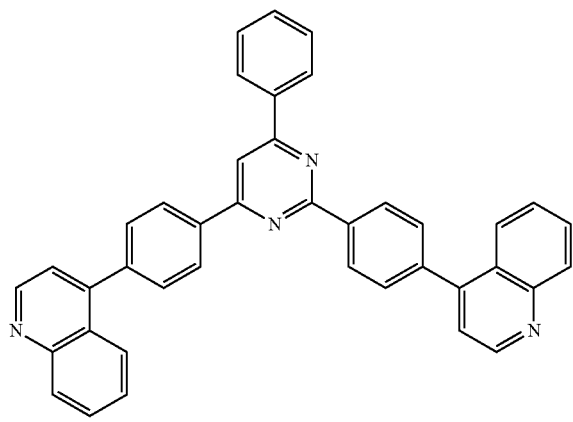
(29)
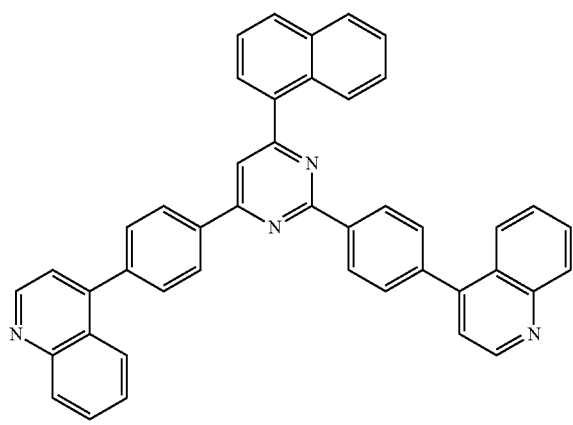
(30)
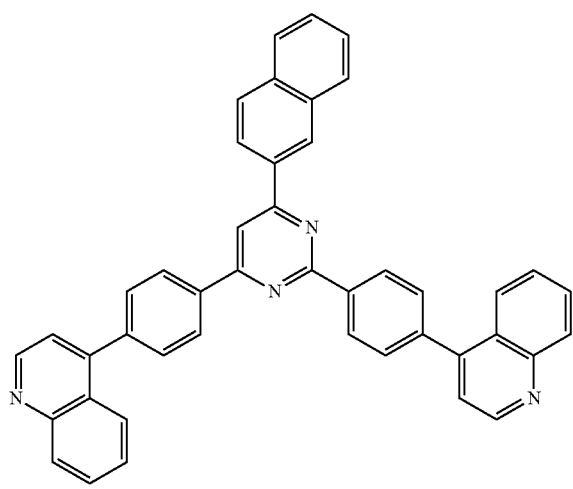
(31)
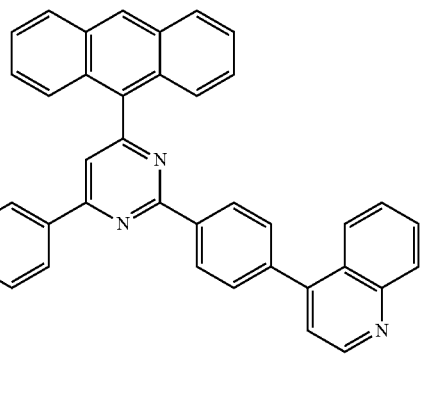
(32)
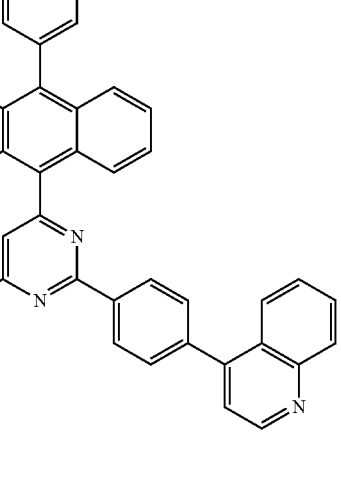
(33)
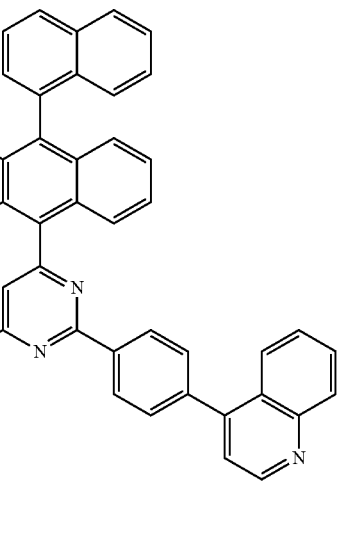

(34)
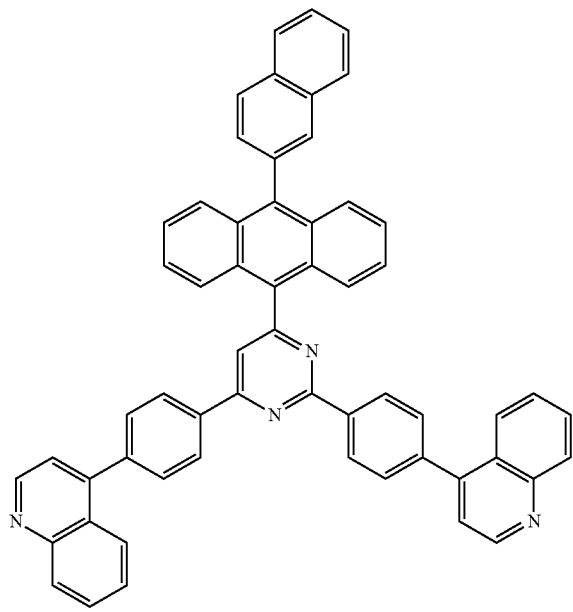
(35)
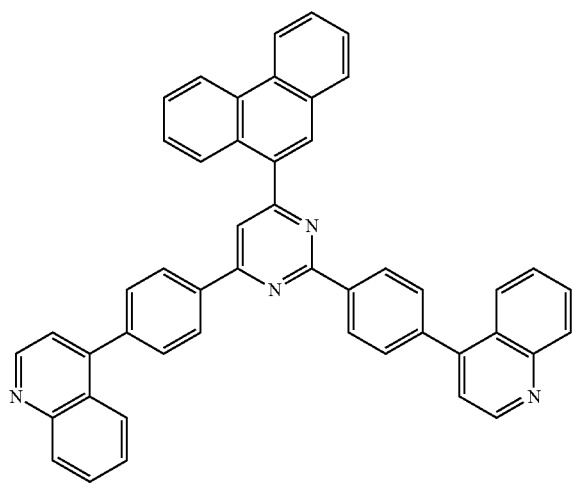
(36)
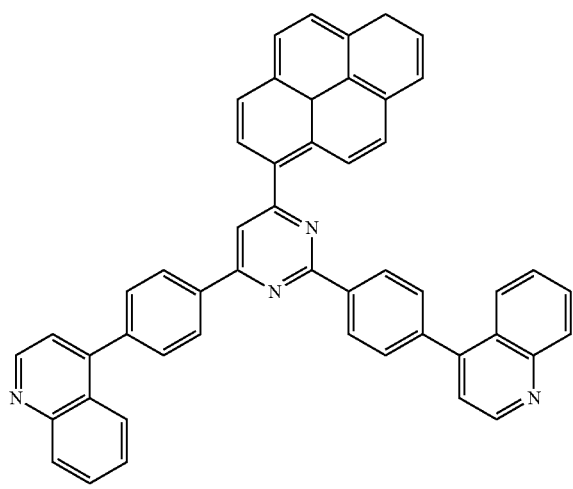
(37)
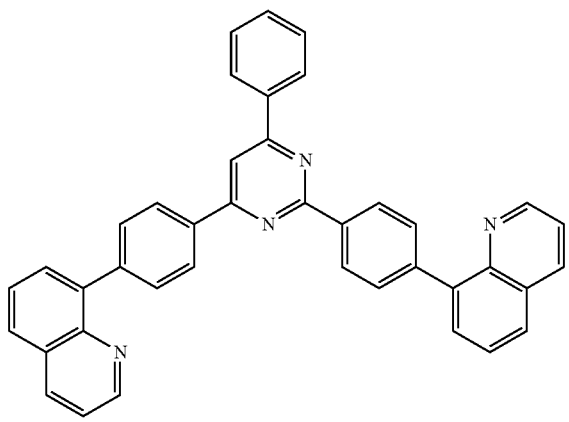
(38)
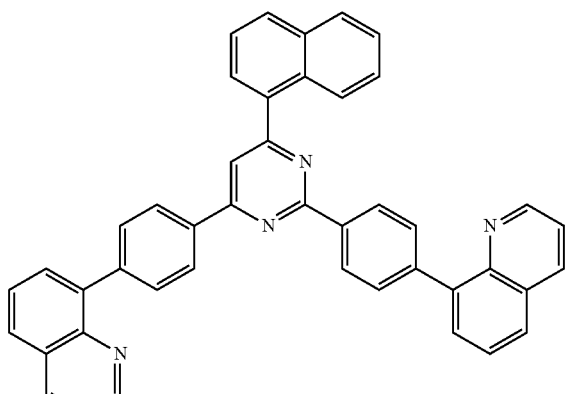
(39)
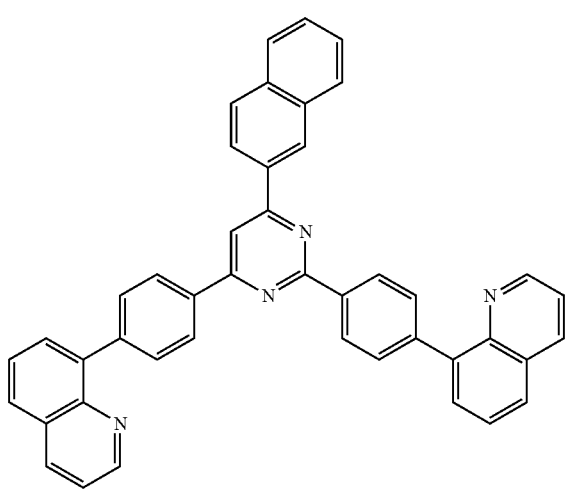

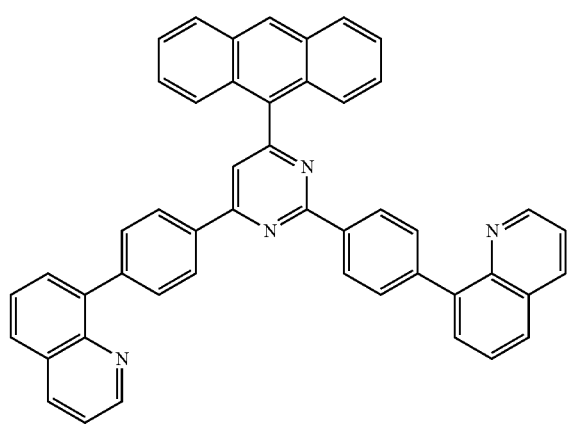
(40)
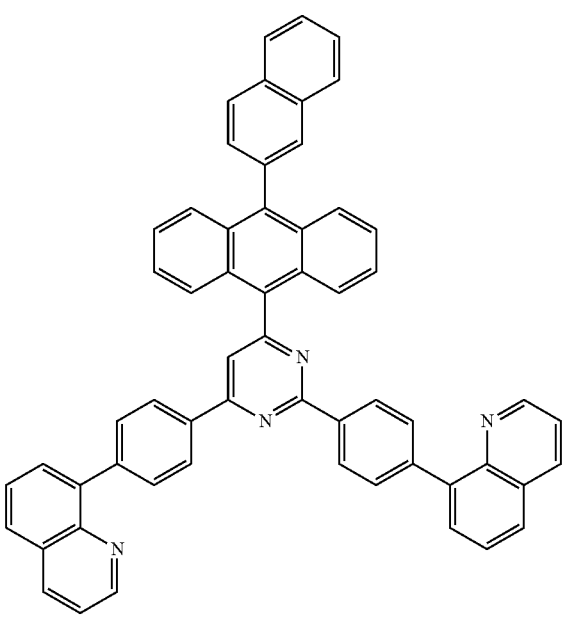
(43)
(41)
(44)
(42)
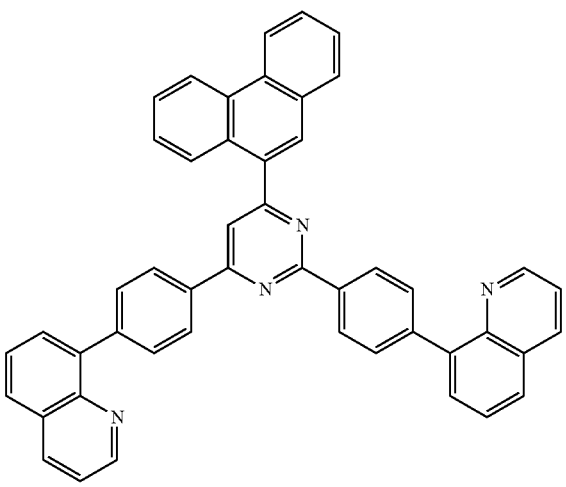
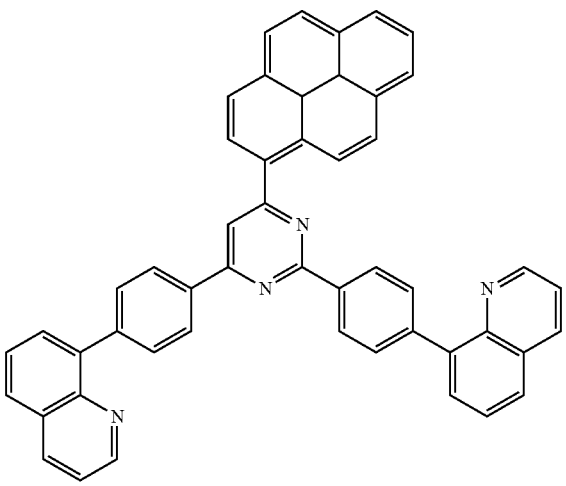
(45)

-continued
(46)
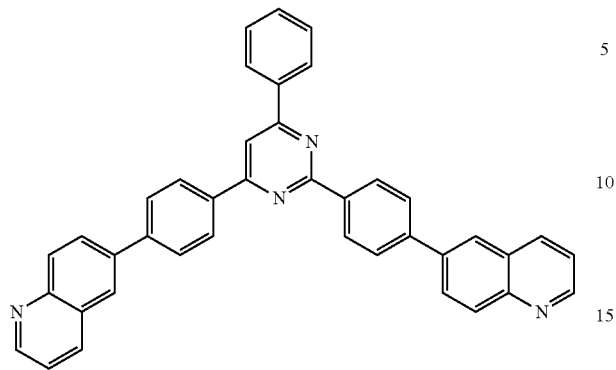
(47)
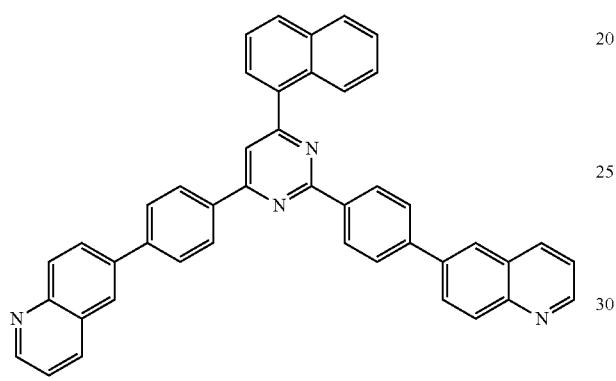
(48)
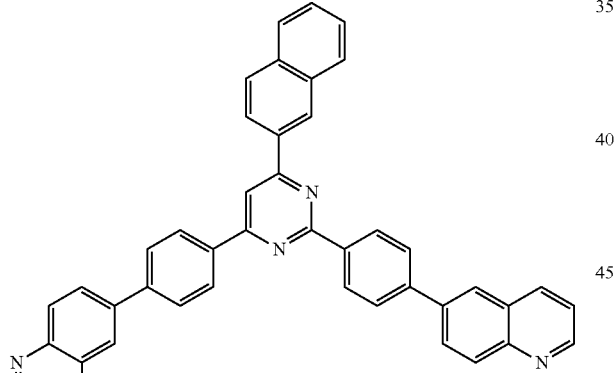
(49)
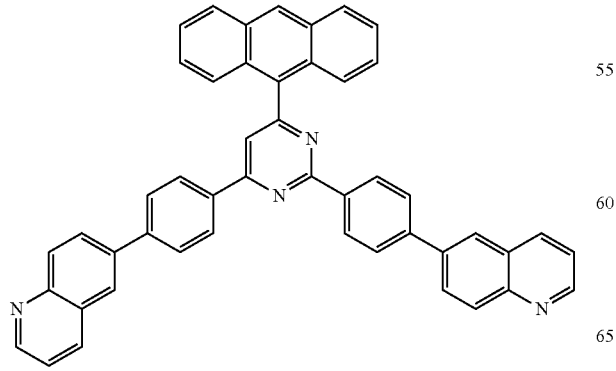
-continued
(50)
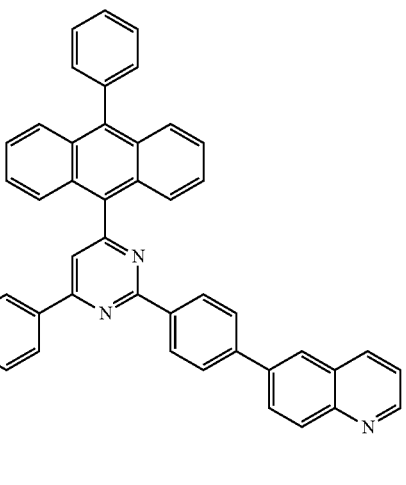
(51)
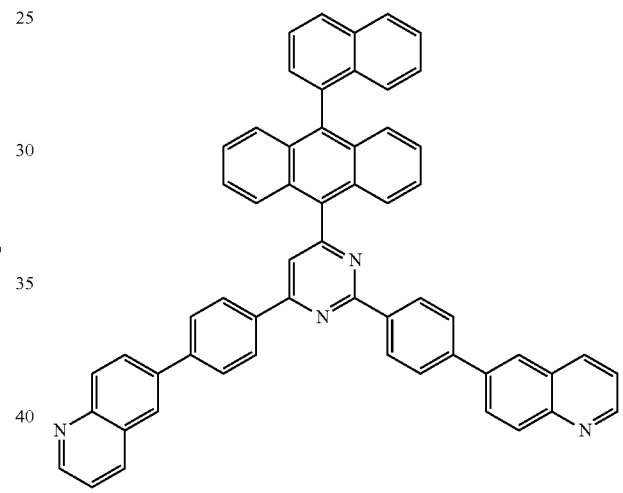
(52)
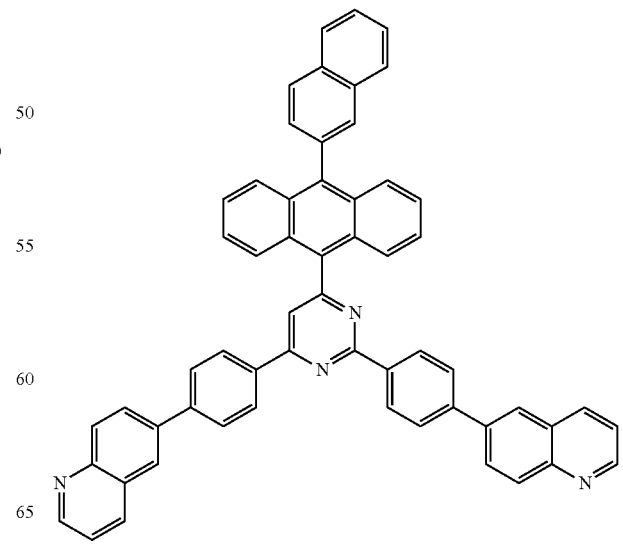

(53)
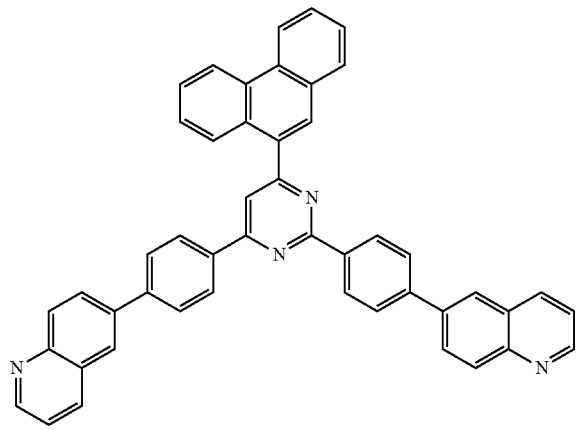
(54)
(55)
(56)
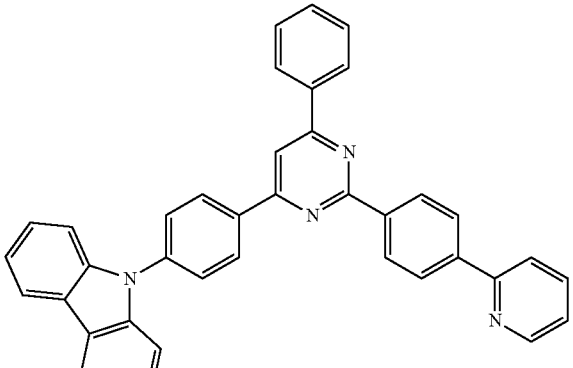
(57)
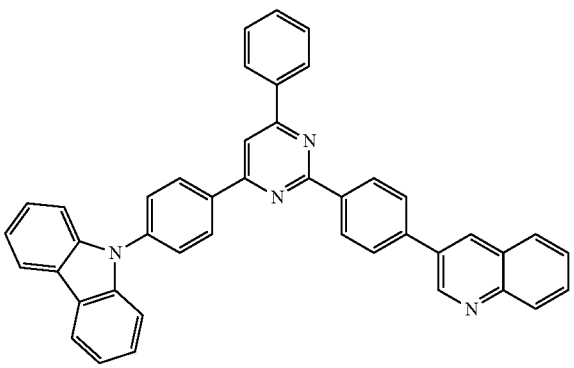
(58)
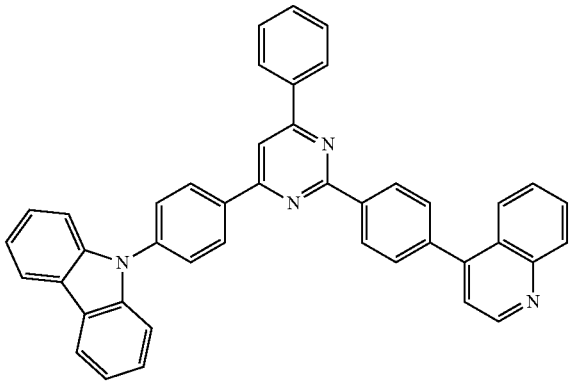
(59)
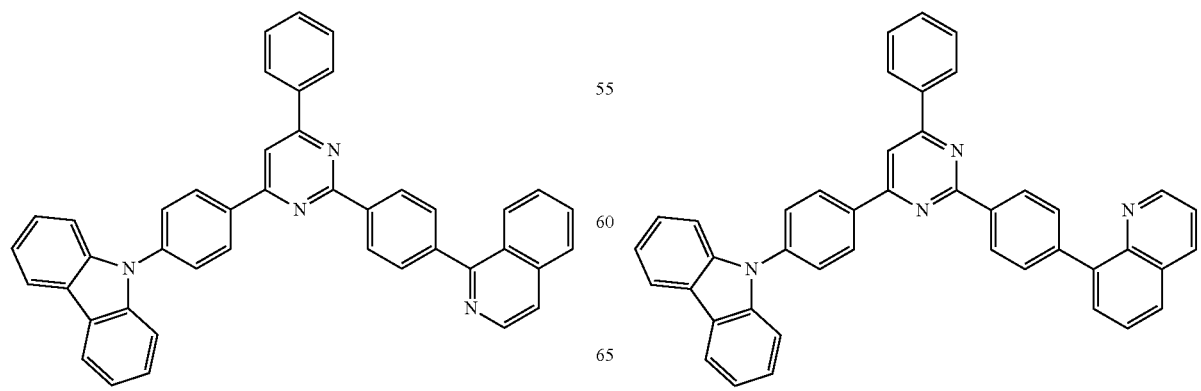

(60)
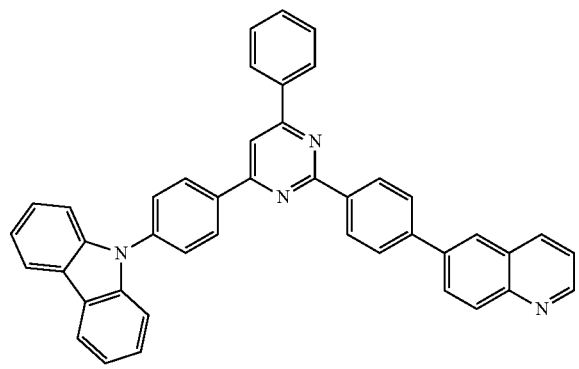
(61)
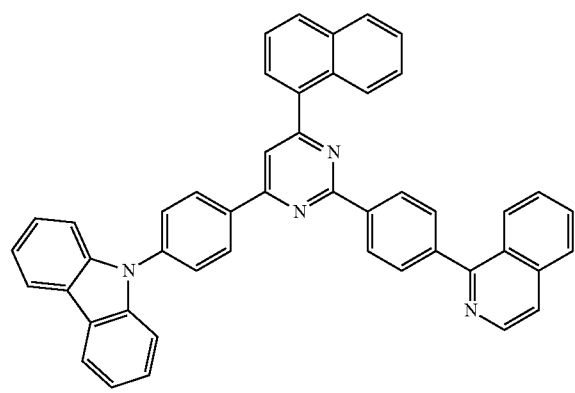
(62)
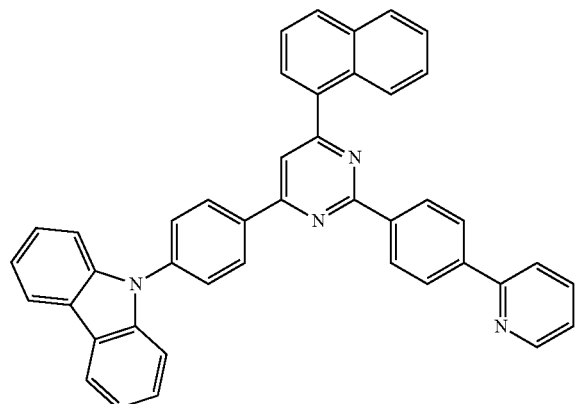
(63)
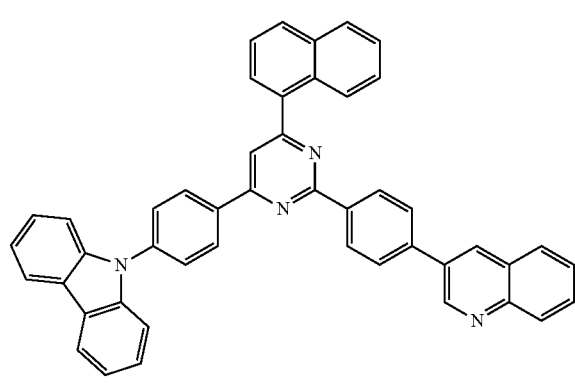
(64)
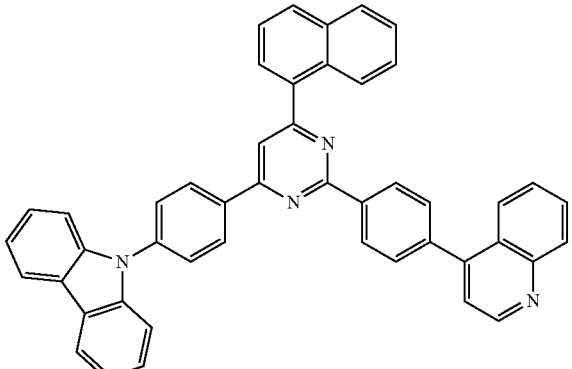
(65)
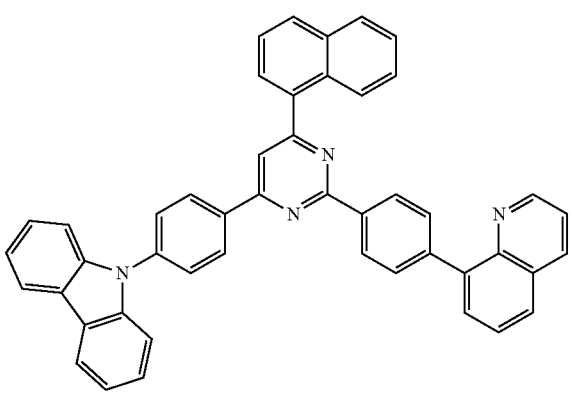
(66)
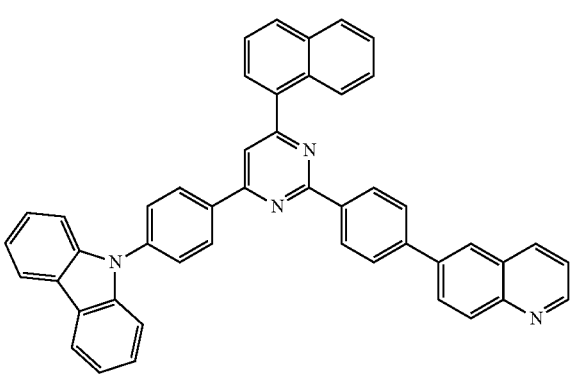
(67)
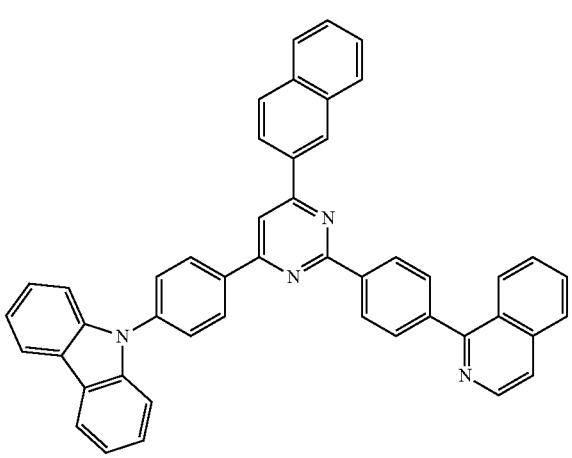

-continued
(68)
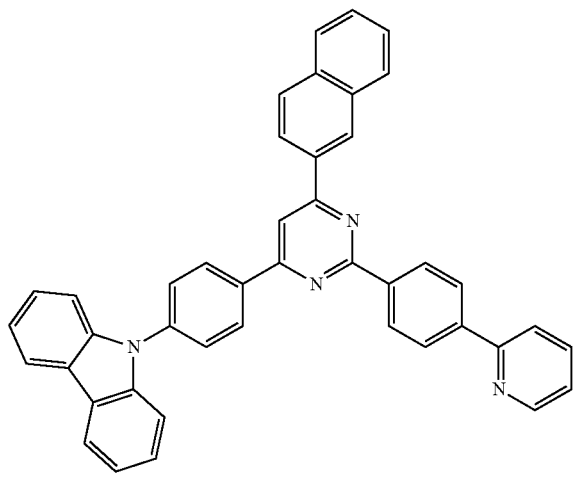
(69)
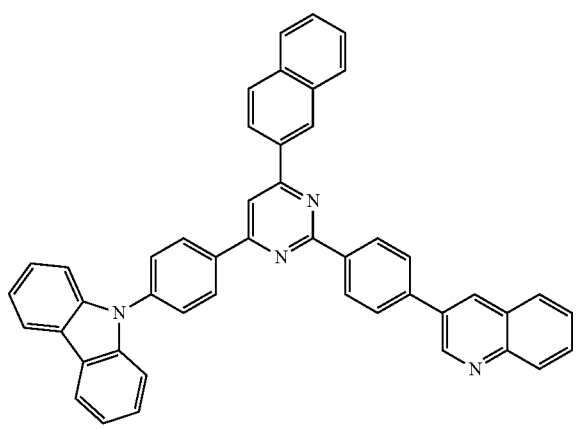
(70)
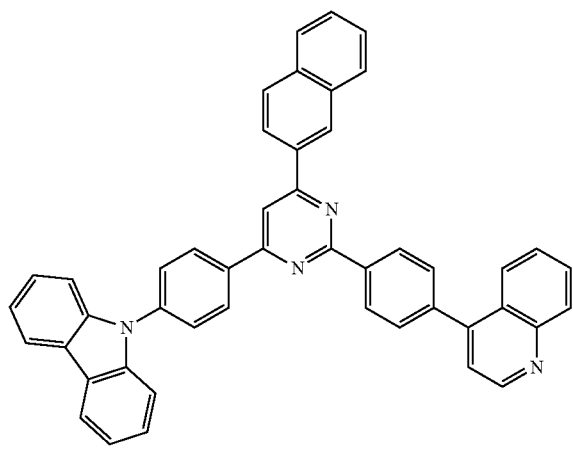
(71)
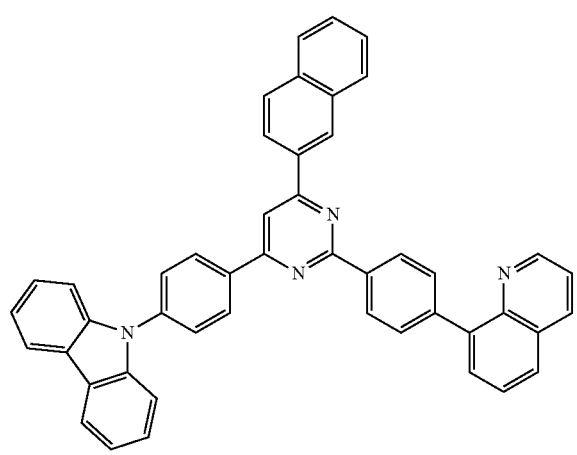
(72)
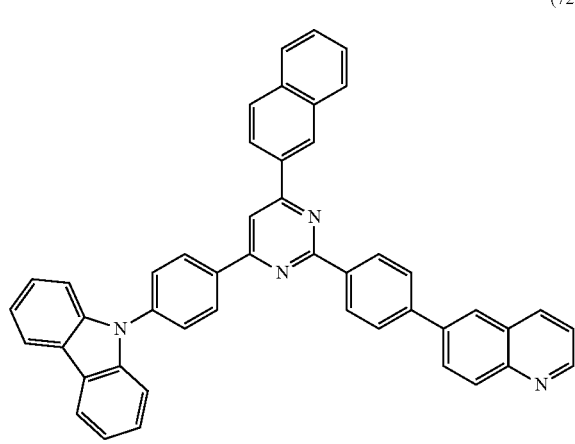
(73)
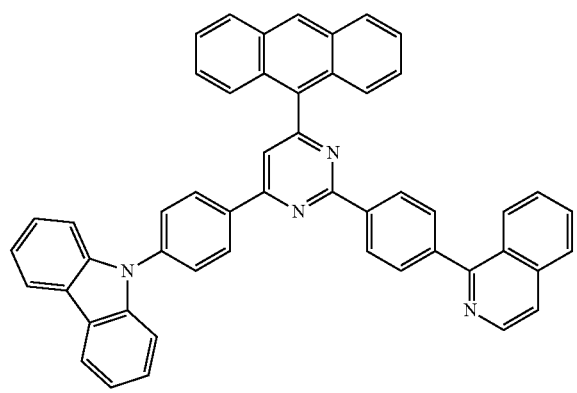

-continued
(74)
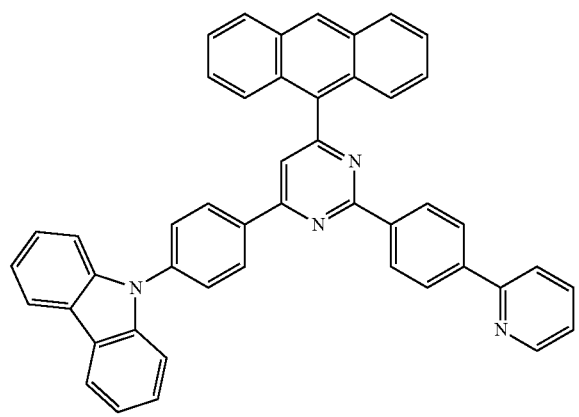
(75)
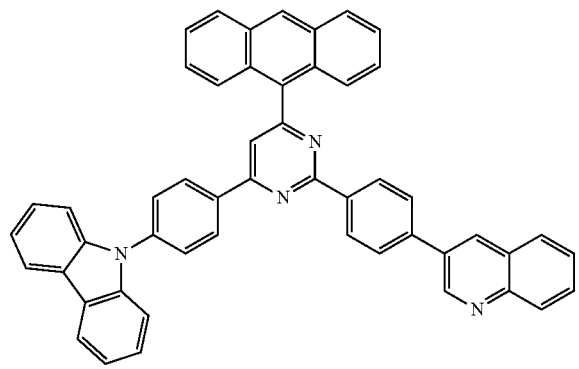
(76)
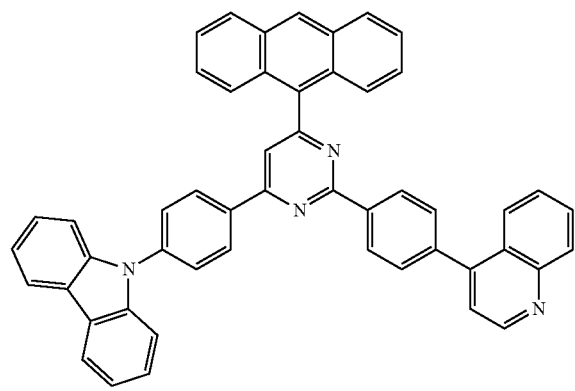
(77)
-continued
(78)
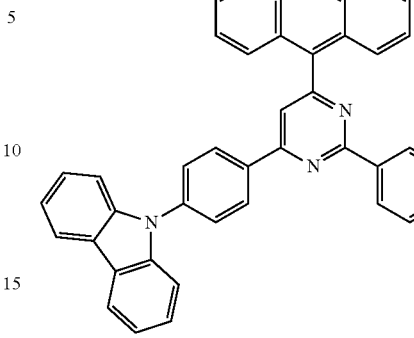
(79)
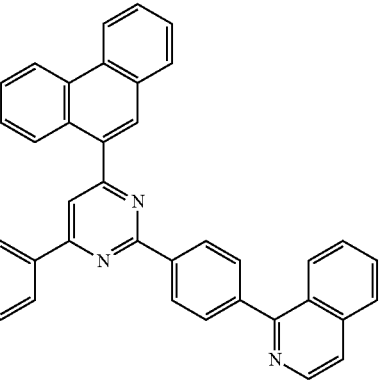
(80)
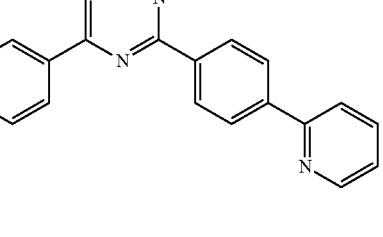

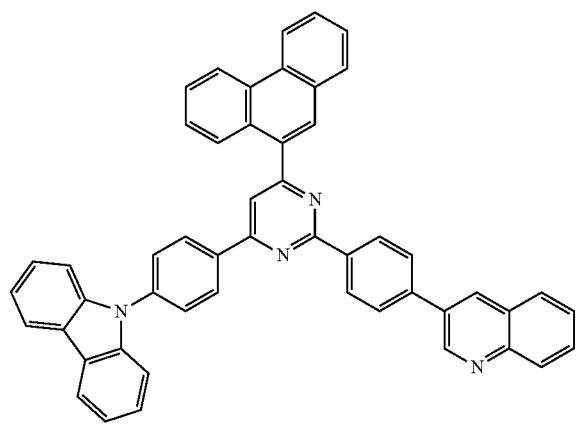
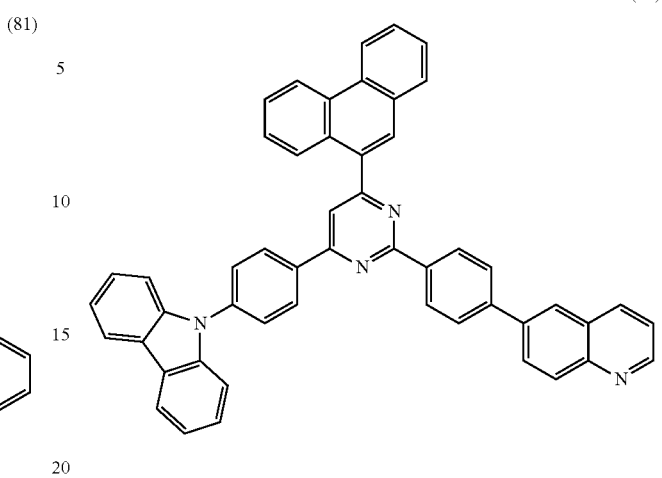
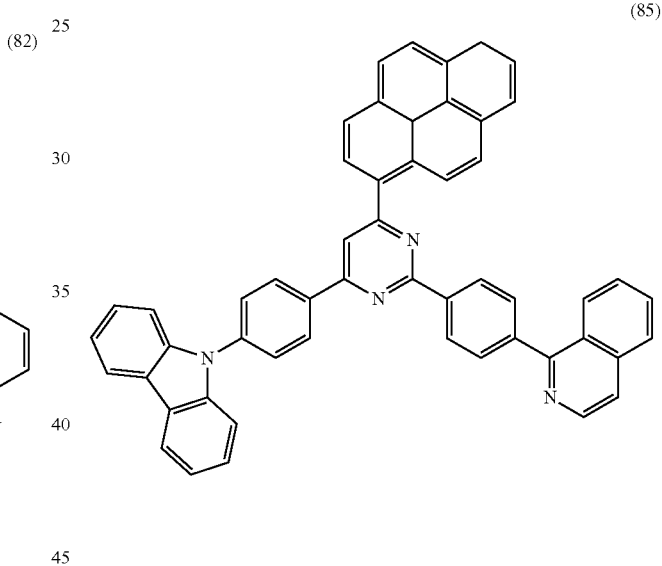
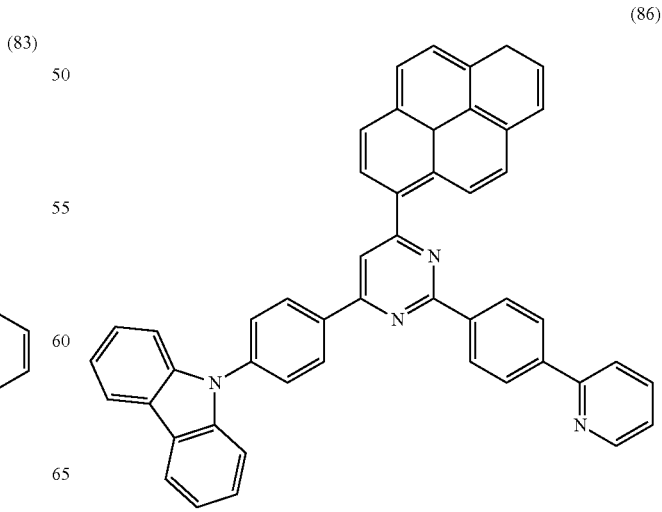

(87)

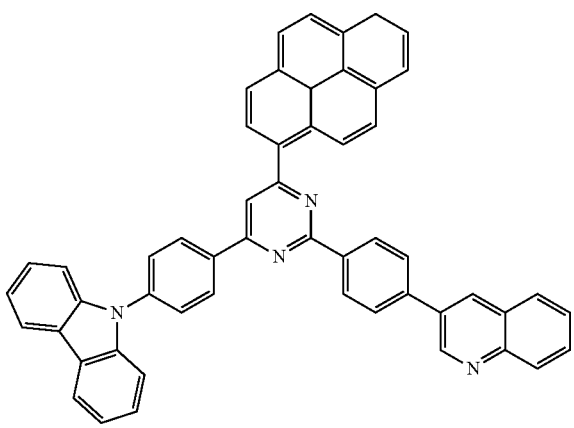

(88)

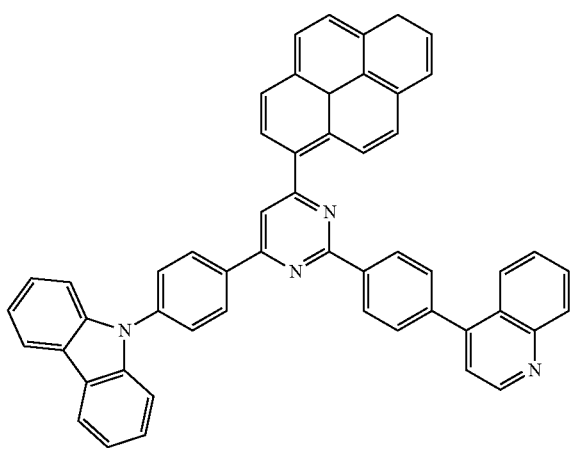

(89)

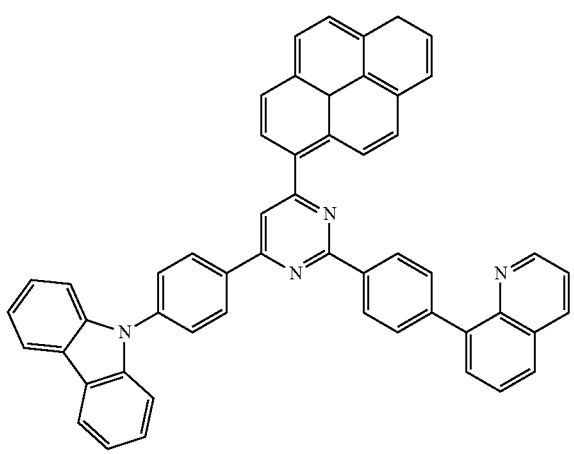

(90)

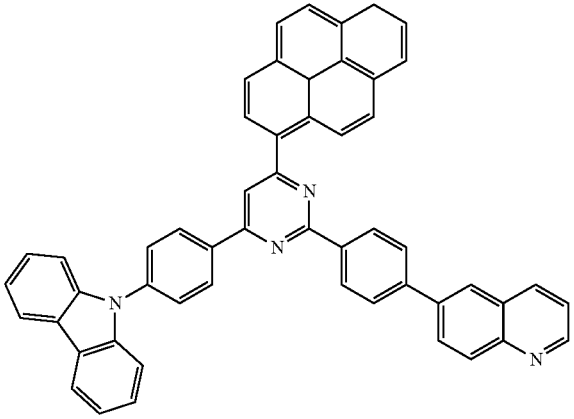

The material for an organic photoelectric device including the above compounds may play a role in hole injection, hole transport, light emitting, or electron injection and/or transport, and/or also as a light emitting host with an appropriate dopant. According to an embodiment, a compound for an organic photoelectric device may improve life-span and electrochemical and thermal stability, and may decrease the driving voltage for improving the life-span and efficiency characteristics of an organic photoelectric device when included in an organic thin layer.

Another embodiment provides an organic photoelectric device including the material for the organic photoelectric device. The organic photoelectric device may include, e.g., an organic light emitting diode, an organic solar cell, an organic transistor, an organic photo-conductor drum, an organic memory device, and the like.

In the organic solar cell, the compound of an embodiment may be included in an electrode or an electrode buffer layer, thereby improving quantum efficiency. In the organic transistor, the compound of an embodiment may be used as an electrode material in a gate, a source-drain electrode, and the like.

Hereinafter, an organic light emitting diode is described in more detail. According to an embodiment, the organic light emitting diode may include an anode, a cathode, and at least one organic thin layer between the anode and cathode. The organic thin layer may include the material for an organic photoelectric device of an embodiment.

The organic thin layer may include, e.g., an emission layer; and a hole transport layer (HTL), a hole injection layer (HIL), an electron transport layer (ETL), an electron injection layer (EIL), a hole blocking layer, and/or combinations thereof. At least one layer may include the material for an organic photoelectric device according to an embodiment.

FIGS. 1 to 5 illustrate cross-sectional views showing an organic light emitting diode including the material for an organic photoelectric device according to an embodiment.

Referring to FIGS. 1 to 5, organic light emitting diodes 100, 200, 300, 400, and 500 according to the embodiments may include at least one organic thin layer 105 between an anode 120 and a cathode 110.

The anode 120 may include an anode material having a large work function to facilitate hole injection into an organic thin layer. The anode material may include, e.g., a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or $SnO_2$:Sb; or a conductive polymer such as poly(3-methylthiophene), poly[3,4-(ethylene-1,2-dioxy)thiophene] (PEDT), polypyrrole, and polyaniline, but is not limited thereto. It is preferable to include a transparent electrode including ITO (indium tin oxide) as the anode 120.

The cathode 110 may include a cathode material having a small work function to facilitate electron injection into an organic thin layer. The cathode material may include, e.g., a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, $LiO_2$/Al, LiF/Ca, LiF/Al, and $BaF_2$/Ca, but is not limited thereto. It is preferable to include a metal electrode including aluminum as the cathode 110.

Referring to FIG. 1, the organic photoelectric device 100 may include an organic thin layer 105 including only an emission layer 130.

Figure 2:
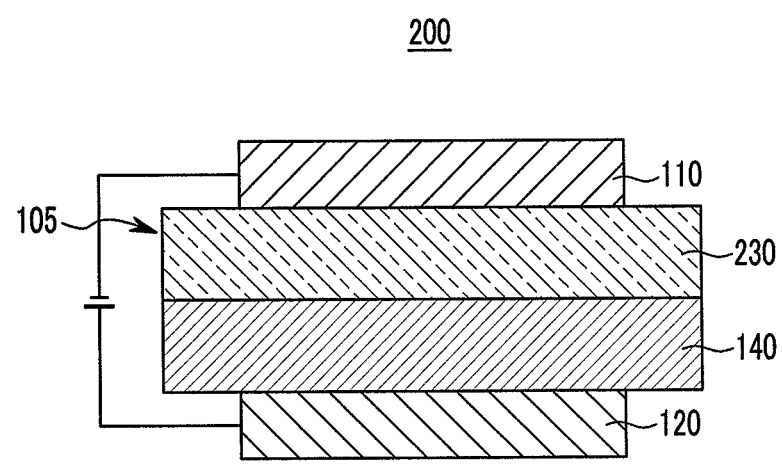

Referring to FIG. 2, a double-layered organic photoelectric device 200 may include an organic thin layer 105 including an emission layer 230 (including an electron transport layer (ETL)) and a hole transport layer (HTL) 140. The emission layer 230 may also function as an electron transport layer (ETL). The hole transport layer (HTL) 140 layer may exhibit excellent binding properties with a transparent electrode, e.g., ITO, and/or excellent hole transporting properties.

Figure 3:
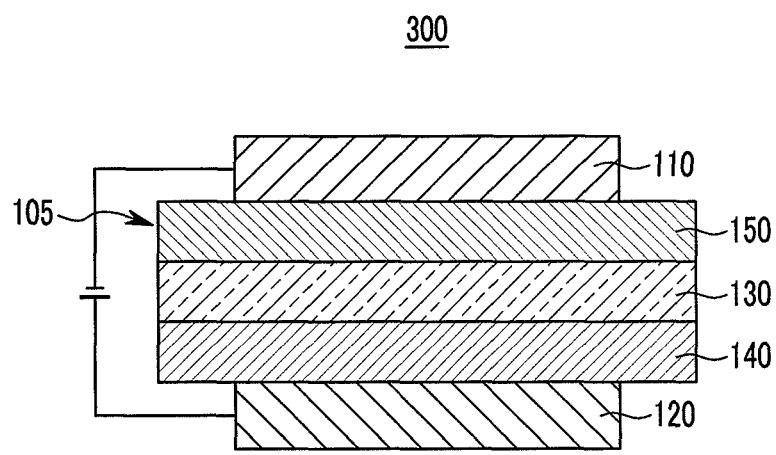

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed; and layers exhibiting excellent electron transporting properties (e.g., the ETL 150) and/or excellent hole transporting properties (e.g., the HTL 140) may be separately stacked.

Figure 4:
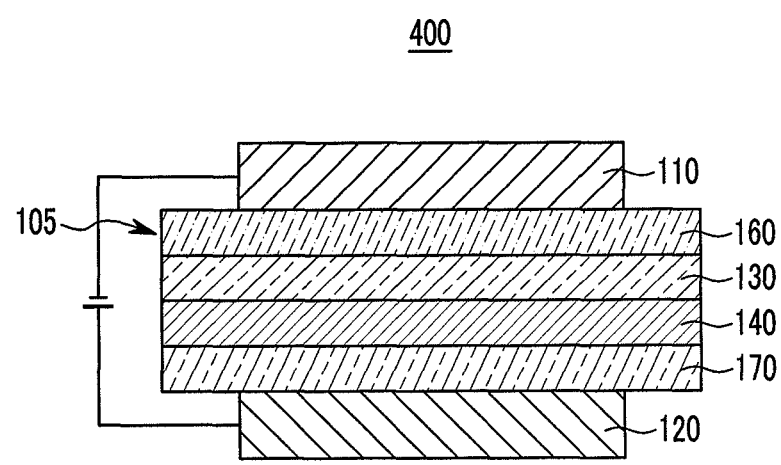

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 for binding with the anode 120 of, e.g., ITO.

Figure 5:
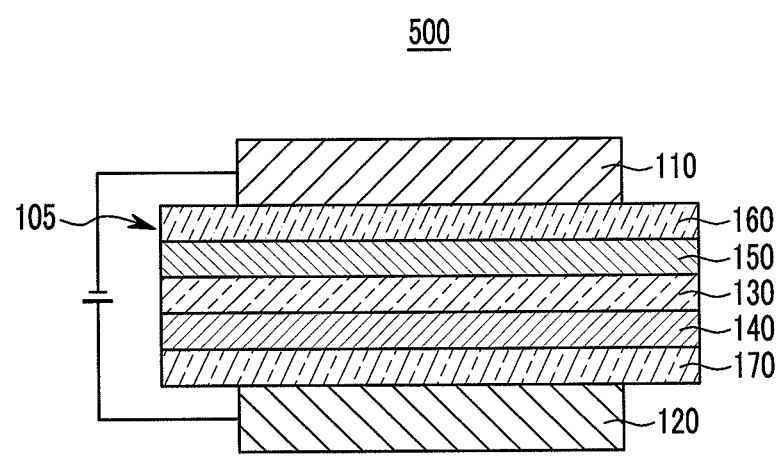

As shown in FIG. 5, a five layered organic photoelectric device 500 may include an organic thin layer 105 including an electron transport layer (ETL) 150, an emission layer 130, a hole transport layer (HTL) 140, a hole injection layer (HIL) 170, and an electron injection layer (EIL) 160 (to achieve a low voltage).

In FIGS. 1 to 5, the organic thin layer 105 (including at least one of an electron transport layer (ETL) 150, an electron injection layer (EIL) 160, an emission layer 130 and 230, a hole transport layer (HTL) 140, a hole injection layer (HIL) 170, and combinations thereof) may include the material for an organic photoelectric device according to an embodiment. In an implementation, the material for the organic photoelectric device according to an embodiment may be used for an electron transport layer (ETL) 150, which may include the electron transport layer (ETL) 150 or electron injection layer (EIL) 160. When the material is used for the electron transport layer (ETL) 150, it is possible to provide an organic photoelectric device having a simplified structure, because an additional hole blocking layer (not shown) may be omitted.

Furthermore, when the material for an organic photoelectric device according to an embodiment is included in the emission layer 130 and 230, the material for the organic photoelectric device may be included as a phosphorescent or fluorescent host or a fluorescent blue dopant.

The organic light emitting diode may be fabricated by forming an anode on a substrate; forming an organic thin layer (in accordance with a dry coating method e.g. an evaporation, a sputtering, a plasma plating, and an ion plating, or a wet coating method, e.g., spin coating, dipping, and flow coating); and providing a cathode thereon.

Another embodiment provides a display device including the organic photoelectric device according to an embodiment.

The following Examples and experiments are given for illustrative purposes only and are not intended to limit the scope of this disclosure. Moreover, the Comparative Examples are set forth to highlight certain characteristics of certain embodiments and are not to be construed as either limiting the scope of the invention as exemplified in the Examples or as necessarily always being outside the scope of the invention in every respect Preparing Material for Organic Photoelectric Device Synthesis Example 1

Synthesis of Compound (1)

For the specific example of the material for an organic photoelectric device, the compound (1) was synthesized in accordance with the following Reaction Scheme 1 in two steps.

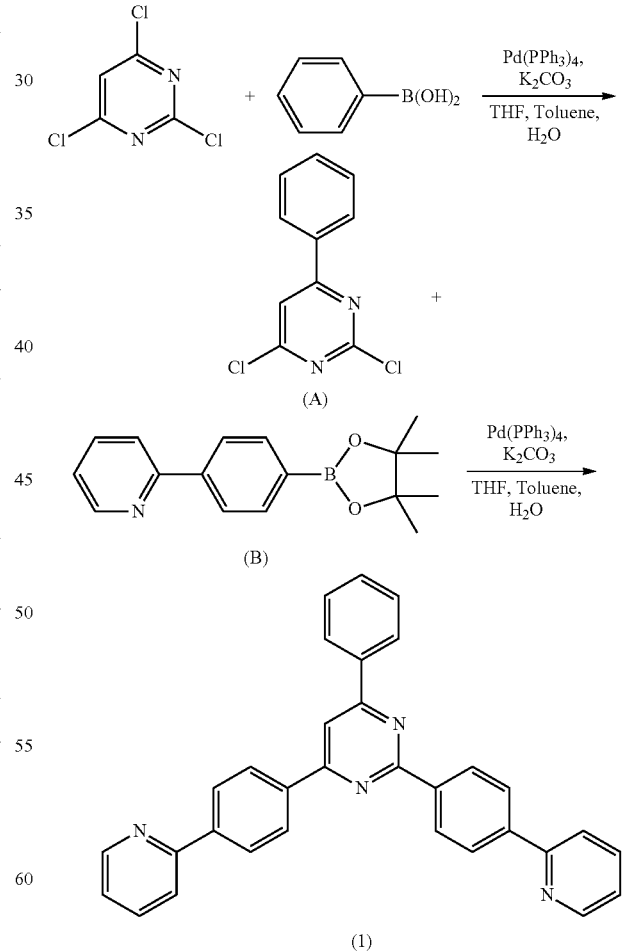

First Step: Synthesizing Intermediate Product (A)

75.0 g (409 mmol) of 2,4,6-trichloropyrimidine, 54.8 g (450 mmol) of phenylboronic acid, and 11.8 g (10 mmol) of tetrakis(triphenylphosphine)palladium were suspended in a mixed solvent of 450 ml of tetrahydrofuran and 300 ml of toluene to provide a suspension. The suspension was added to a solution in which 113.0 g (818 mmol) of potassium carbonate was dissolved in 300 ml of water, and the obtained mixture was heated and refluxed for 9 hours. After separating the reaction fluid into two layers, an organic layer was washed with a saturated sodium chloride aqueous solution and dried with anhydrous sodium sulfate.

The organic solvent was distilled and removed under reduced pressure, and then the residue was recrystallized with toluene. The obtained crystal was separated by filtration and washed with toluene to obtain 64.7 g (yield: 70.3%) of intermediate product (A).

Second Step: Synthesizing Compound (1)

2.3 g (10 mmol) of intermediate product (A), 6.3 g (22 mmol) of 2-(4-(4,4,5,5-tetramethyl-1,3,2-dioxaborolan-2-yl)phenyl)pyridine (B), and 0.6 g (0.5 mmol) of tetrakis(triphenylphosphine)palladium were suspended in a mixed solvent of 70 ml of tetrahydrofuran and 50 ml of toluene to provide a suspension. The suspension was added to a solution in which 5.7 g (41 mmol) of potassium carbonate was dissolved in 50 ml of water. The obtained mixture was heated and refluxed for 12 hours. After separating the reaction fluid into two layers, an organic layer was washed with a saturated sodium chloride aqueous solution and dried with anhydrous sodium sulfate.

The organic solvent was distilled and removed under reduced pressure, and then the residue was recrystallized with toluene. The obtained crystal was separated by filtration and washed with toluene to obtain 3.9 g (yield: 67.9%) of compound (1).

$^1$H NMR (300 MHz, CDCl$_3$) 8.85 (d, 2H), 8.75 (d, 2H), 8.45 (d, 2H), 8.34 (d, 2H), 8.21 (m, 4H), 8.08 (s, 1H), 7.80 (m, 4H), 7.60 (m, 3H), 7.27 (m, 2H); MS[M+1] 463.

Synthesis Example 2

Synthesizing Compound (2)

For the specific example of the material for an organic photoelectric device, compound (2) was synthesized in accordance with the following Reaction Scheme 2 in two steps.

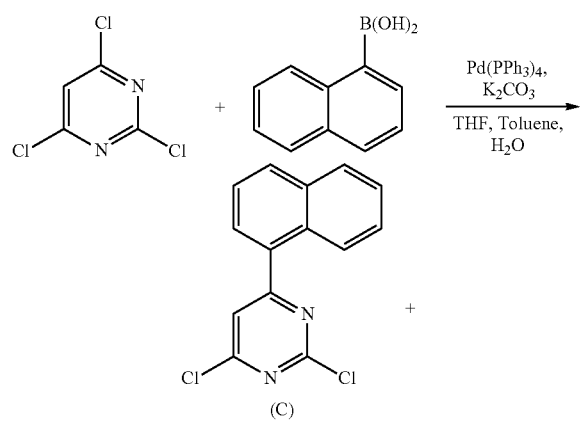

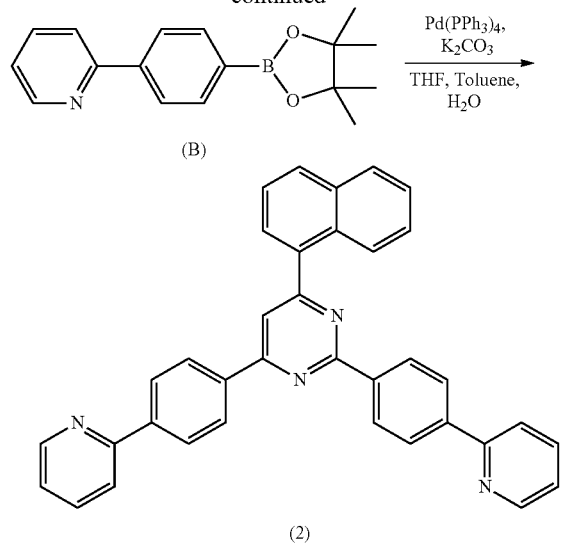

First Step: Synthesizing Intermediate Product (C)

75.0 g (409 mmol) of 2,4,6-trichloropyrimidine, 77.3 g (450 mmol) of naphthylboronic acid, and 11.8 g (10 mmol) of tetrakis(triphenylphosphine)palladium were suspended in a mixed solvent of 450 ml of tetrahydrofuran and 300 ml of toluene to provide a suspension. The suspension was added to a solution in which 113.0 g (818 mmol) of potassium carbonate was dissolved in 300 ml of water, and the obtained mixture was heated and refluxed for 9 hours. After separating the reaction fluid into two layers, an organic layer thereof was washed with a saturated sodium chloride aqueous solution and dried with anhydrous sodium sulfate.

The organic solvent was distilled and removed under reduced pressure, and then the residue was recrystallized with toluene. The obtained crystal was separated by filtration and washed with toluene to obtain 80.0 g (yield: 71.1%) of intermediate product (C).

Second Step: Synthesizing Compound (2)

3.2 g (12 mmol) of intermediate product (C), 7.2 g (26 mmol) of 2-(4-(4,4,5,5-tetramethyl-1,3,2-dioxaborolan-2-yl)phenyl)pyridine (B), and 0.7 g (0.6 mmol) of tetrakis(triphenylphosphine)palladium were suspended in a mixed solvent of 100 ml of tetrahydrofuran and 65 ml of toluene to provide a suspension. The suspension was added to a solution in which 6.4 g (47 mmol) of potassium carbonate was dissolved in 65 ml of water. The obtained mixture was heated and refluxed for 12 hours. After separating the reaction fluid into two layers, an organic layer thereof was washed with a saturated sodium chloride aqueous solution and dried with anhydrous sodium sulfate.

The organic solvent was distilled and removed under reduced pressure, and then the residue was recrystallized with toluene. The extracted crystal was separated by filtration and washed with toluene to obtain 4.1 g (yield: 69.0%) of compound (2).

$^1$H NMR (300 MHz, CDCl$_3$) 8.85 (d, 2H), 8.76 (d, 2H), 8.45 (m, 3H), 8.20 (m, 4H), 8.01 (m, 3H), 7.80 (m, 5H), 7.61 (m, 3H), 7.27 (m, 2H); MS[M+1] 513.

Synthesis Example 3

Synthesizing Compound (10)

For the specific example of the material for organic photoelectric device, the compound (10) was synthesized in accordance with the following Reaction Scheme 3.

Reaction Scheme 3

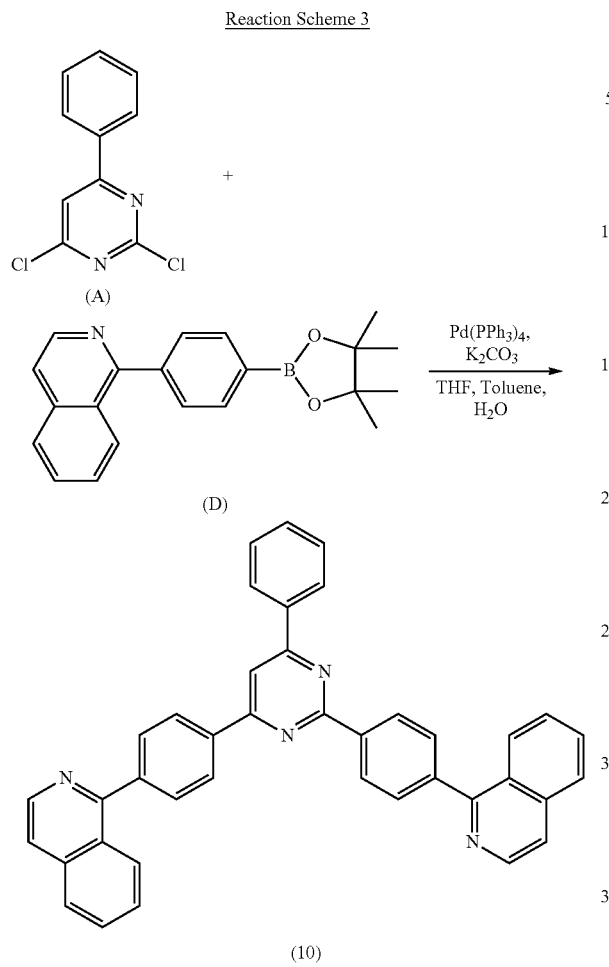

(10)

Reaction Scheme 4

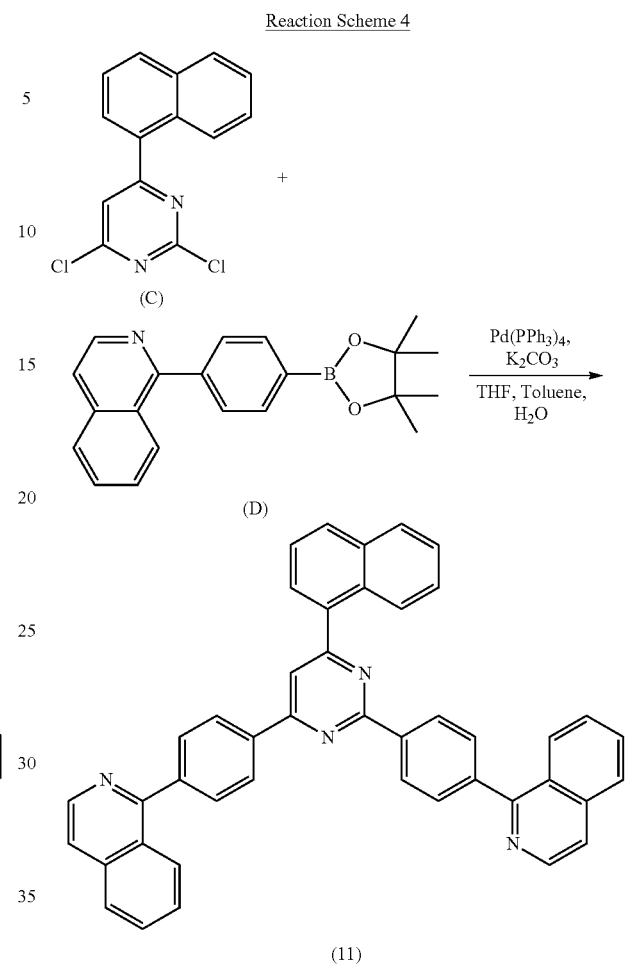

(11)

2.3 g (10 mmol) of intermediate product (A), 7.5 g (22 mmol) of 1-(4-(4,4,5,5-tetramethyl-1,3,2-dioxaborolan-2-yl) phenyl)isoquinoline (D), and 0.6 g (0.5 mmol) of tetrakis (triphenylphosphine)palladium were suspended in a mixed solvent of 70 ml of tetrahydrofuran and 50 ml of toluene to provide a suspension. The suspension was added to a solution in which 5.7 g (41 mmol) of potassium carbonate was dissolved in 50 ml of water. The obtained mixture was heated and refluxed for 12 hours. After separating the reaction fluid into two layers, an organic layer thereof was washed with a saturated sodium chloride aqueous solution and dried with anhydrous sodium sulfate.

The organic solvent was distilled and removed under reduced pressure, and then the residue was recrystallized with toluene. The extracted crystal was separated by filtration and washed with toluene to obtain 3.9 g (yield: 68.0%) of compound (10).

$^1$H NMR (300 MHz, CDCl$_3$) 8.94 (d, 2H), 8.68 (d, 2H), 8.52 (d, 2H), 8.39 (d, 2H), 8.21 (d, 2H), 8.16 (s, 1H), 7.94 (m, 6H), 7.72 (m, 4H), 7.61 (m, 5H); MS[M+1] 563.

Synthesis Example 4

Synthesizing Compound (11)

For a specific example of the material for organic photoelectric device, the compound (11) was synthesized in accordance with the following Reaction Scheme 4.

2.7 g (10 mmol) of intermediate product (C), 7.2 g (22 mmol) of 1-(4-(4,4,5,5-tetramethyl-1,3,2-dioxaborolan-2-yl) phenyl)isoquinoline (D), and 0.6 g (0.5 mmol) of tetrakis (triphenylphosphine)palladium were suspended in a mixed solvent of 80 ml of tetrahydrofuran and 55 ml of toluene to provide a suspension. The suspension was added to a solution in which 5.4 g (391 mmol) of potassium carbonate was dissolved in 55 ml of water. The obtained mixture was heated and refluxed for 12 hours. After separating the reaction fluid into two layers, an organic layer thereof was washed with a saturated sodium chloride aqueous solution and dried with anhydrous sodium sulfate.

The organic solvent was distilled and removed under reduced pressure, and then the residue was recrystallized with toluene. The extracted crystal was separated by filtration and washed with toluene to obtain 4.5 g (yield: 65.0%) of compound (11).

$^1$H NMR (300 MHz, CDCl$_3$) 8.93 (d, 2H), 8.67 (d, 2H), 8.53 (d, 2H), 8.45 (d, 1H), 8.21 (d, 2H), 7.96 (m, 10H), 7.72 (m, 5H), 7.64 (m, 4H); MS[M+1] 613.

Synthesis Example 5

Synthesizing Compound (19)

For a specific example of the material for organic photoelectric device, the compound (19) was synthesized in accordance with the following Reaction Scheme 5.

Reaction Scheme 5

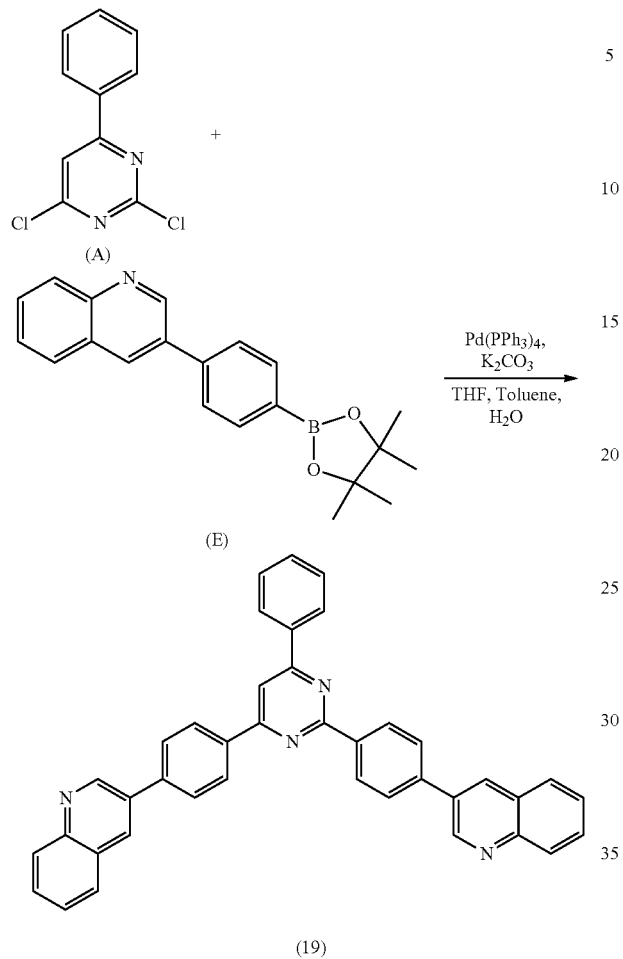

(19)

4.0 g (18 mmol) of intermediate product (A), 13.0 g (39 mmol) of 3-(4-(4,4,5,5-tetramethyl-1,3,2-dioxaborolan-2-yl) phenyl)quinoline (E), and 1.0 g (0.9 mmol) of tetrakis(triphenylphosphine)palladium were suspended in a mixed solvent of 120 ml of tetrahydrofuran and 80 ml of toluene to provide a suspension. The suspension was added to a solution in which 9.8 g (71 mmol) of potassium carbonate was dissolved in 80 ml of water. The obtained mixture was heated and refluxed for 12 hours. After separating the reaction fluid into two layers, an organic layer thereof was washed with a sodium chloride saturated aqueous solution and dried with anhydrous sodium sulfate.

The organic solvent was distilled and removed under reduced pressure, and then the residue was recrystallized with toluene. The extracted crystal was separated by filtration and washed with toluene to obtain 6.5 g (yield: 64.7%) of compound (19).

$^1$H NMR (300 MHz, CDCl$_3$) 9.31 (d, 2H), 8.89 (d, 2H), 8.40 (m, 6H), 8.17 (d, 2H), 8.09 (s, 1H), 7.92 (m, 6H), 7.75 (m, 2H), 7.59 (m, 5H); MS[M+1] 563.

Synthesis Example 6

Synthesizing Compound (63)

For the specific example of the material for an organic photoelectric device, the compound (63) was synthesized in accordance with the following Reaction Scheme 6.

Reaction Scheme 6

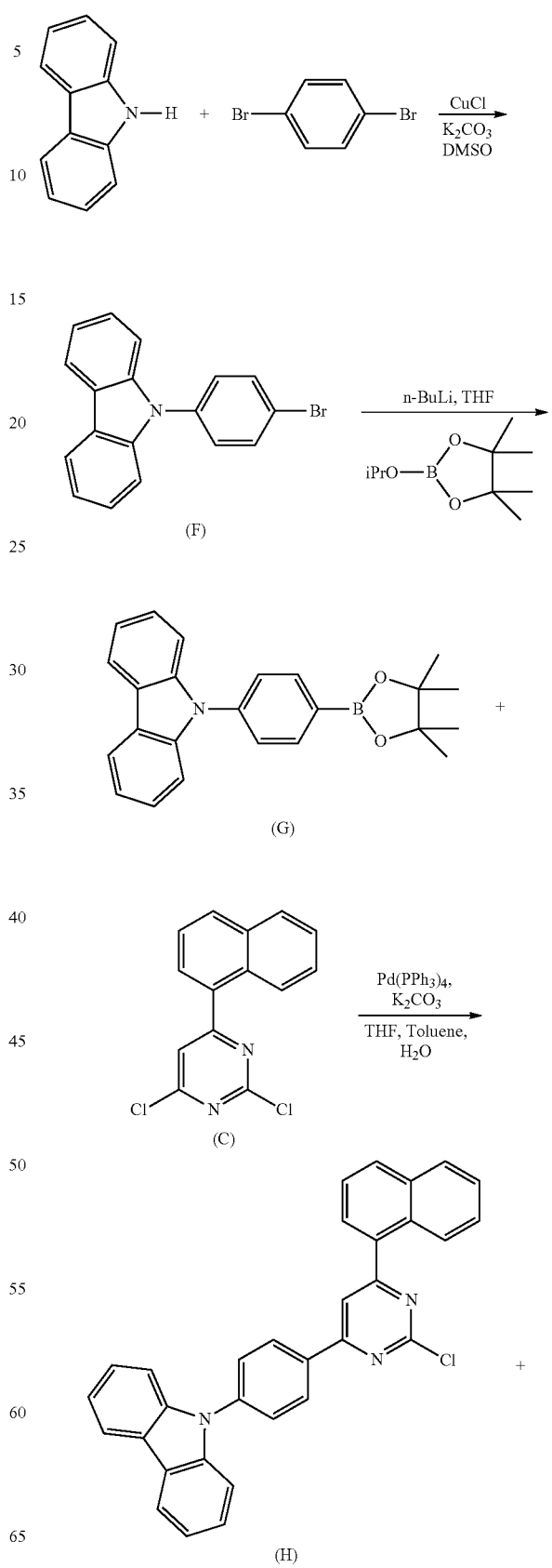

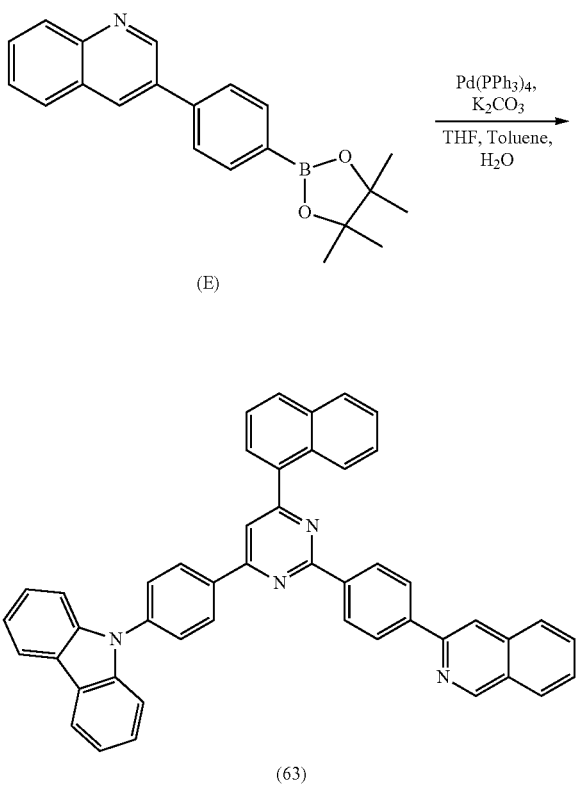

First Step: Synthesizing Intermediate Product (F)

50.8 g (304 mmol) of carbazole, 71.6 g (304 mmol) of 1,4-dibromobenzene, 3.76 g (38 mmol) of cuprous chloride, and 83.9 g (607 mmol) of potassium carbonate were suspended in 322 ml of dimethyl sulfoxide and refluxed for 8 hours under nitrogen atmosphere while heating. The obtained reaction fluid was cooled to room temperature, and recrystallized using methanol.

The obtained crystal was separated by filtration, and the resulting product was purified using a silica gel column chromatography to obtain 55.9 g (61.3%) of intermediate product (F).

Second Step: Synthesizing Intermediate Product (G)

37.8 g (117 mmol) of the intermediate product (F) was dissolved in 378 ml of tetrahydrofuran, 100.5 ml (161 mmol) of 1.6 M n-butyl lithium hexane solution was added at −70° C. under argon atmosphere, and then the resulting solution was agitated at −70° C. to −40° C. for 1 hour. The reaction fluid was cooled to −70° C. and 47.9 ml (235 mmol) of isopropyl tetramethyl dioxaboloane was added in a dropwise fashion. After the resulting solution was agitated at −70° C. for 1 hour, the temperature increased to a room temperature and agitation was performed for 6 hours. 200 ml of water was added to the resulting solution and then agitated for 20 minutes.

After separating the reaction fluid into two layers, an organic layer was washed with a saturated sodium chloride aqueous solution and dried with anhydrous sodium sulfate.

The organic solvent was distilled and removed under reduced pressure, and then the residue was recrystallized with toluene. The obtained crystal was separated by filtration and washed with toluene to obtain 28.9 g (yield: 66.7%) of intermediate product (G).

Third Step: Synthesizing Intermediate Product (H)

26.8 g (73 mmol) of the intermediate product (G), 20.0 g (73 mmol) of the compound (C), and 2.1 g (1.8 mmol) of tetrakis(triphenylphosphine)palladium were suspended in a mixed solvent of 600 ml of tetrahydrofuran and 400 ml of toluene to provide a suspension. The suspension was added to a solution in which 20.1 g (154 mmol) of potassium carbonate was dissolved in 400 ml of water. The obtained mixture was heated and refluxed for 8 hours. After separating the reaction fluid into two layers, an organic layer was washed with a saturated sodium chloride aqueous solution and dried with anhydrous sodium sulfate.

The organic solvent was distilled and removed under reduced pressure, and then the residue was recrystallized with toluene. The obtained crystal was separated by filtration and washed with toluene to obtain 23.0 g (yield: 65.4%) of intermediate product (H).

Fourth Step: Synthesizing Compound (63)

6.0 g (12 mmol) of the intermediate product (H), 4.5 g (14 mmol) of the compound (E), and 0.36 g (0.3 mmol) of tetrakis(triphenylphosphine)palladium were suspended in a mixed solvent of 180 ml of tetrahydrofuran and 120 ml of toluene to provide a suspension. The suspension was added to a solution in which 3.4 g (25 mmol) of potassium carbonate was dissolved in 120 ml of water. The obtained mixture was heated and refluxed for 12 hours. After separating the reaction fluid into two layers, an organic layer was washed with a saturated sodium chloride aqueous solution and dried with anhydrous sodium sulfate.

The organic solvent was distilled and removed under reduced pressure, and then the residue was recrystallized with toluene. The obtained crystal was separated by filtration and washed with toluene to obtain 7.2 g (yield: 88.3%) of compound (63).

$^1$H NMR (300 MHz, CDCl$_3$) 9.31 (s, 1H), 8.92 (d, 2H), 8.62 (d, 2H), 8.45 (m, 2H), 8.19 (d, 3H), 7.71 (m, 20H); MS[M+1] 651.

Figure 6:
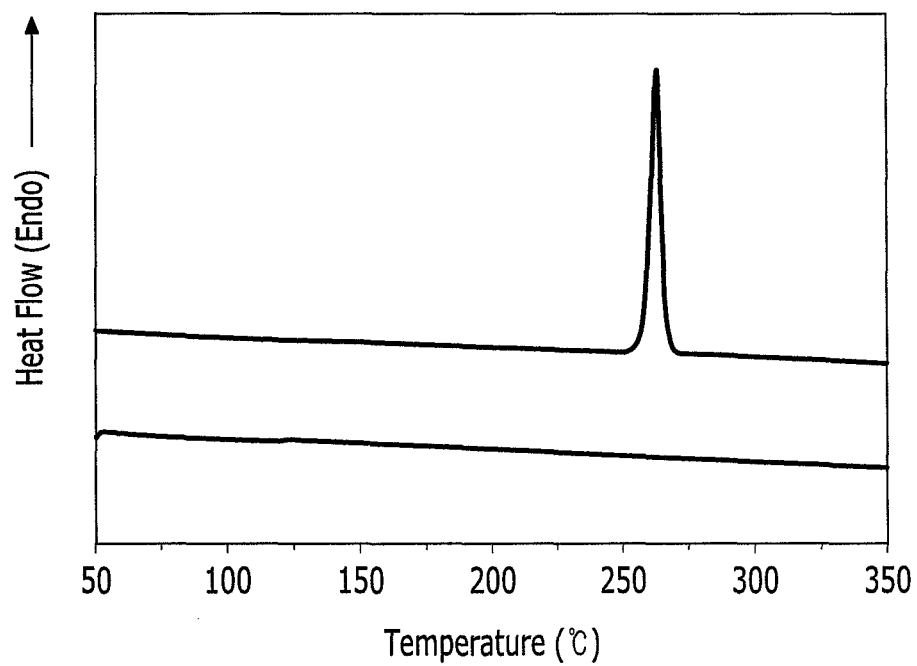
FIG. 6 illustrates a graph showing Differential Scanning calorimetry (DSC) measurement result of a compound according to Synthesis Example 1.

The synthesized compounds were measured to determine glass transition temperature and thermal decomposition temperature by differential scanning calorimetry (DSC) and thermogravimetry (TGA). The results of the analysis of the compound (1) prepared according to Synthesis Example 1 are shown in FIG. 6.

Fabricating Organic Photoelectric Device

Example 1

A 15 Ω/cm$^2$ (1200 Å ITO glass substrate (Corning Inc.)) was provided to have a size of 50 mm×50 mm×0.7 mm, and was cleaned in isopropyl alcohol and pure water for 5 minutes, respectively, and then washed with UV and ozone for 30 minutes.

N,N'-diphenyl-N,N'-bis-[4-(phenyl-m-tolylamino)-phenyl)]-biphenyl-4,4'-diamine(N,N'-diphenyl-N,N'-bis-[4-(phenyl-m-tolyl-amino)-phenyl]-biphenyl-4,4'-diamine: DNTPD) (40 nm), N,N'-di(1-naphthyl)-N,N-diphenylbenzidine (NPB) (10 nm), EB-46 (fluorescent blue dopant, manufactured by E-Ray Optoelectronics Technology Co., Ltd): EB-512 (fluorescent blue host, manufactured by E-Ray Optoelectronics Technology Co., Ltd) 6% (40 nm), and the compound (1) (10 nm) obtained from Synthesis Example 1 were sequentially thermal-evaporated on the surface of glass substrate to provide a hole injection layer (HIL), a hole transfer layer (HTL), an emission layer, and an electron transport layer (ETL).

As an electron injection layer (EIL), LiF was evaporated on the ETL to a thickness of 0.5 nm, and Al was evaporated to a thickness of 100 nm to provide a LiF/Al electrode. The structure of the obtained organic photoelectric device is shown in FIG. 5.

Example 2

An organic photoelectric device was fabricated in accordance with the same procedure as in Example 1, except that compound (2) (10 nm) obtained from Synthesis Example 2 was used instead of compound (1).

Example 3

An organic photoelectric device was fabricated in accordance with the same procedure as in Example 1, except that compound (10) (10 nm) obtained from Synthesis Example 3 was used instead of compound (1).

Example 4

An organic photoelectric device was fabricated in accordance with the same procedure as in Example 1, except that compound (11) (10 nm) obtained from Synthesis Example 4 was used instead of compound (1).

Example 5

An organic photoelectric device was fabricated in accordance with the same procedure as in Example 1, except that compound (19) (10 nm) obtained from Synthesis Example 5 was used instead of compound (1).

Example 6

An organic photoelectric device was fabricated in accordance with the same procedure as in Example 1, except that compound (63) (10 nm) obtained from Synthesis Example 6 was used instead of compound (1).

Comparative Example 1

An organic photoelectric device was fabricated in accordance with the same procedure as in Example 1, except that the compound of $Alq_3$ (10 nm) represented by Chemical Formula 2, below, was used instead of compound (1).

[Chemical Formula 2]

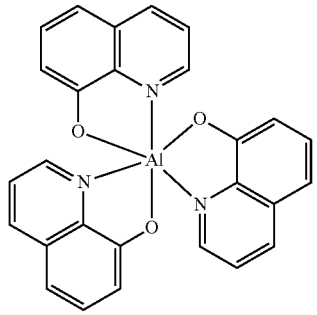

Performance Measurement of the Organic Photoelectric Device

Each organic photoelectric device according to Examples 1 to 6 and Comparative Example 1 was measured regarding luminous efficiency according to a voltage. The measurement method is as follows.

1) Measurement of Current Density Change Depending on Voltage Change

The prepared organic photoelectric devices according to Examples 1 to 6 and Comparative Example 1 were increased in voltage from 0 V to 14 V and measured regarding a current value in a unit device by using a current-voltage device (Keithley 2400®). Then, current densities were measured by dividing the current value by area.

2) Measurement of Luminance Change Depending on Voltage Change

The organic photoelectric devices according to Examples 1 to 6 and Comparative Example 1 were increased in voltage from 0 V to 14 V and measured regarding luminance using a luminance meter (Minolta Cs-1000A).

3) Measurement of Electric Power Efficiency (Luminous Efficiency)

Electric power efficiency was calculated from the current density and the luminance measured from the above 1) Measurement of current density change depending on voltage change, the above 2) Measurement of luminance change depending on voltage change, and voltage (V). The results are shown in the following Table 1.

TABLE 1

|  | Luminance 1000 cd/m² | | | | |
|---|---|---|---|---|---|
|  | Initial voltage | Driving voltage | Electric power | Color coordinate CIE | |
|  | ($V_{on}$) | (V) | efficiency (lm/W) | x | y |
| Ex. 1 | 3.00 | 6.00 | 2.42 | 0.15 | 0.15 |
| Ex. 2 | 3.00 | 6.00 | 2.12 | 0.15 | 0.15 |
| Ex. 3 | 2.80 | 6.00 | 1.97 | 0.15 | 0.15 |
| Ex. 4 | 2.80 | 6.20 | 2.00 | 0.15 | 0.15 |
| Ex. 5 | 3.22 | 7.04 | 2.01 | 0.15 | 0.15 |
| Ex. 6 | 3.03 | 6.86 | 2.05 | 0.15 | 0.15 |
| Comp. Ex. 1 | 3.80 | 8.20 | 1.87 | 0.15 | 0.15 |

Referring to Table 1, it may be seen that the organic photoelectric devices according to Examples 1 to 6 in which the electron transport layer was formed with the material for an organic photoelectric device according to an embodiment exhibited excellent electric power efficiency (Lm/W) performance together with a low driving voltage, compared to Comparative Example 1, which used the electron transport layer of $Alq_3$. Accordingly, the organic compound according to an embodiment exhibited high thermal stability and prepared a device that exhibited a low driving voltage and high luminous efficiency. Thus, it is anticipated that the material of an embodiment may improve the life-span of an organic photoelectric device. Without being bound by theory, it is believed that the asymmetry of the material for an organic photoelectric device enriched the amorphous characteristic, thereby suppressing crystallization and resulting in improved life-span of the device.

4) Measurement of Thermal Characteristic

A first analysis was carried out with the compounds obtained from Synthesis Examples 1 to 6 by differential scanning calorimetry (DSC). Then, a second analysis was carried out with the compounds, thereby completing the first analysis. The analysis results for the compound according to Synthesis Example 1 are shown in FIG. 6. Referring to FIG. 6, the compound prepared according to Synthesis Example 1 showed a melting point peak in the first analysis, and did not show a melting point peak in the second analysis. From the results, it may be seen that the compound according to Synthesis Example 1 was present in the stable, asymmetric state.

In addition, the compounds prepared according to Synthesis Examples 2 to 6 were present in the amorphous state in accordance with the same method. Accordingly, an organic light emitting diode including the compounds according to Synthesis Examples 1 to 6 may be used to provide devices that were not affected by Joule heat during driving; and for which the life-span characteristics may be improved compared to the organic photoelectric device of Comparative Example 1.

By way of summation and review, although the organic light emitting diode has been described, the hole injecting or transporting material, the electron injecting or transporting material, and the light emitting material may react in similar principles in other organic photoelectric devices.

When a material is used as a light emitting material, a maximum light emitting wavelength may be shifted to a long wavelength or color purity decreases because of interactions between molecules, or device efficiency decreases because of a light emitting quenching effect. Therefore, a host/dopant system may be included as a light emitting material in order to improve color purity and increase luminous efficiency and stability through energy transfer.

In order to achieve excellent performance of an organic light emitting diode, a material constituting an organic material layer, for example a hole injection material, a hole transport material, a light emitting material, an electron transport material, an electron injection material, and a light emitting material such as a host and/or a dopant should be stable and have good efficiency.

Thus, the embodiments provide a material that can act as a hole injection, hole transport, light emitting, or electron injection and/or transport material, and also as a light emitting host along with an appropriate dopant.

The embodiments also provide an organic photoelectric device including the material for an organic photoelectric device, and having improved life-span, efficiency, driving voltage, electrochemical stability, and thermal stability.

The material for an organic photoelectric device according to one embodiment may have an asymmetric structure with respect to a pyrimidine core. Such asymmetric structure including a pyrimidine core may reinforce amorphous characteristics and may thereby suppresses crystallization, thus improving life-span characteristics of an organic photoelectric device when an organic photoelectric device is driven. Therefore, an organic photoelectric device having excellent efficiency, driving voltage, electrochemical stability, and thermal stability may be provided.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A material for an organic photoelectric device, the material comprising at least one of the following compounds (1) to (90):

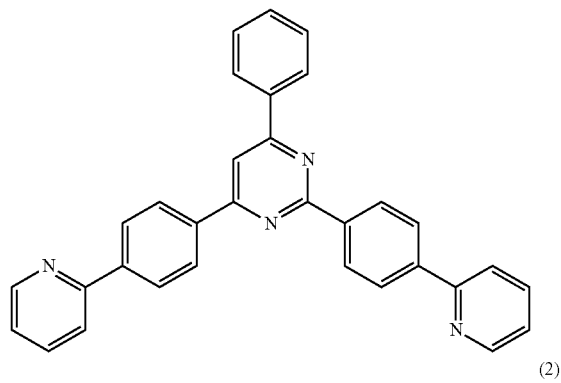

(1)

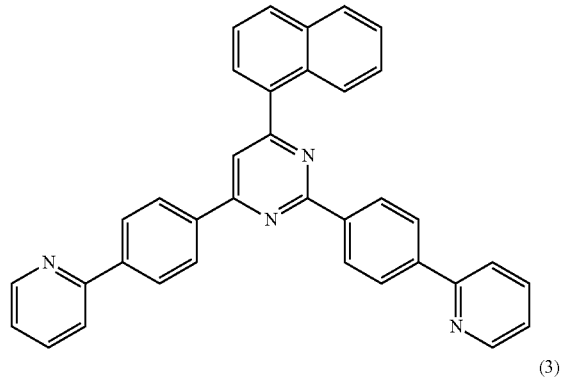

(2)

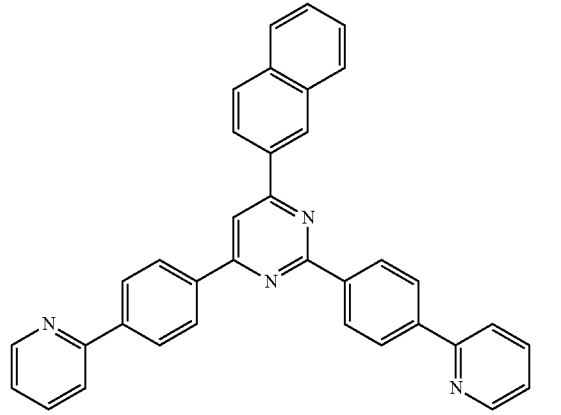

(3)

(4)
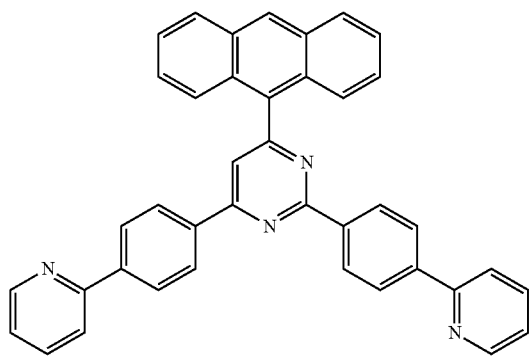
(5)
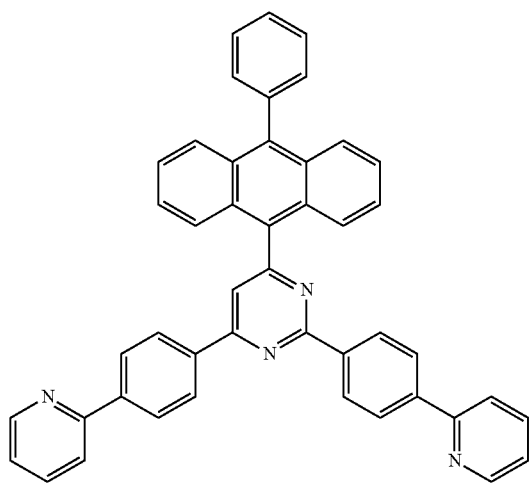
(6)
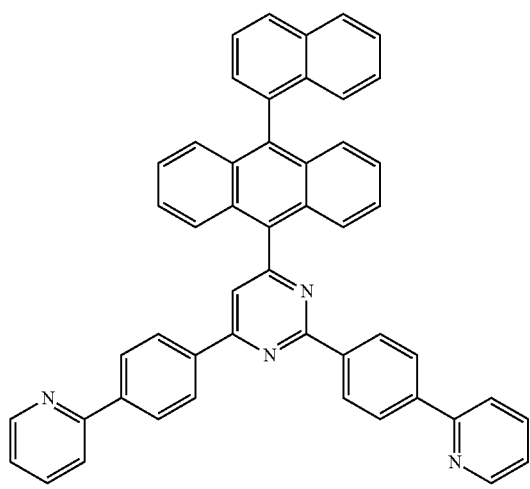
(7)
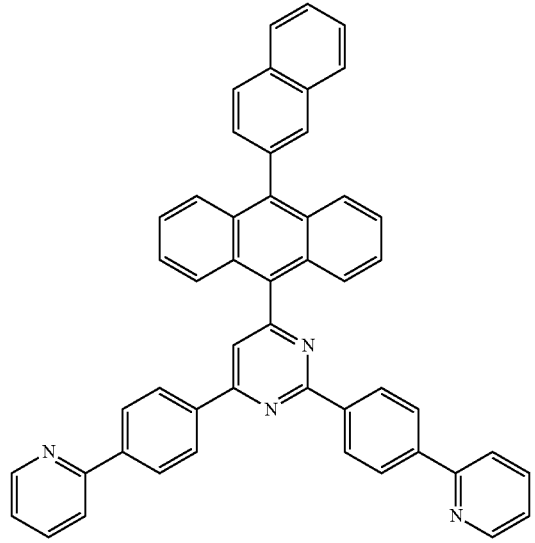
(8)
(9)
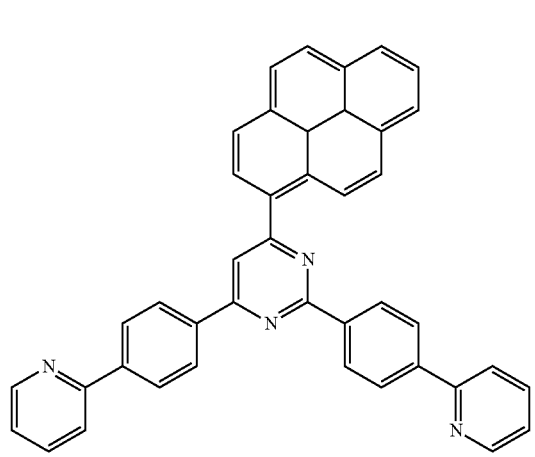

(10)
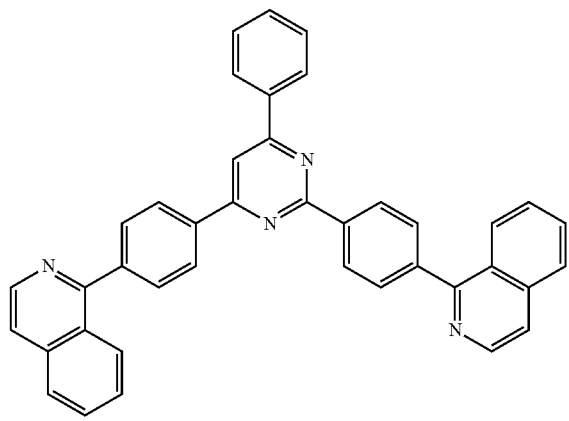
(11)
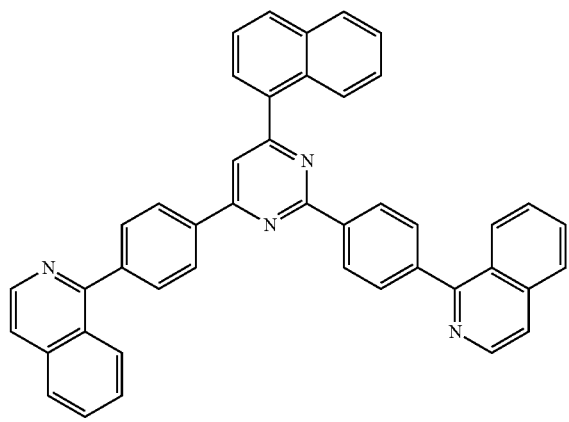
(12)
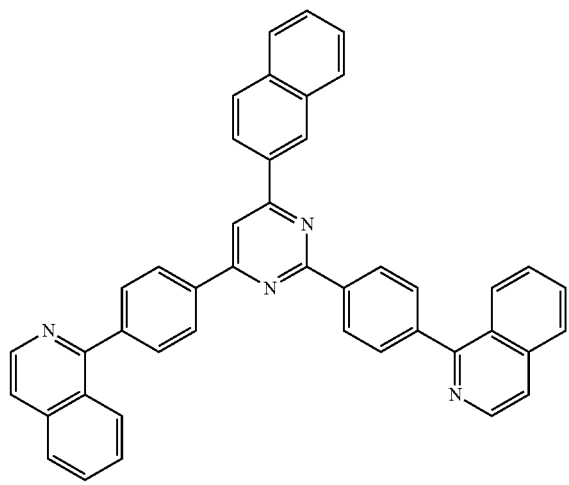
(13)
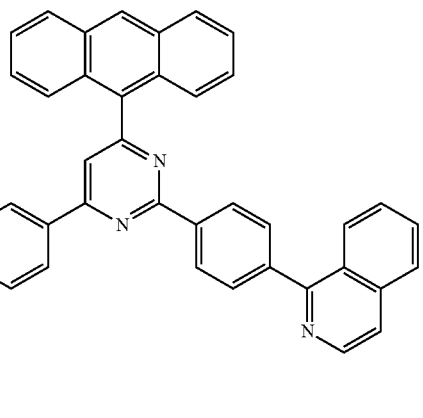
(14)
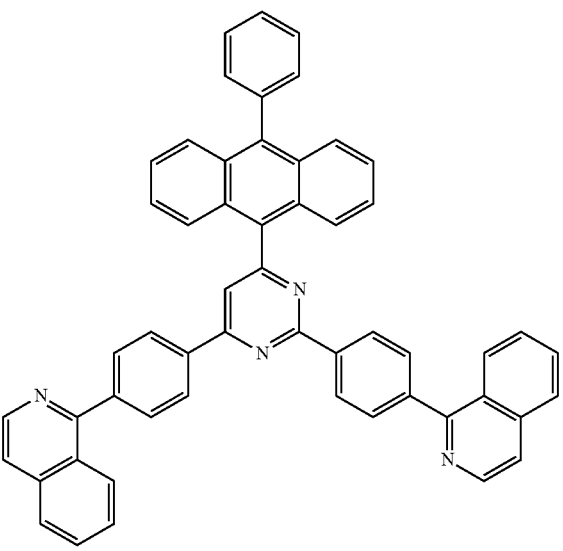
(15)
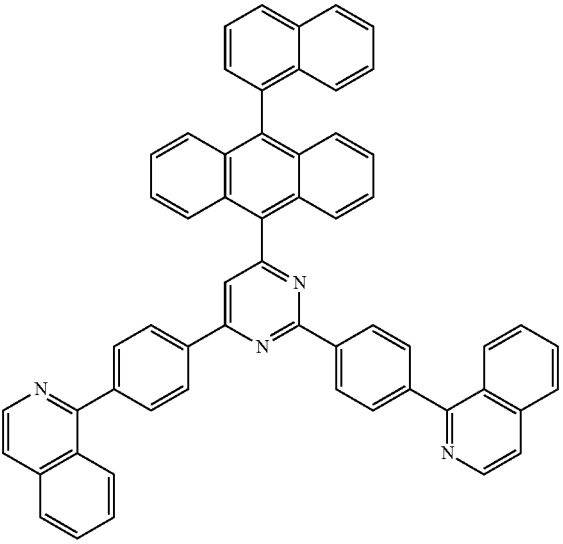

(16)
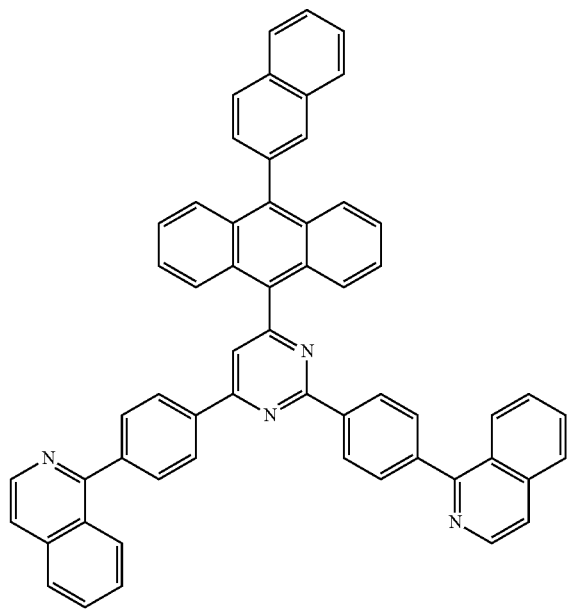
(17)
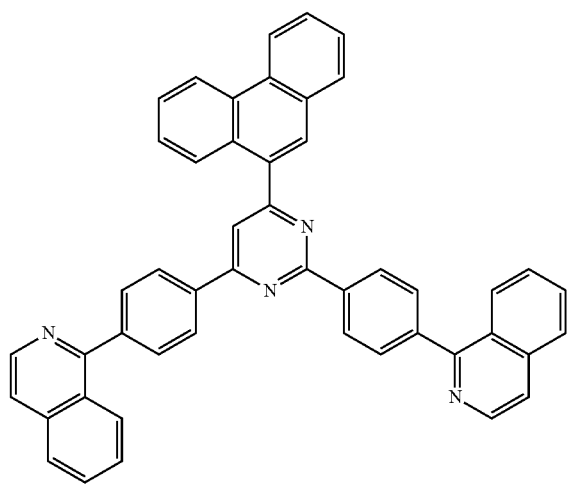
(18)
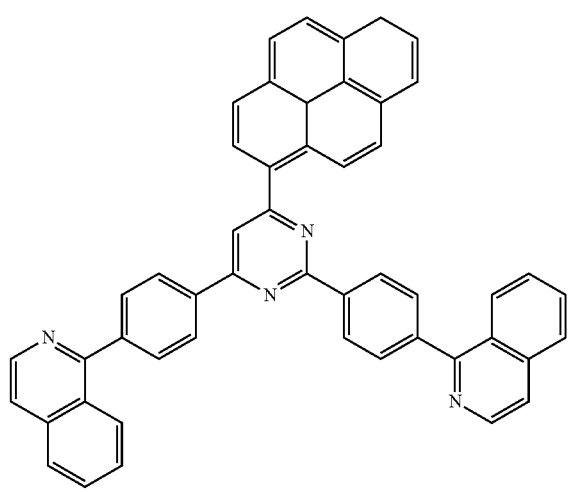
(19)
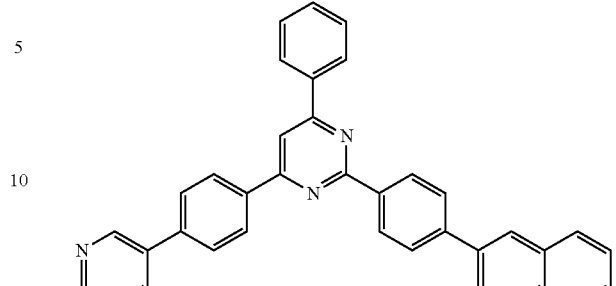
(20)
(21)
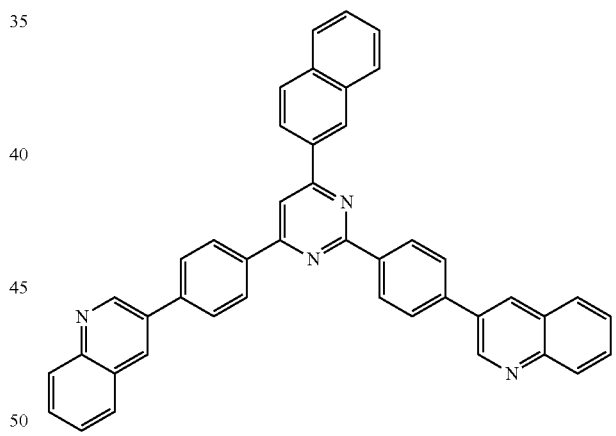
(22)
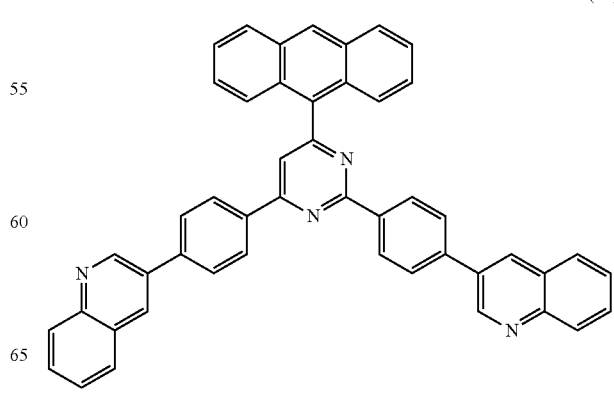

-continued
(23)
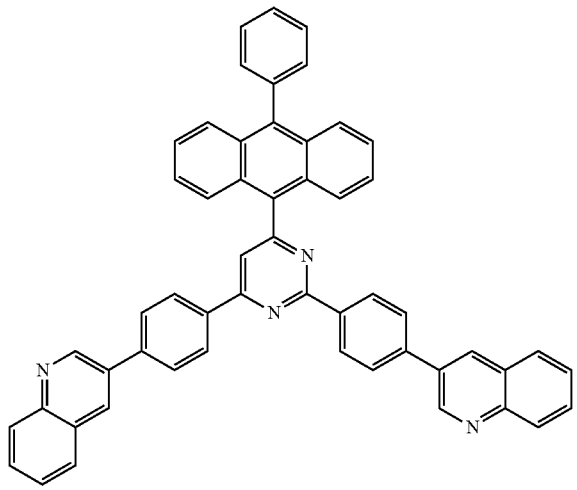
(24)
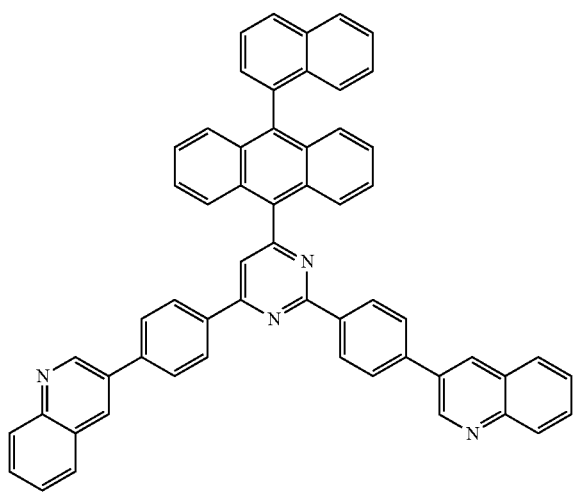
(25)
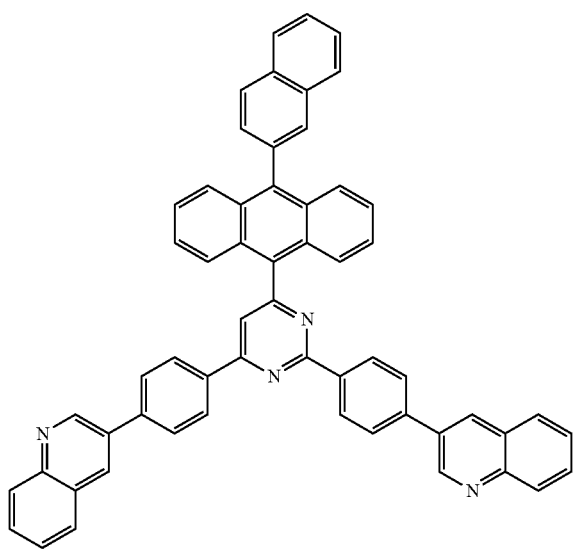
-continued
(26)
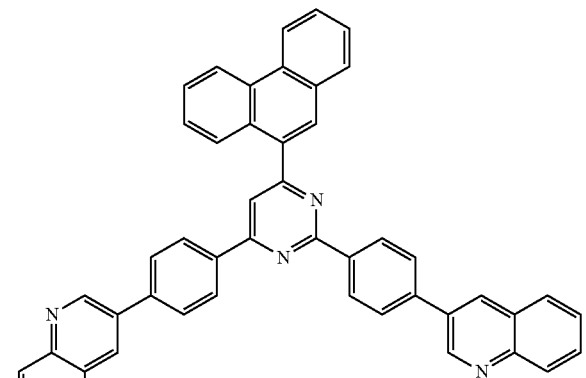
(27)
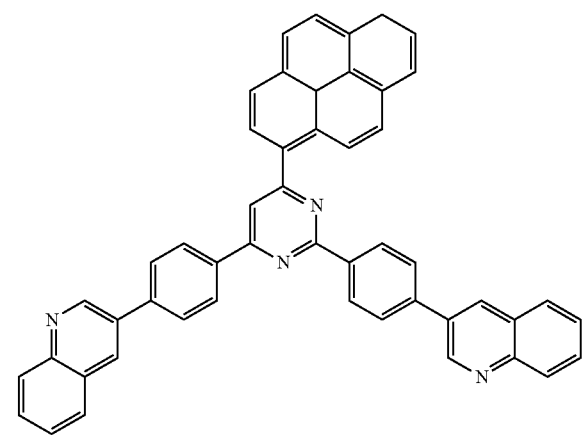
(28)
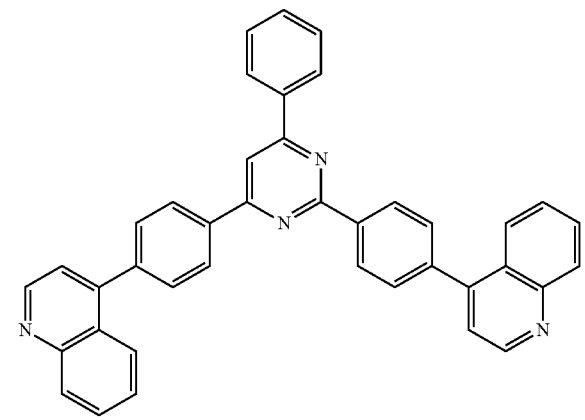

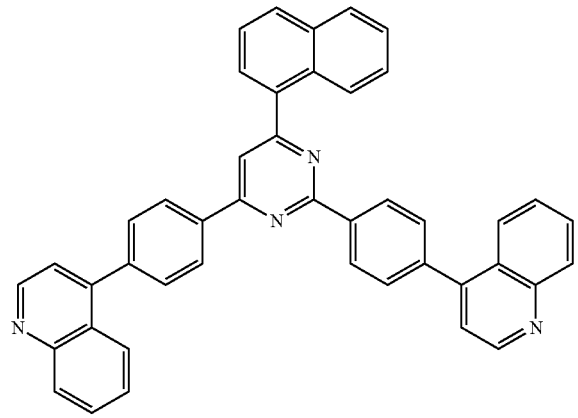
(29)
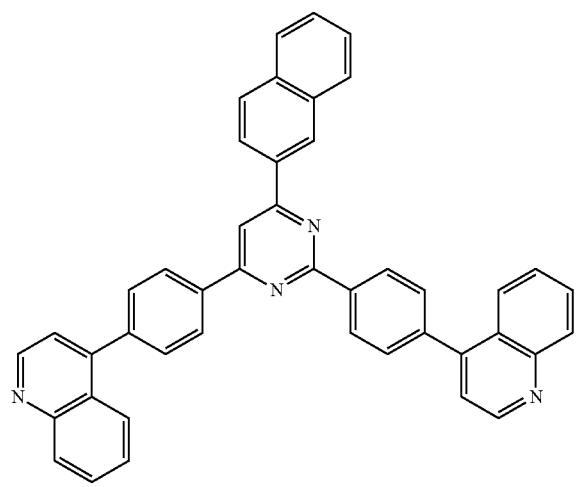
(30)
(31)
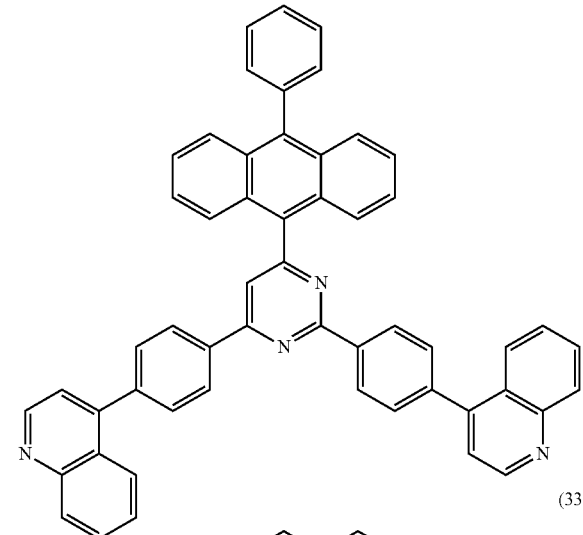
(32)
(33)
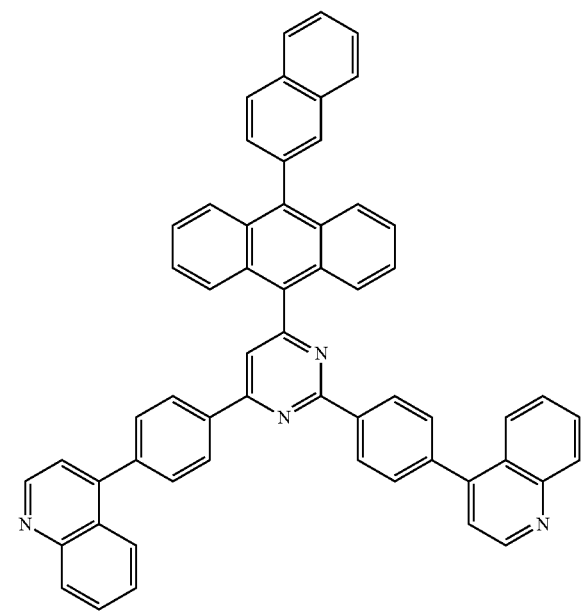
(34)

(35)
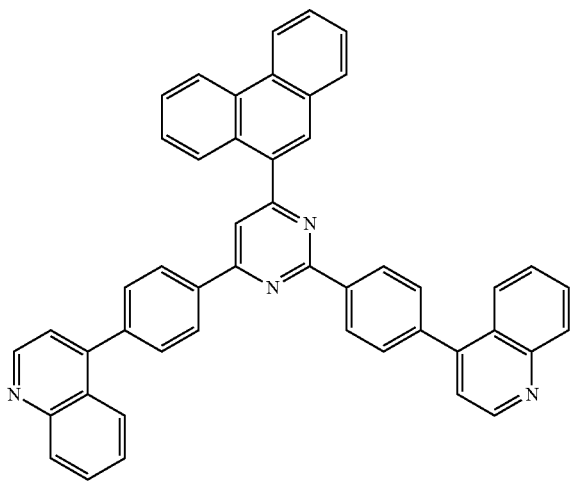
(38)
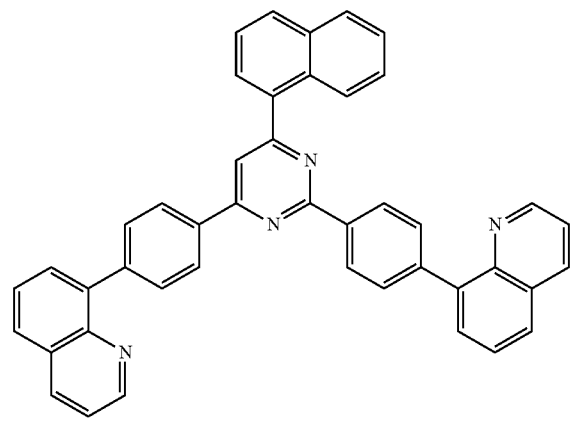
(36)
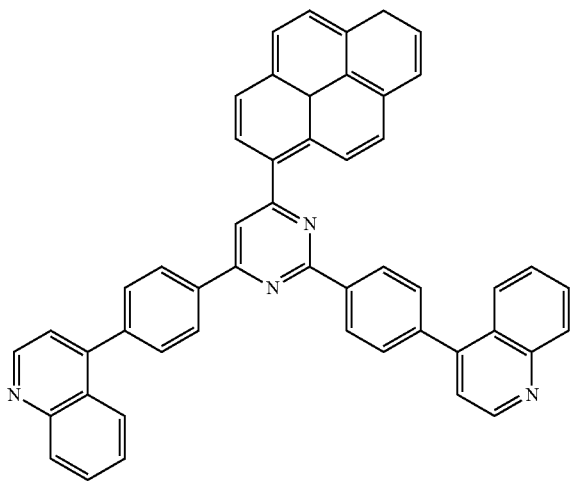
(39)
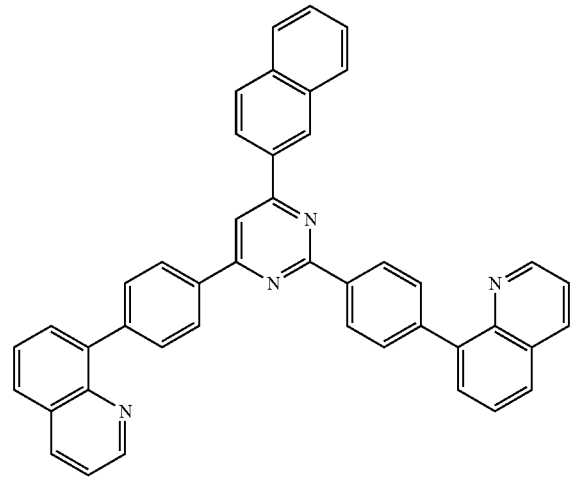
(37)
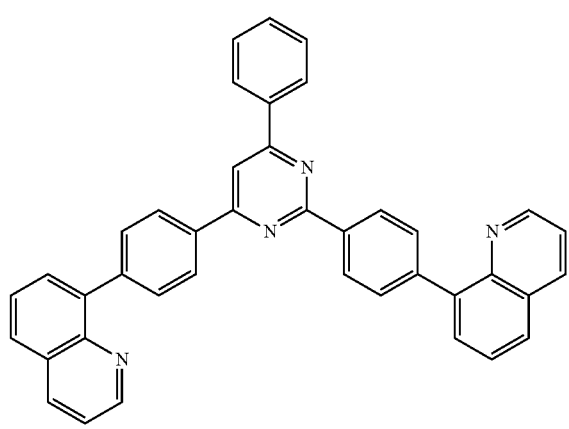
(40)
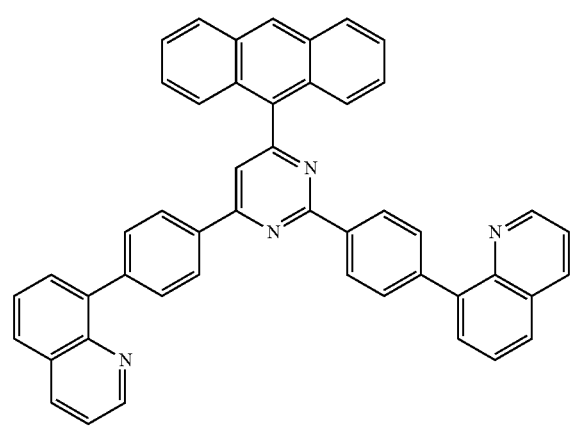

(41)
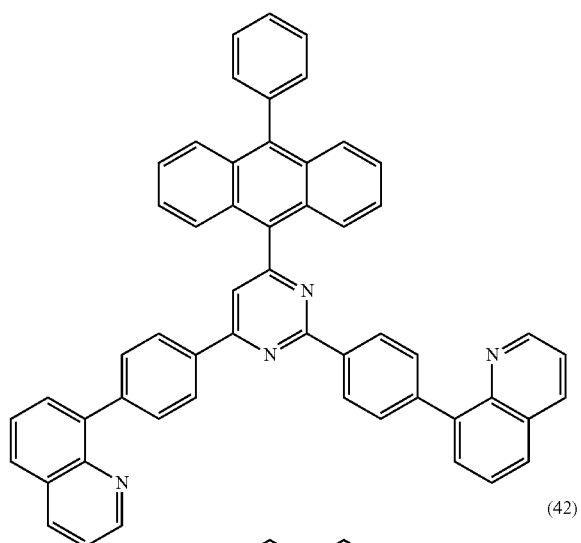
(42)
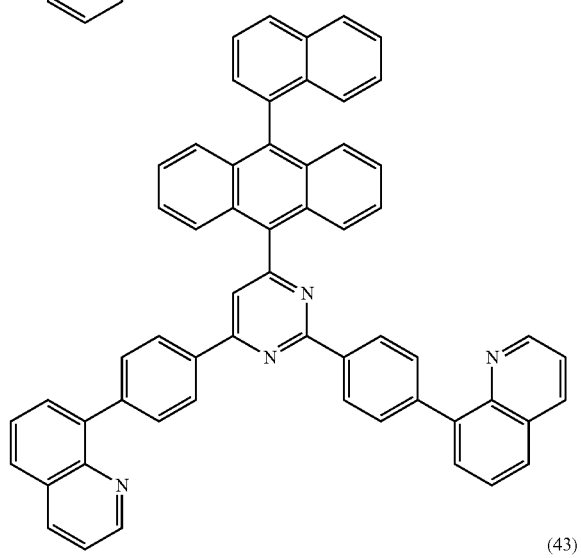
(43)
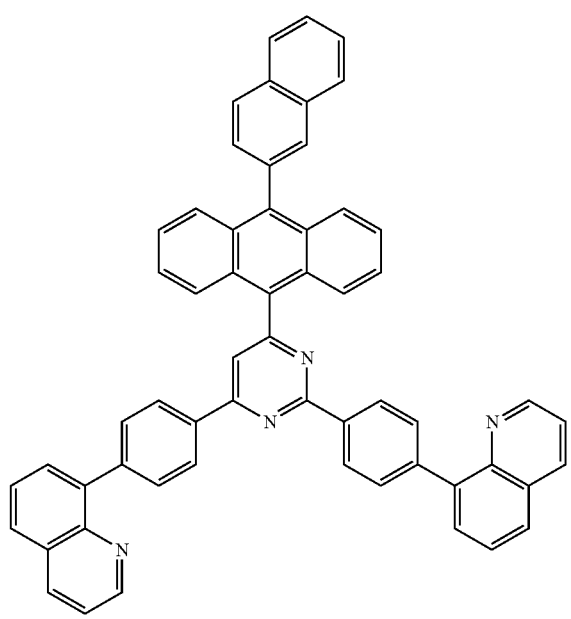
(44)
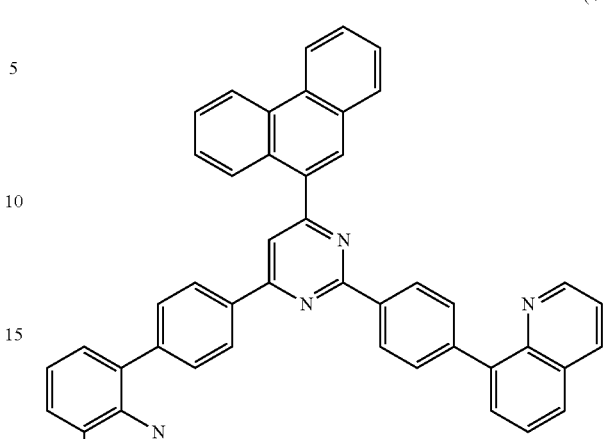
(45)
(46)
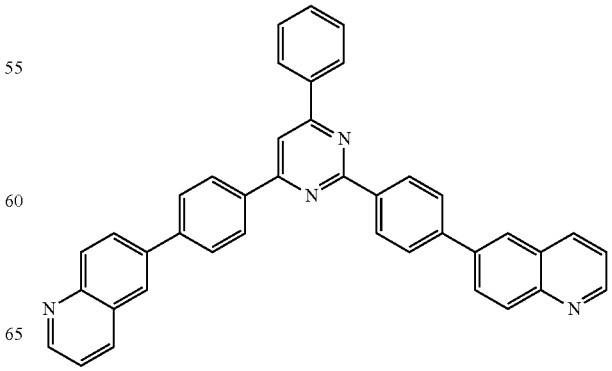

-continued
(47)
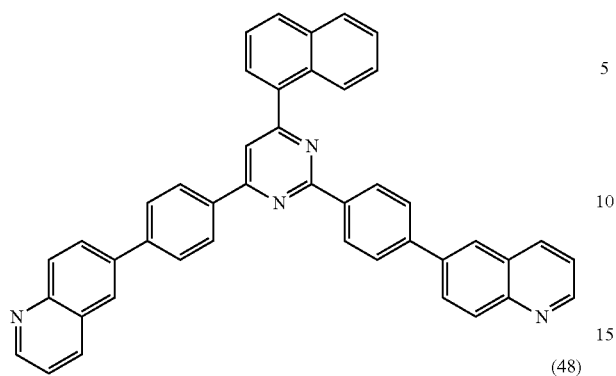
(48)
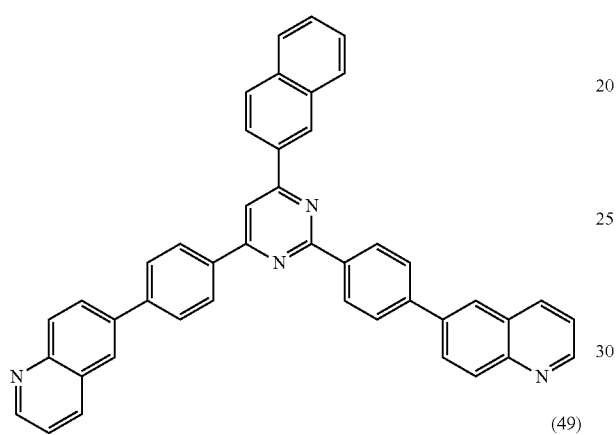
(49)
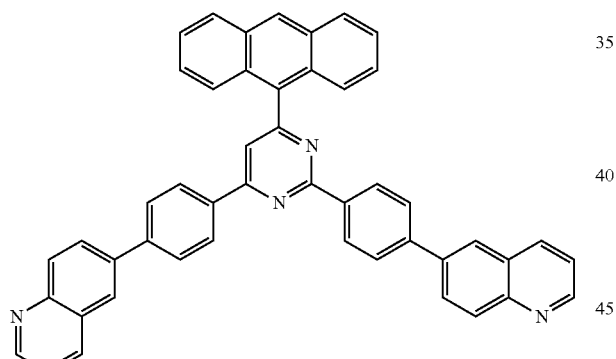
(50)
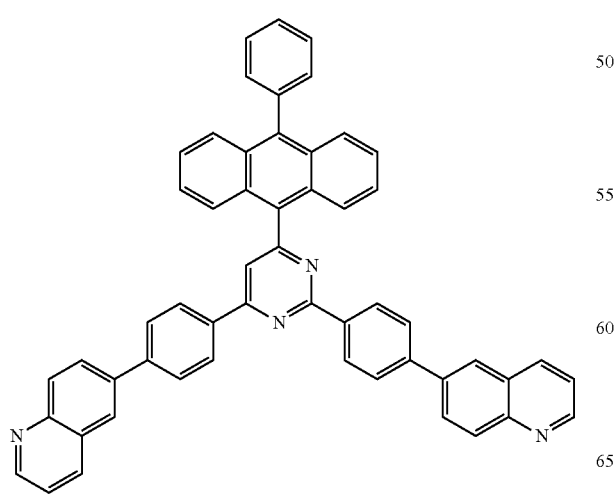
-continued
(51)
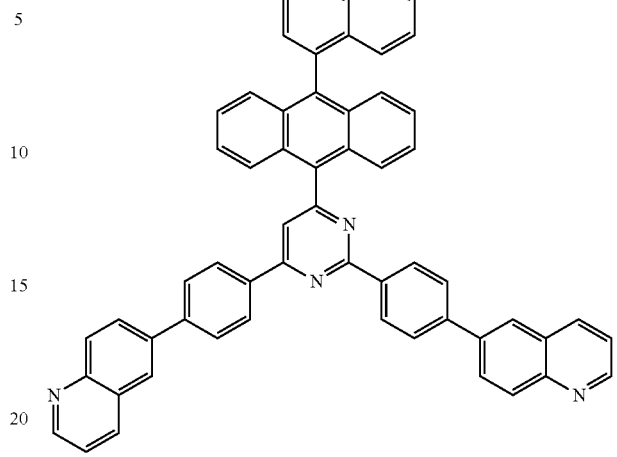
(52)
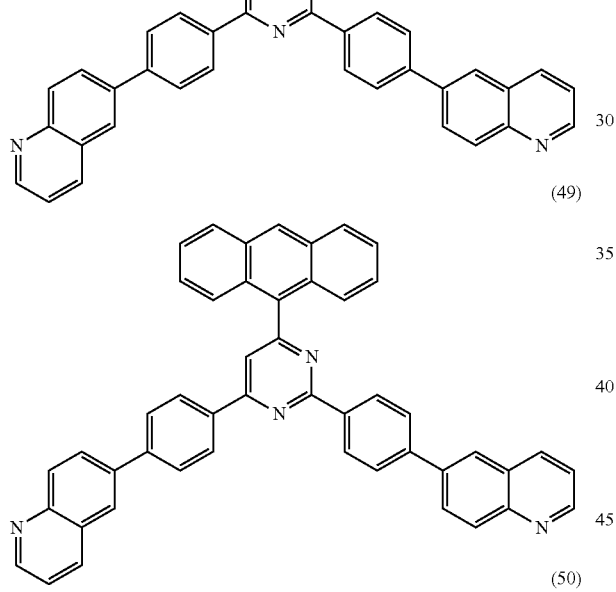
(53)
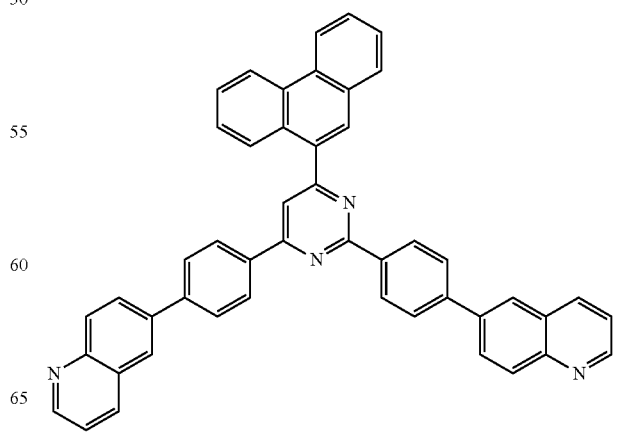

(54)
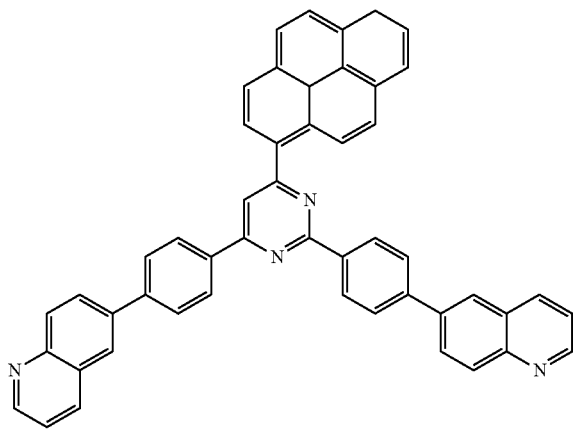
(55)
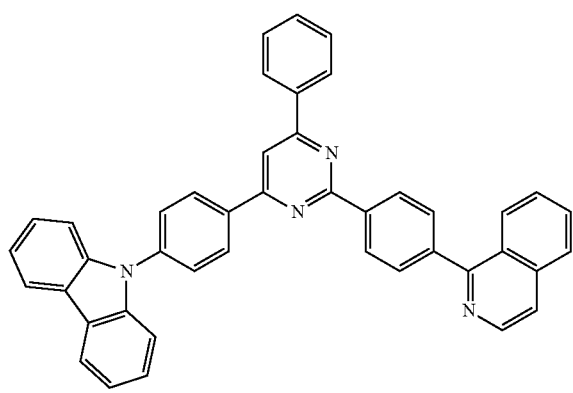
(56)
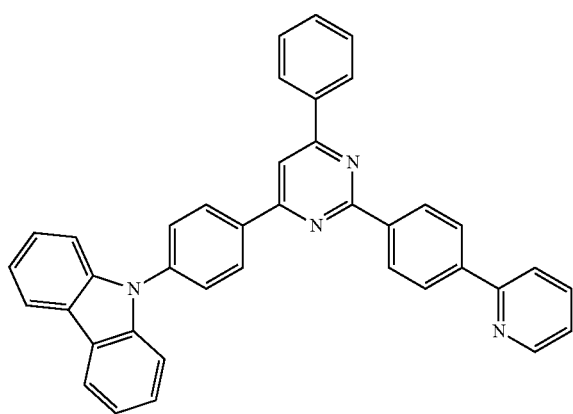
(57)
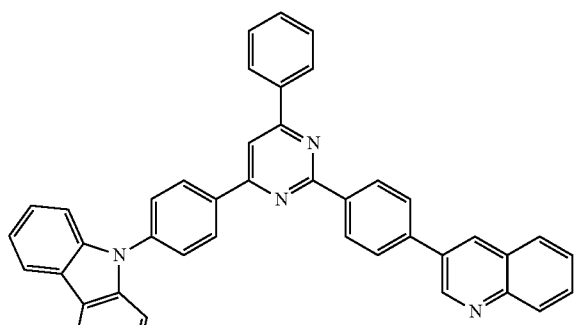
(58)
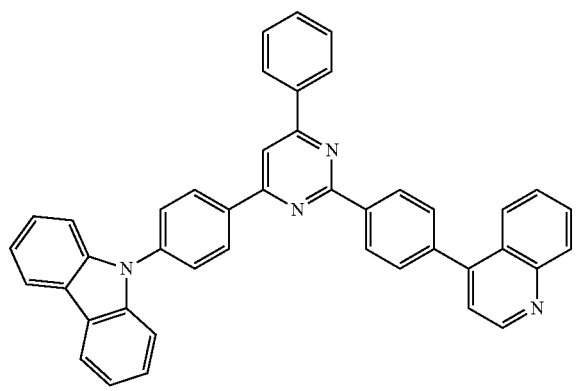
(59)
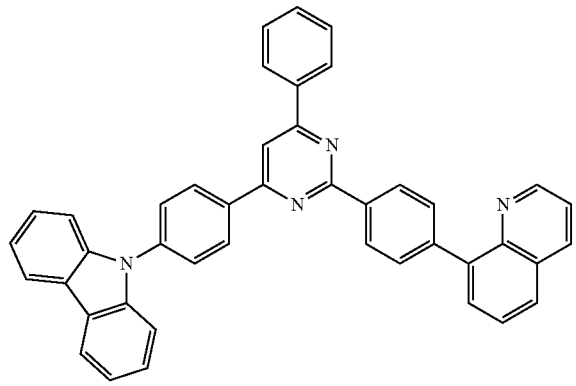
(60)
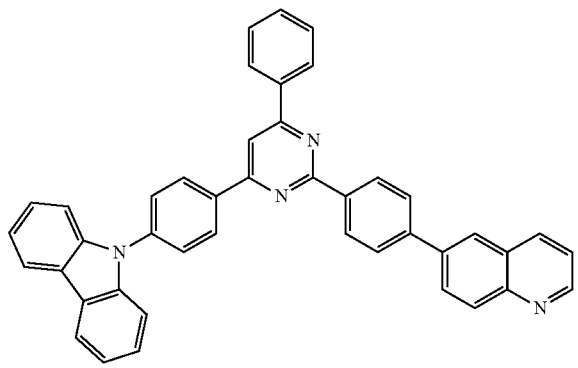

123
-continued
(61)
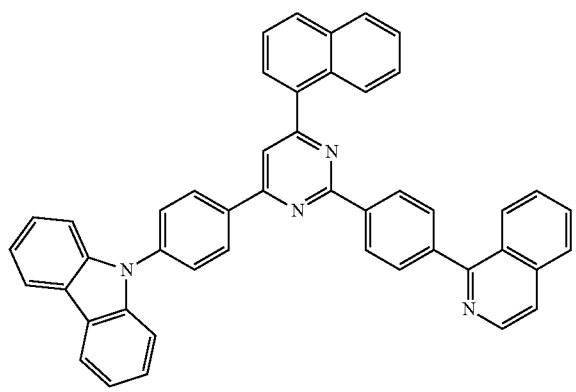
(62)
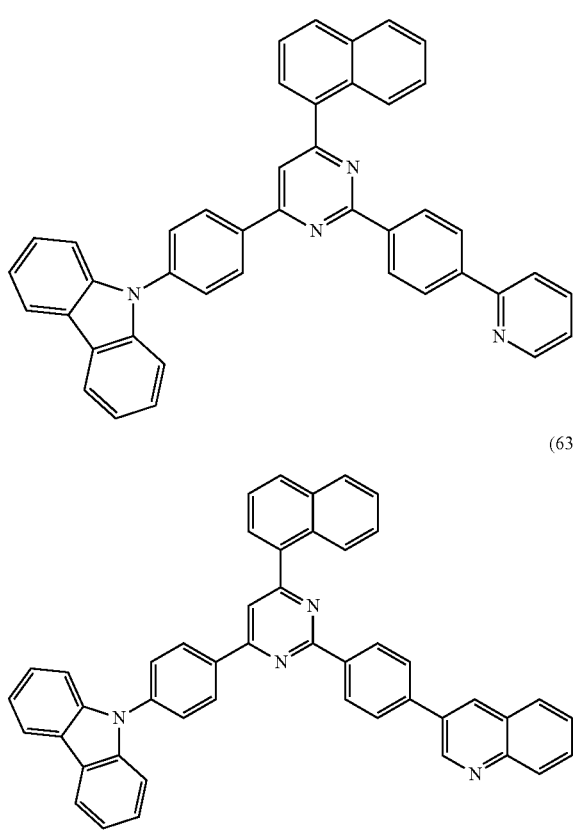
(63)
(64)
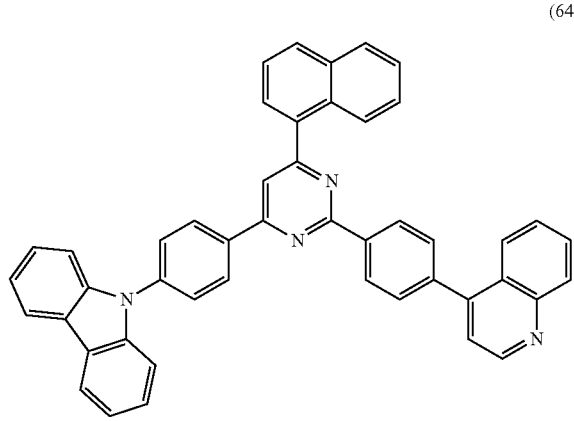
124
-continued
(65)
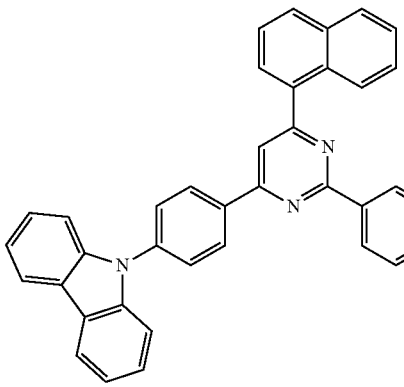
(66)
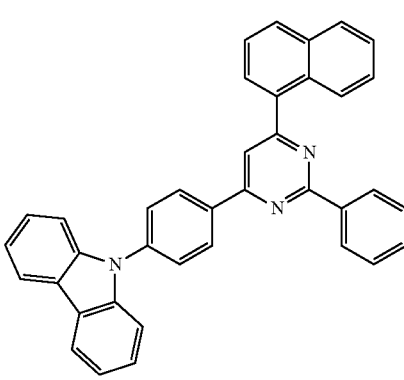
(67)
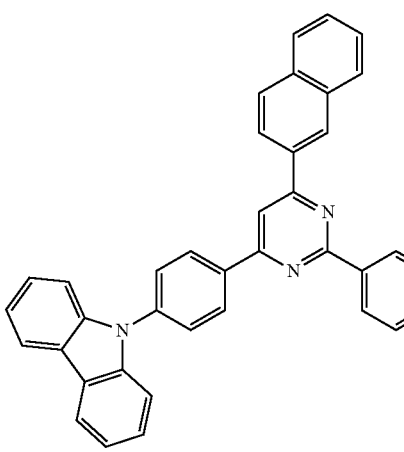

(68)
(69)
(70)
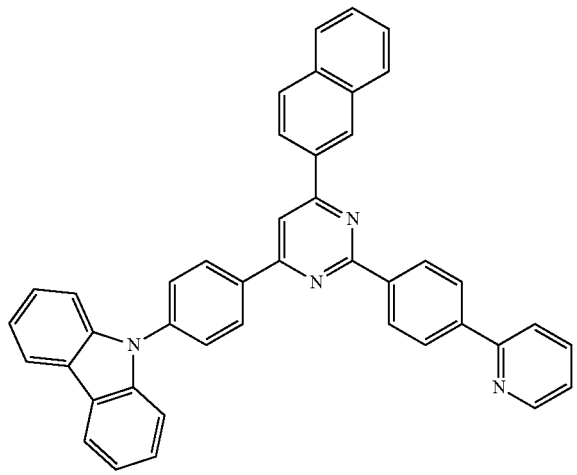
(71)
(72)
(73)
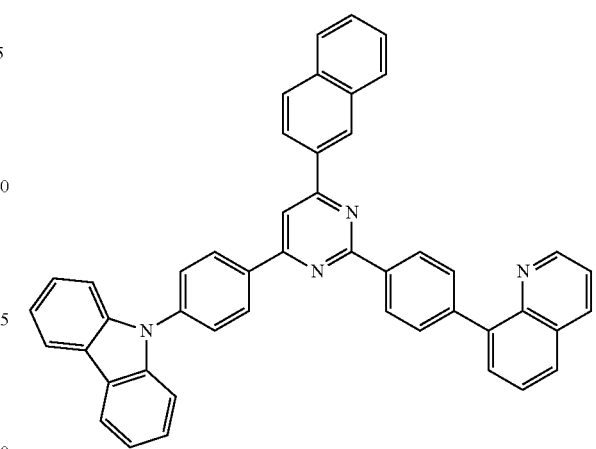
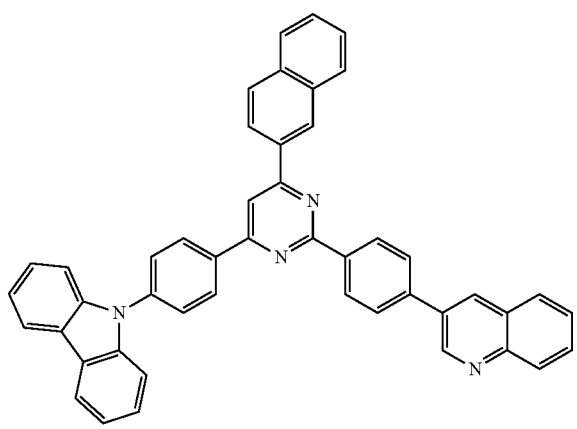
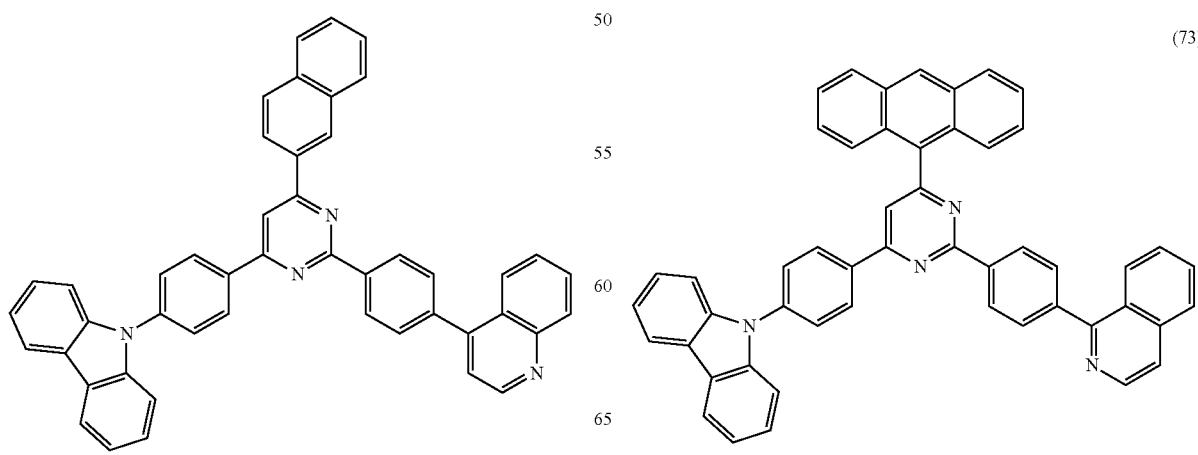

-continued
(74)
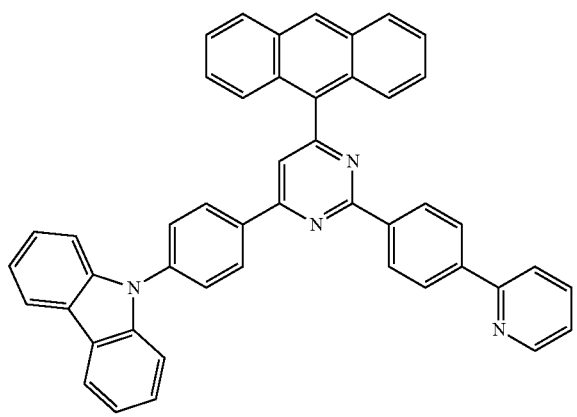
(75)
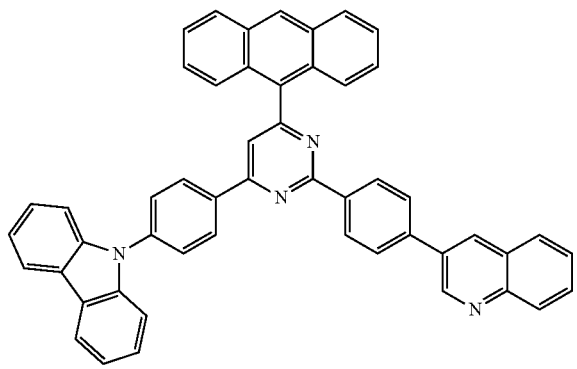
(76)
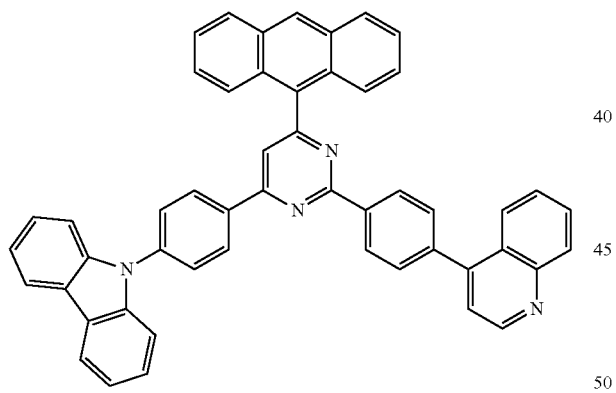
(77)
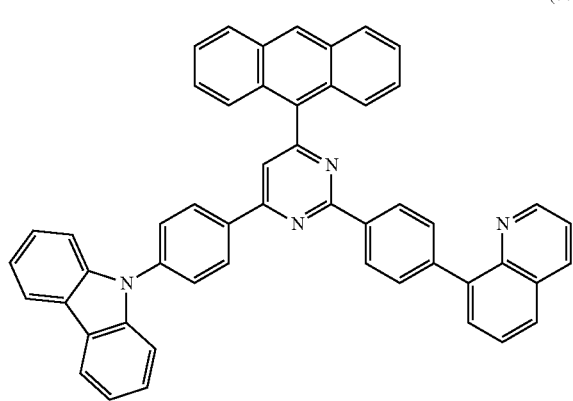
-continued
(78)
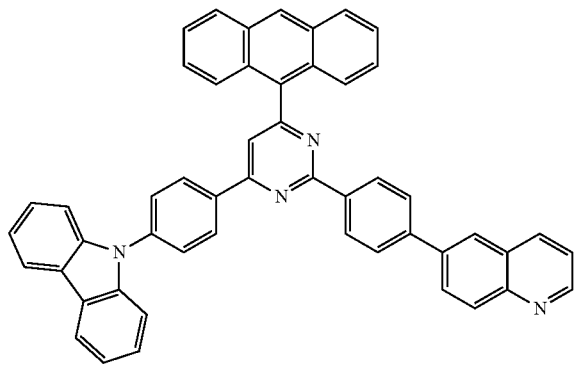
(79)
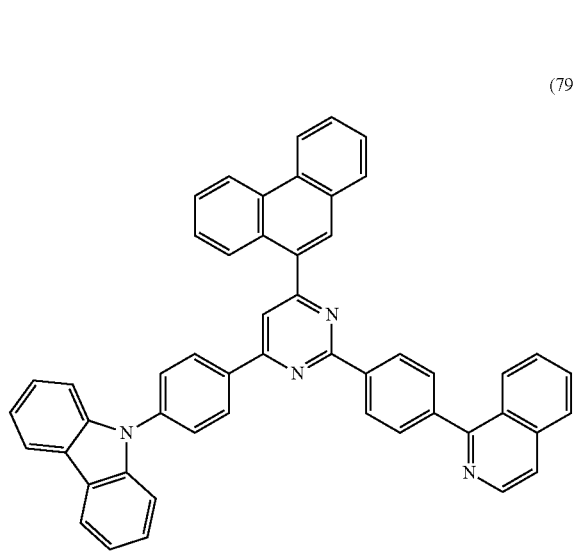
(80)

(81)
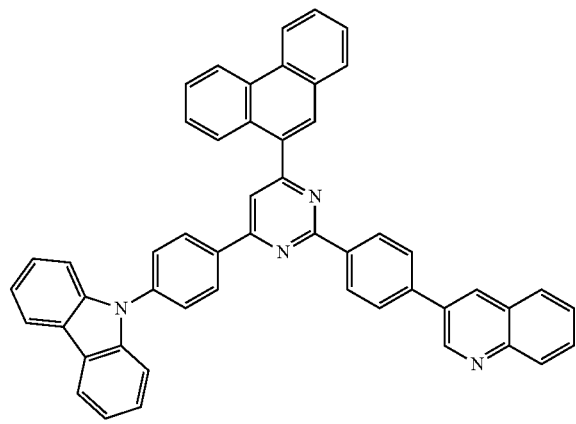
(82)
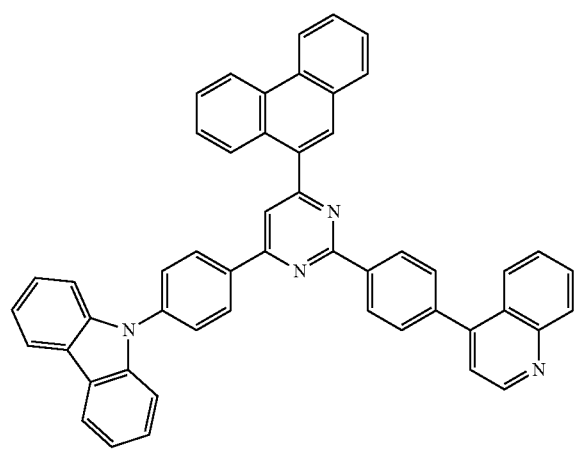
(83)
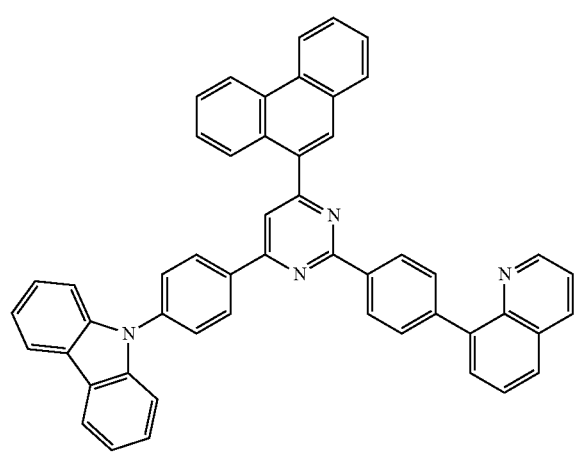
(84)
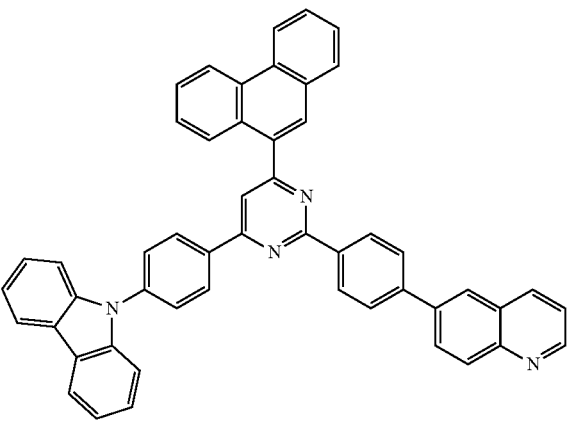
(85)
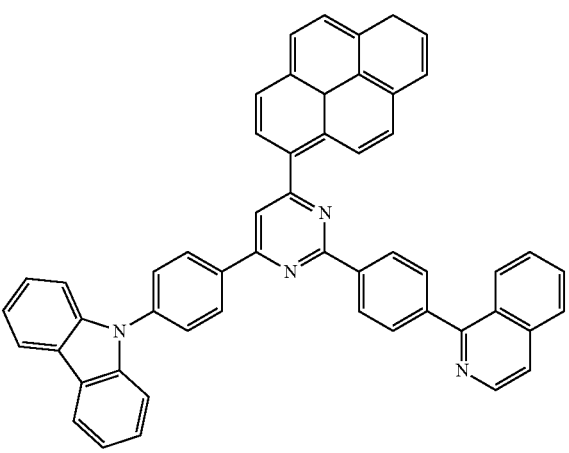
(86)
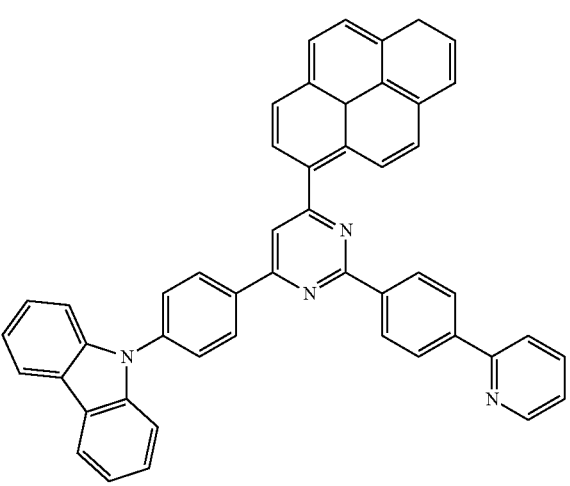

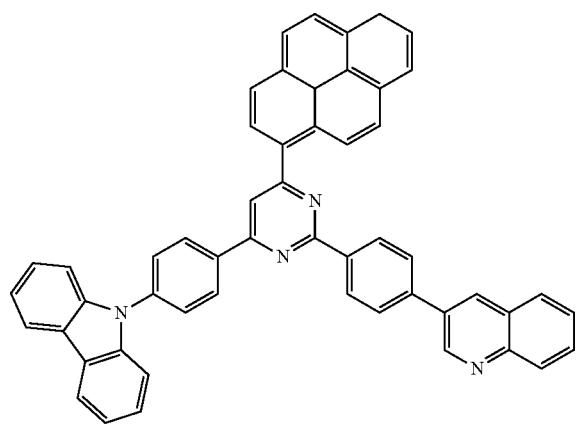
(87)
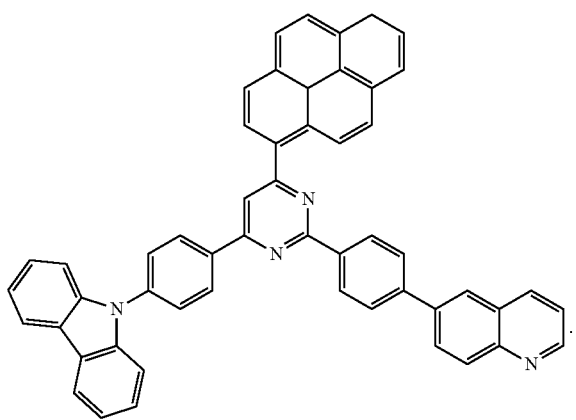
(90)
2. The material as claimed in claim 1, wherein the material includes at least one of the following compounds (1) to (15):
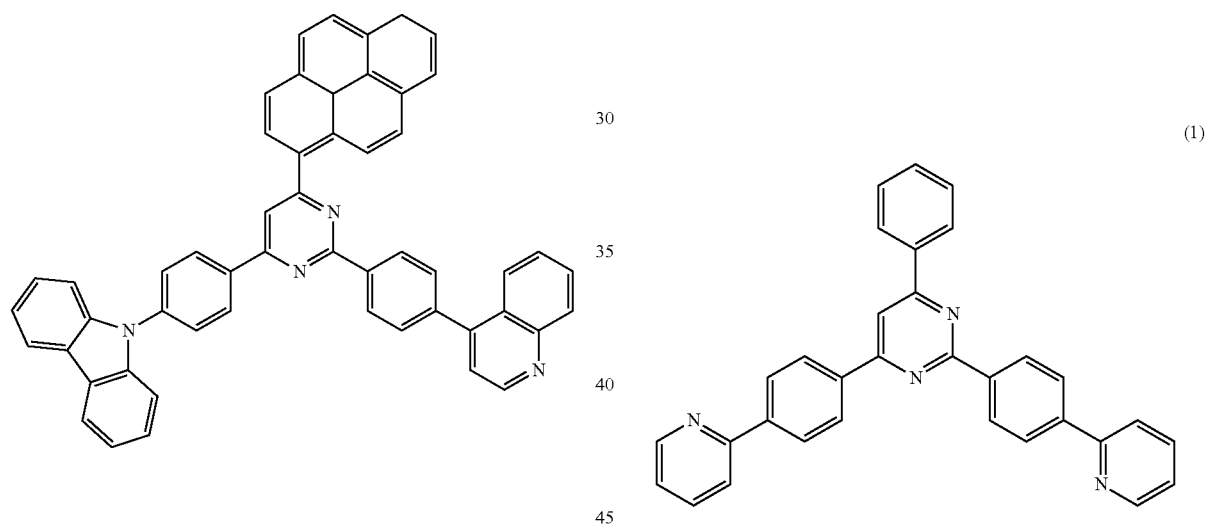
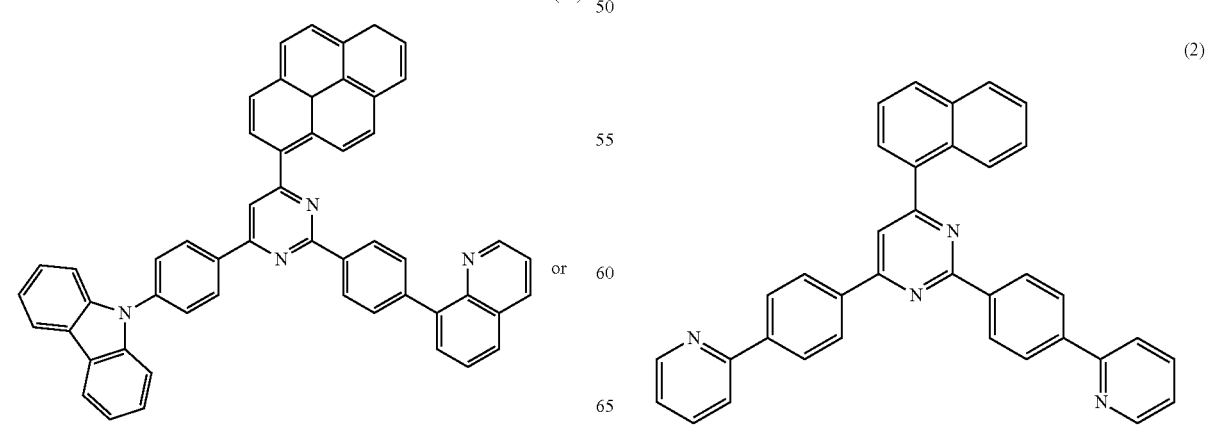

-continued
(3)
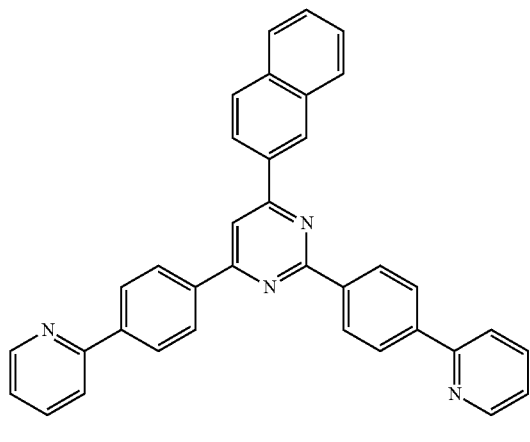
(4)
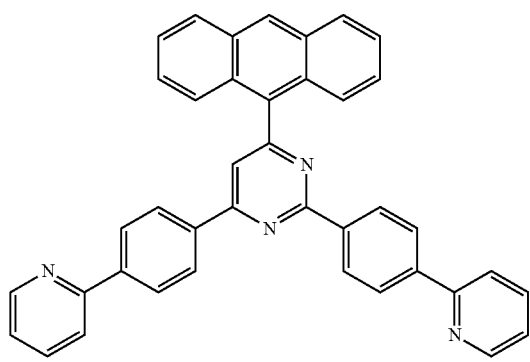
(5)
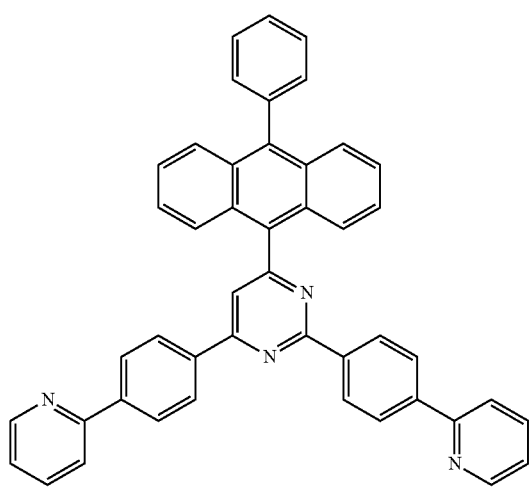
-continued
(6)
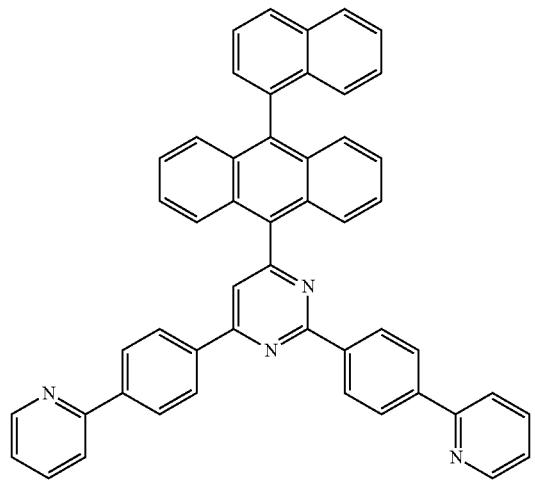
(7)
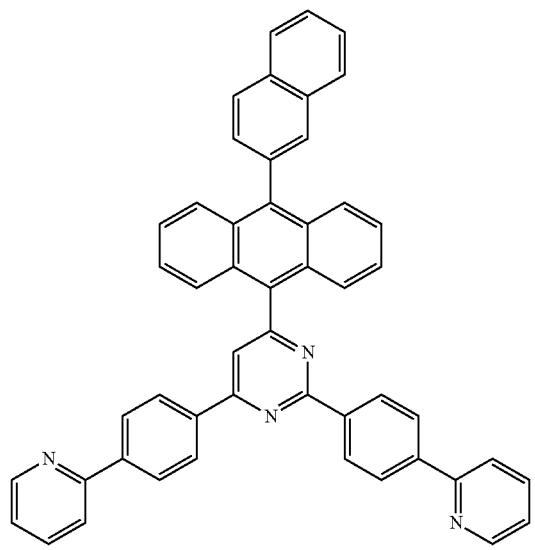
(8)
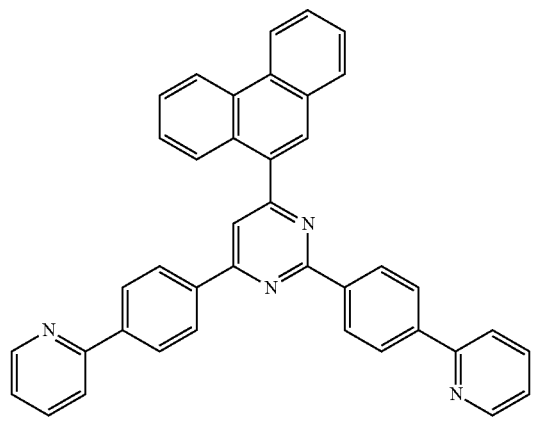

(9)
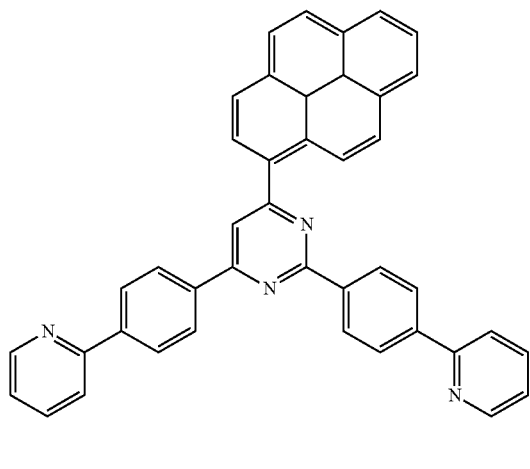
(10)
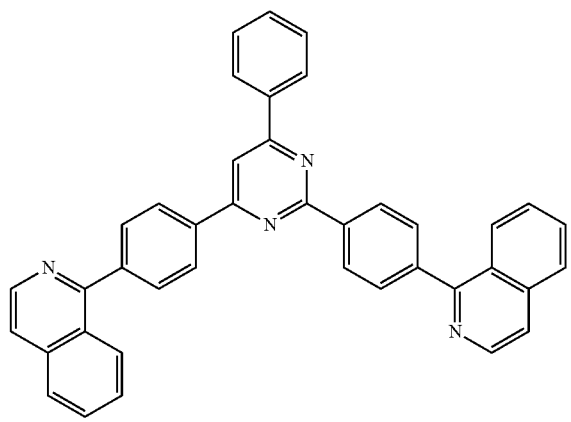
(11)
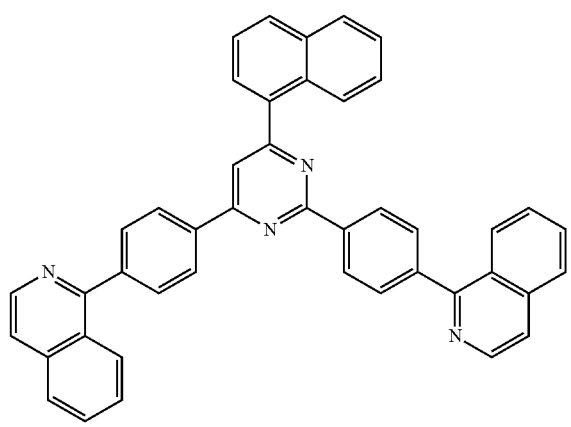
(12)
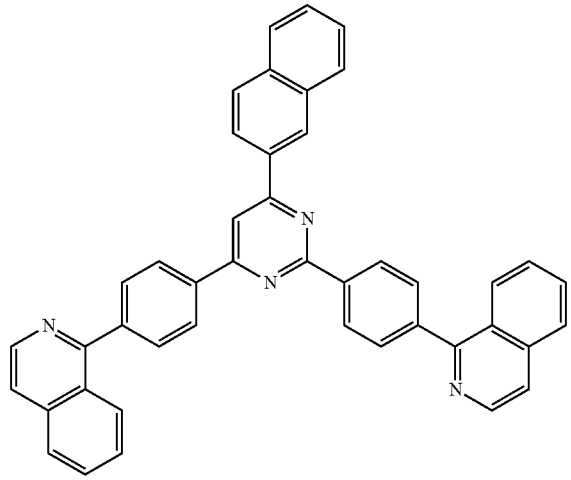
(13)
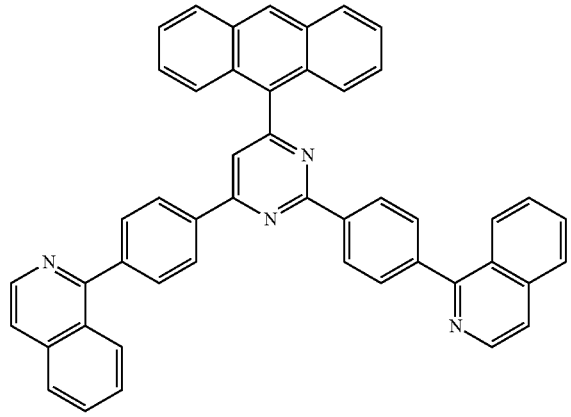
(14)
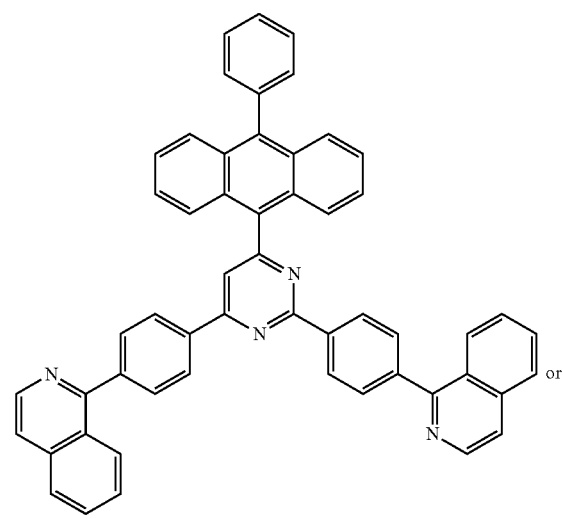
or

(15)
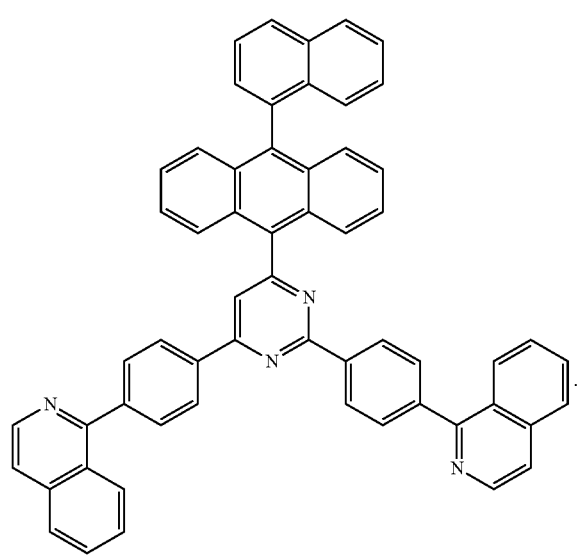
(17)
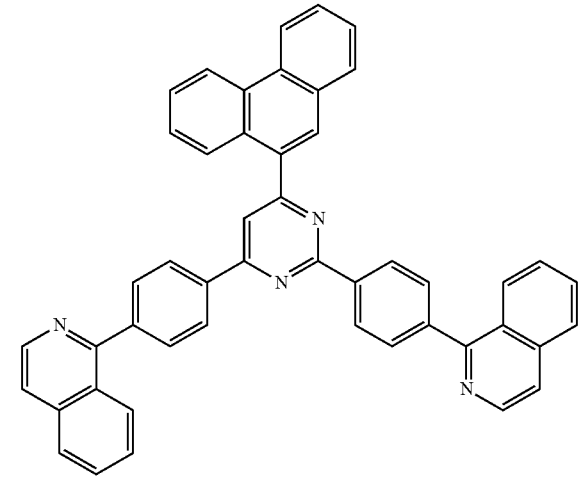
3. The material as claimed in claim 1, wherein the material includes at least one of the following compounds (16) to (30):
(18)
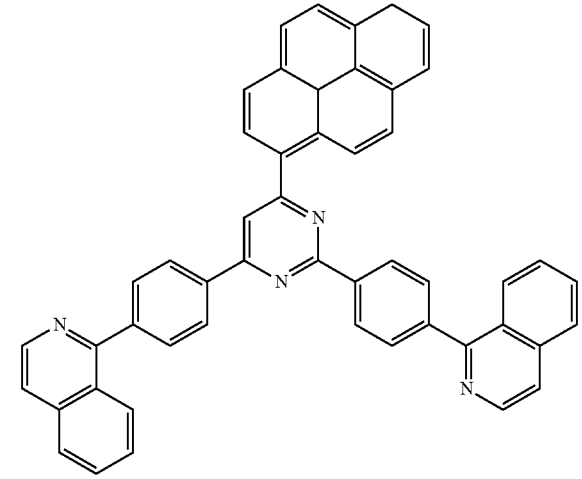
(16)
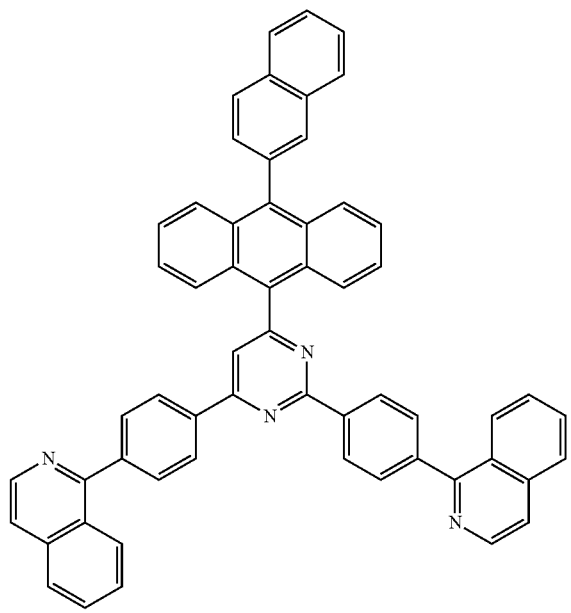
(19)

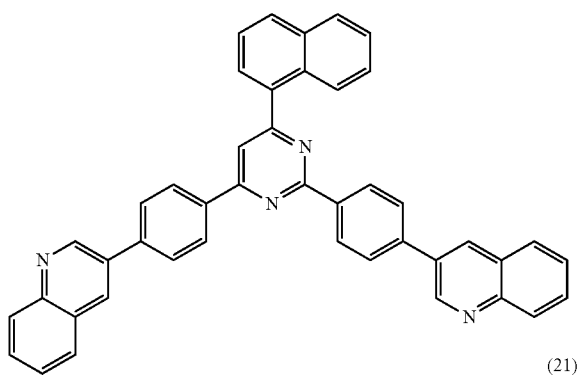
(20)
(21)
(22)
(23)
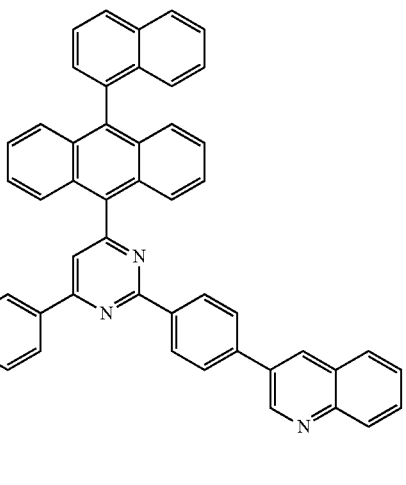
(24)
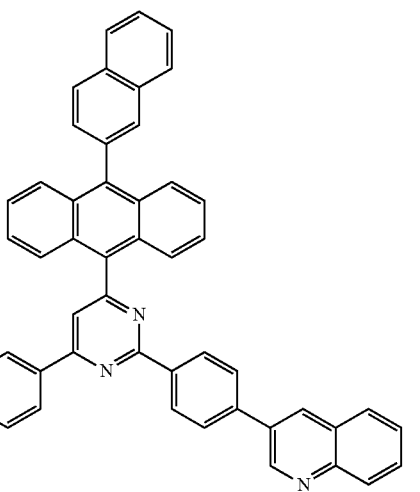
(25)
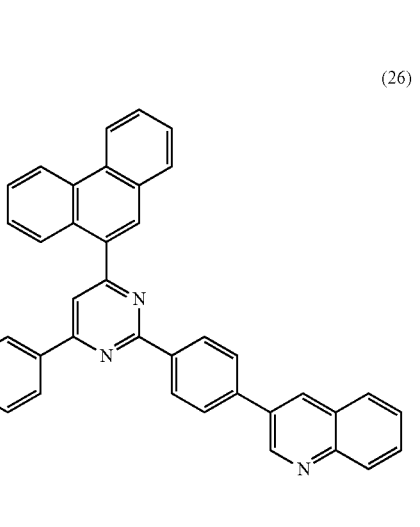
(26)

(27)
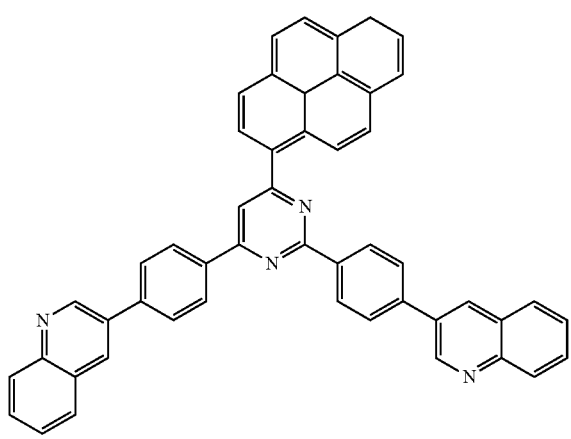
(30)
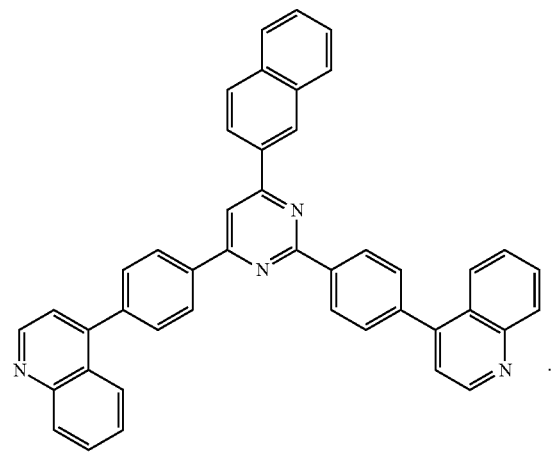
4. The material as claimed in claim 1, wherein the material includes at least one of the following compounds (31) to (45):
(28)
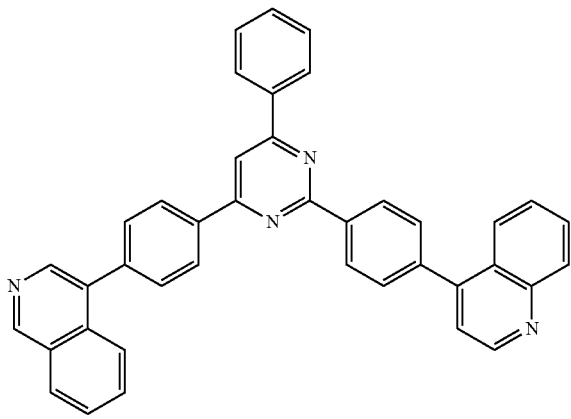
(31)
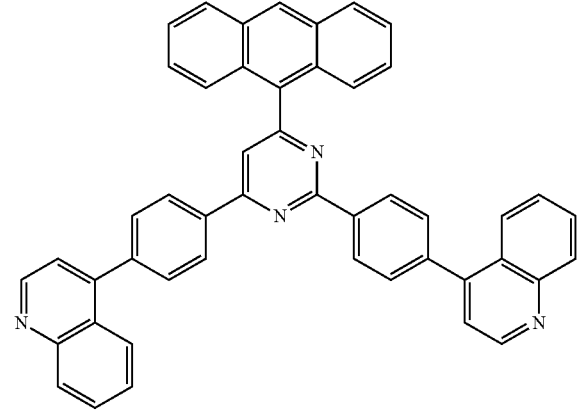
(29)
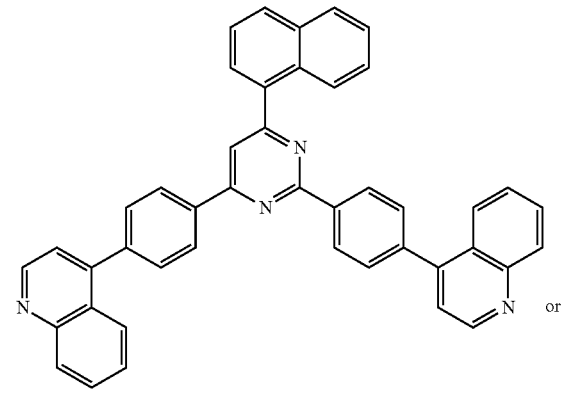
or
(32)
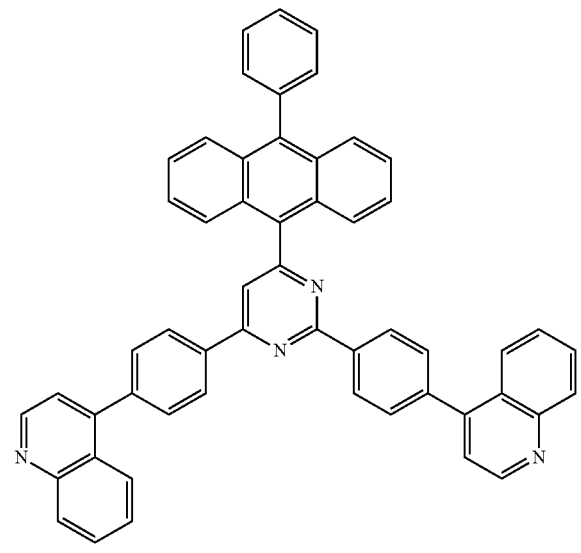

(33)
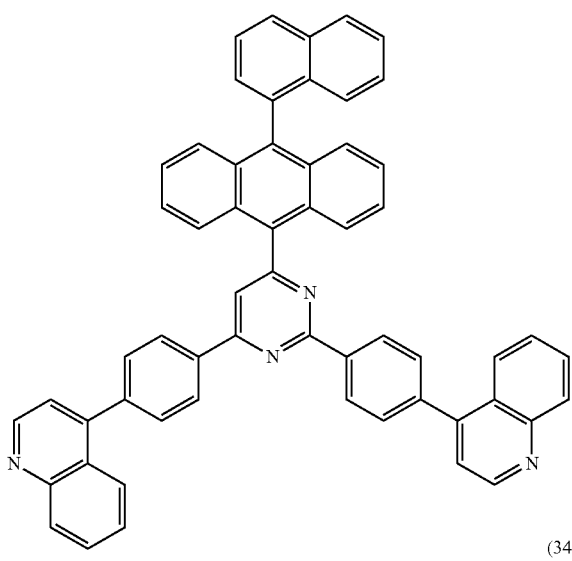
(34)
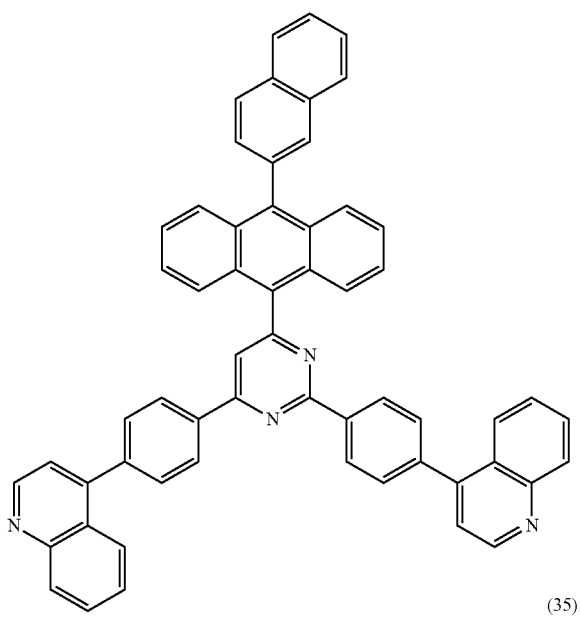
(35)
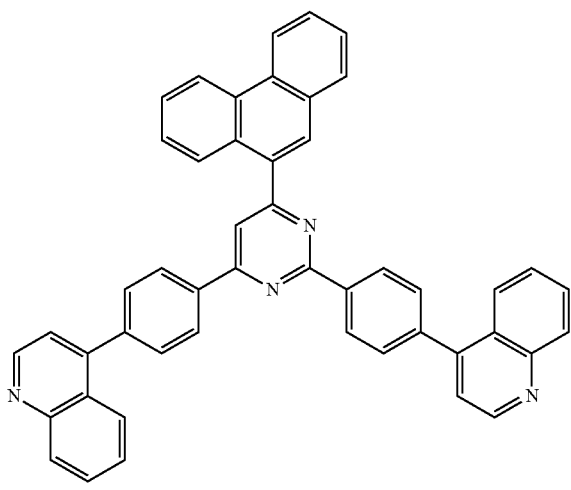
(36)
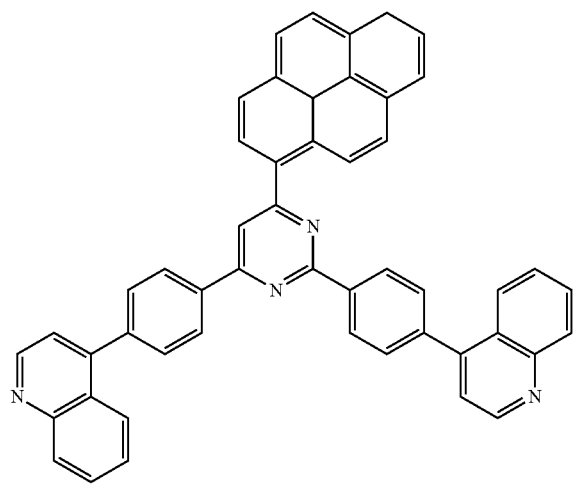
(37)
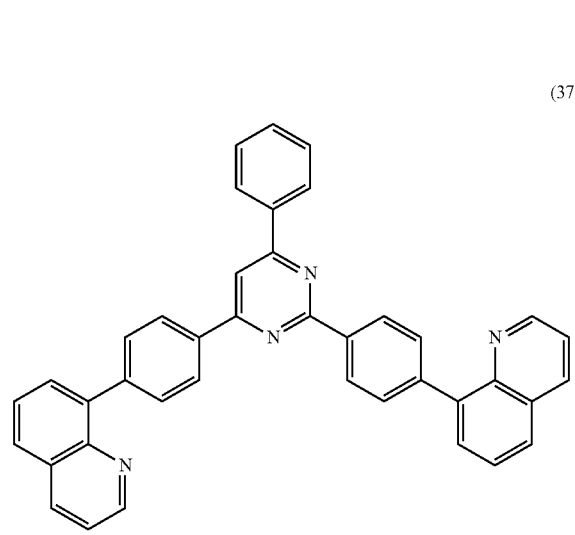
(38)
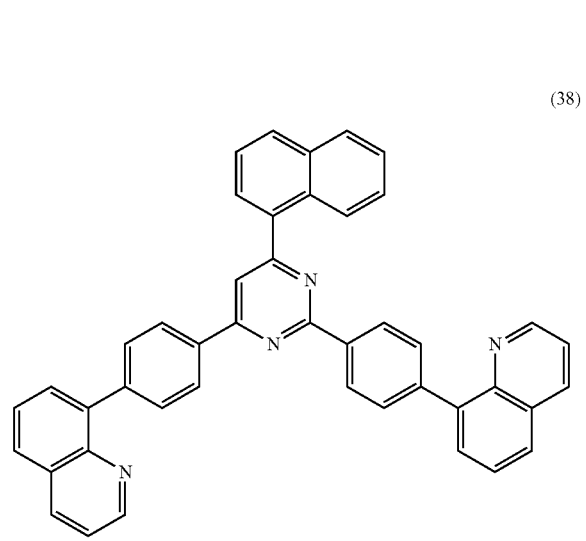

(39)
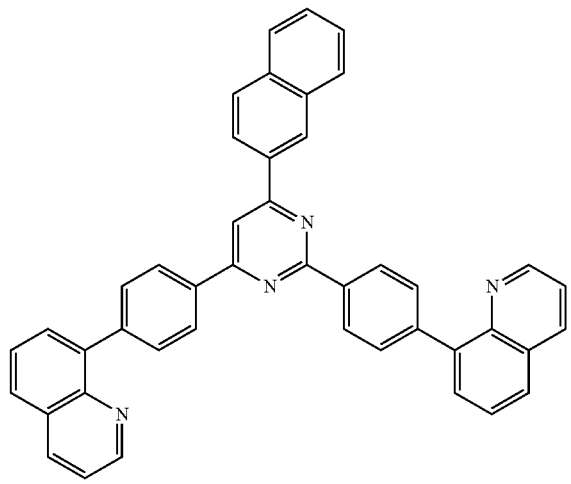
(40)
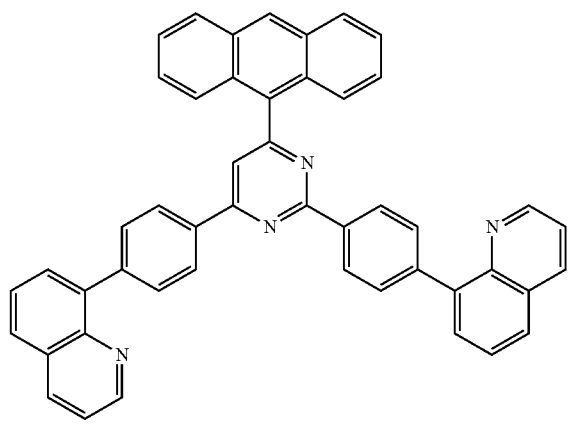
(41)
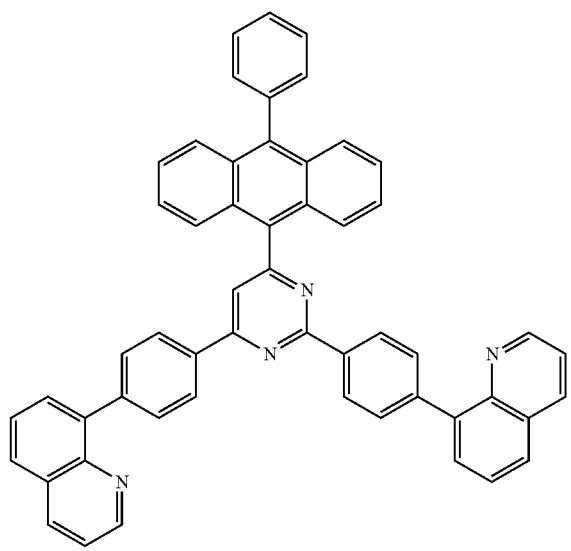
(42)
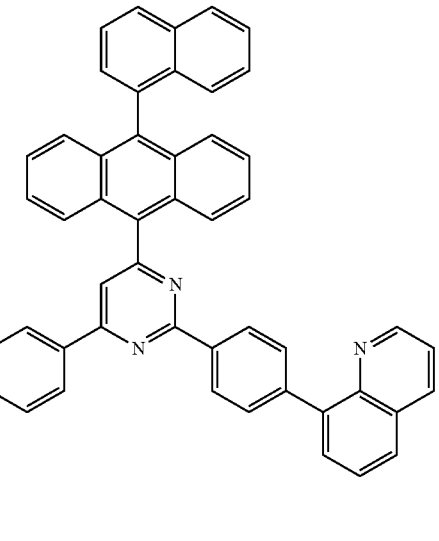
(43)
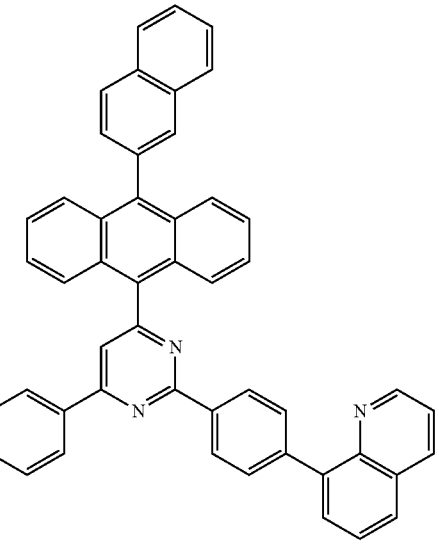
(44)
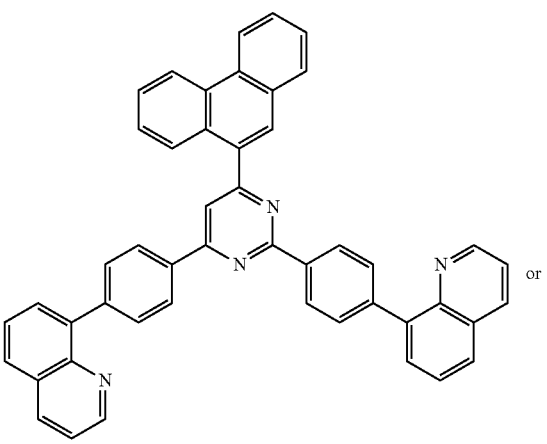
or

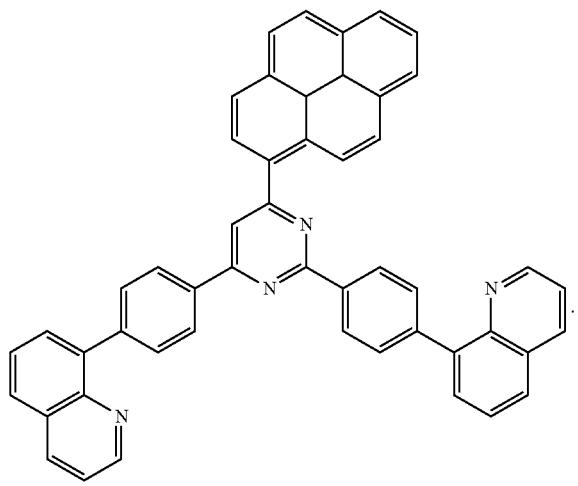
(45)
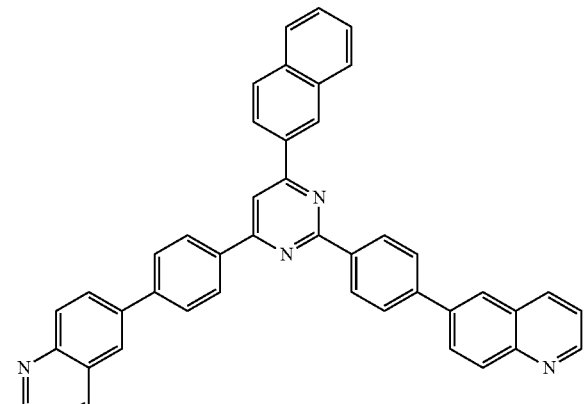
(48)
5. The material as claimed in claim 1, wherein the material includes at least one of the following compounds (46) to (60):
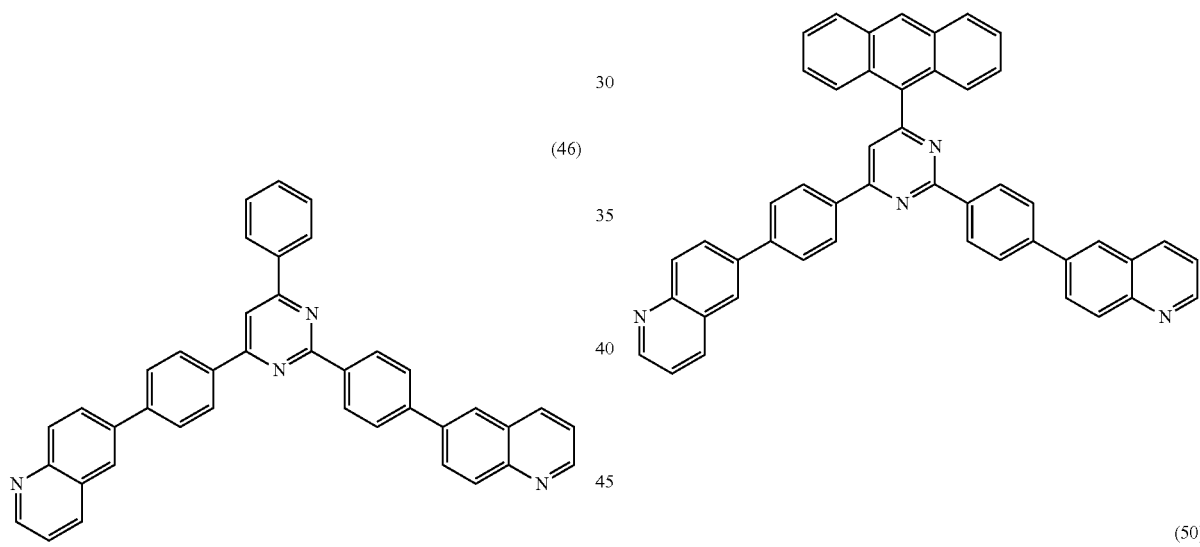
(46)
(47)
(49)
(50)
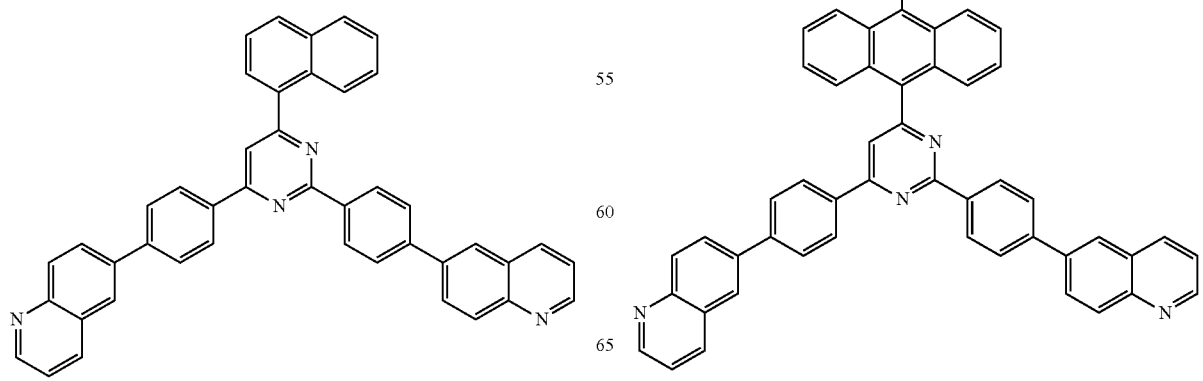

(51)
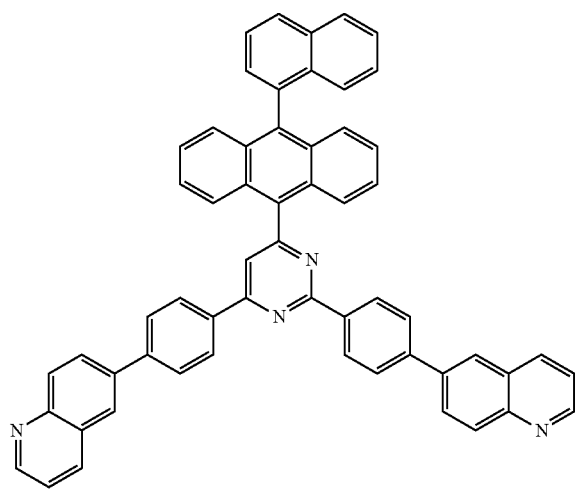
(52)
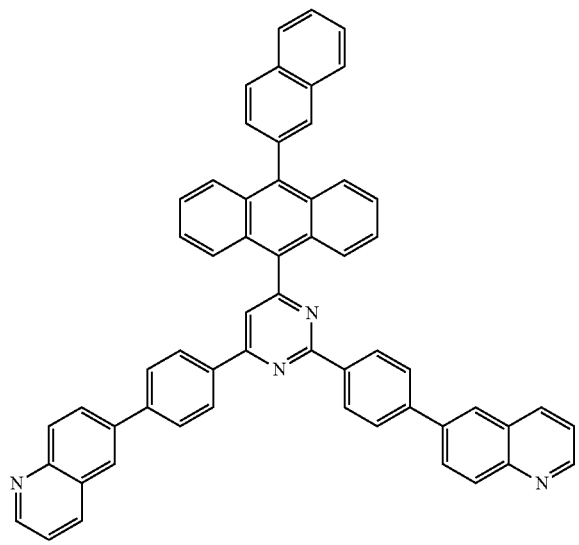
(53)
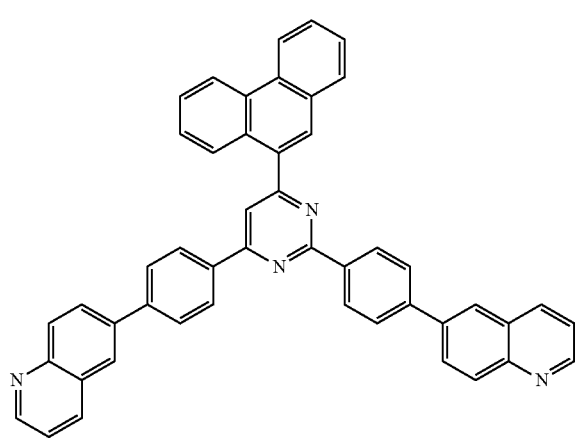
(54)
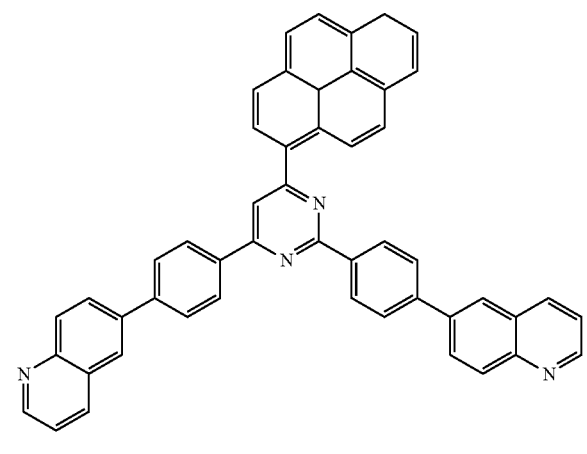
(55)
(56)

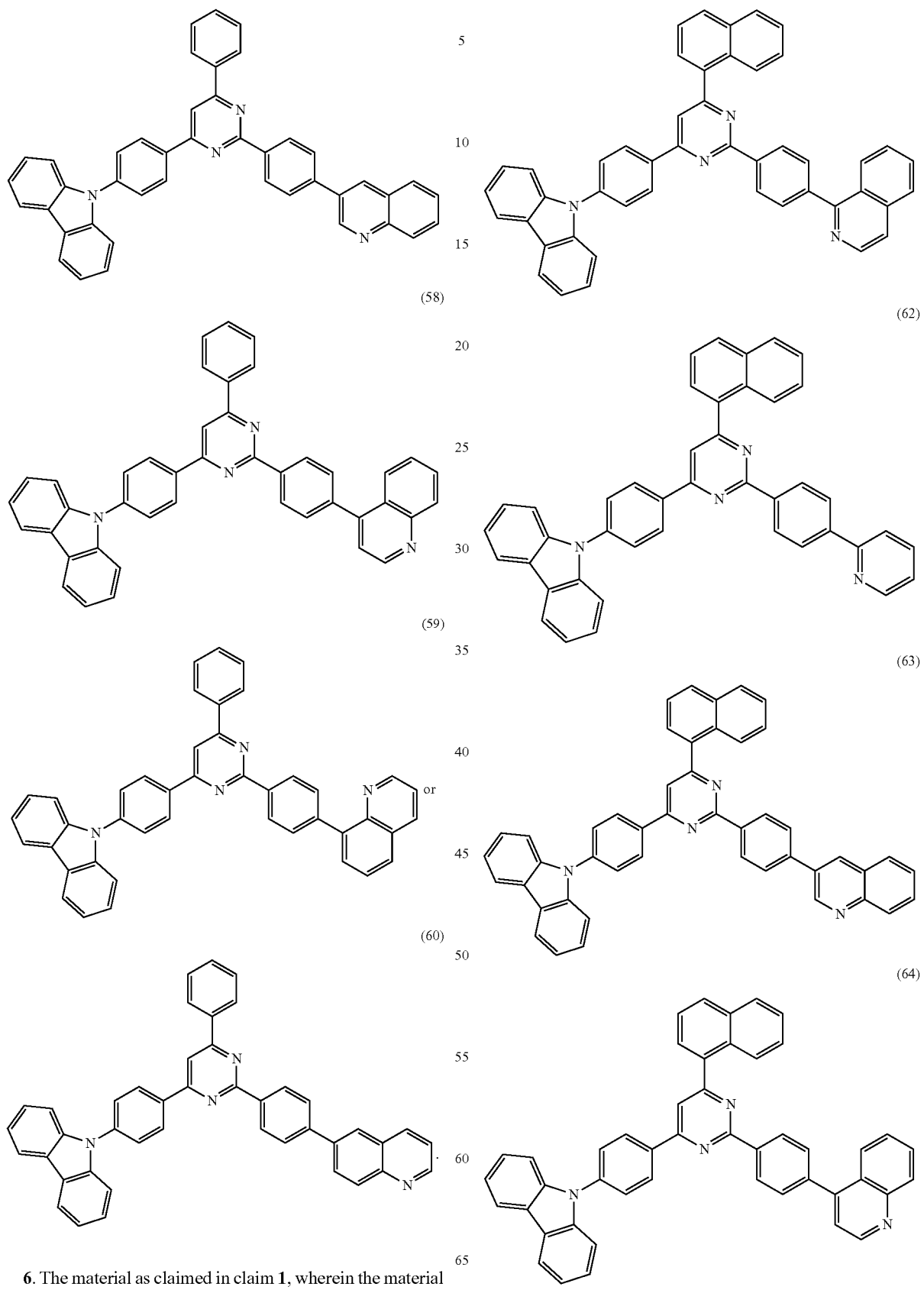
6. The material as claimed in claim 1, wherein the material includes at least one of the following compounds (61) to (75):

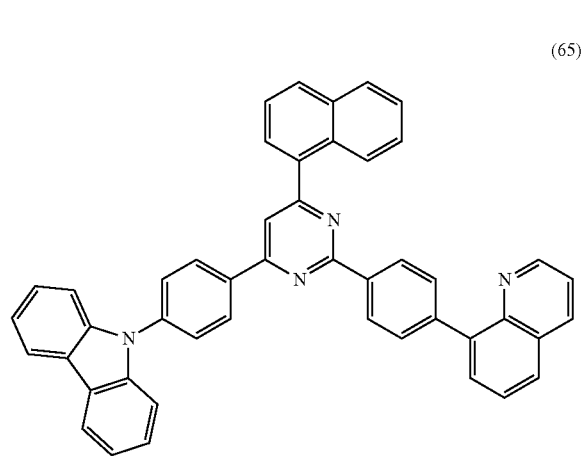
(65)
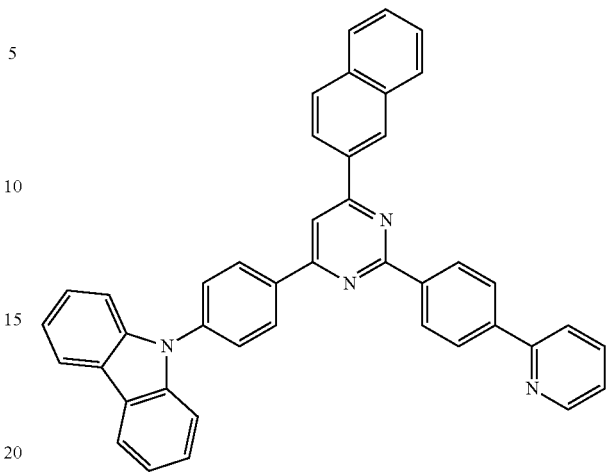
(68)
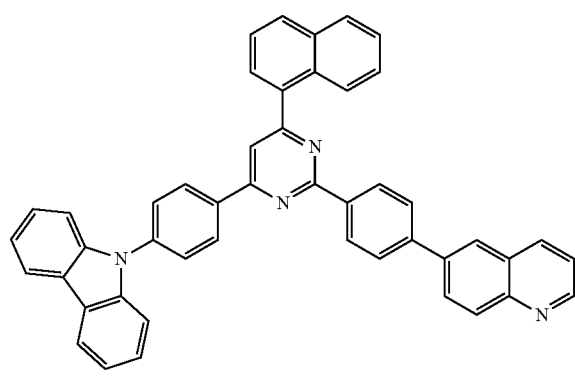
(66)
(69)
(67)
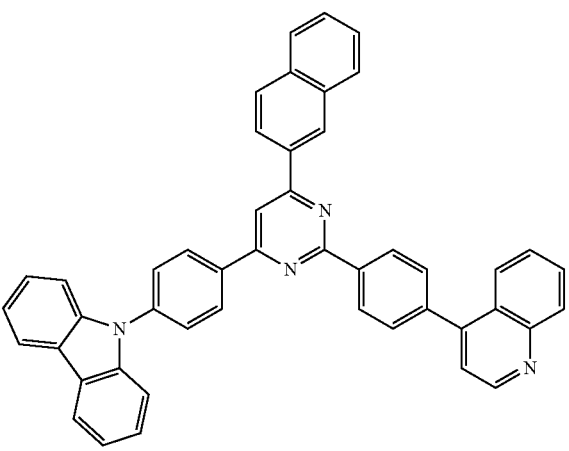
(70)

(71)
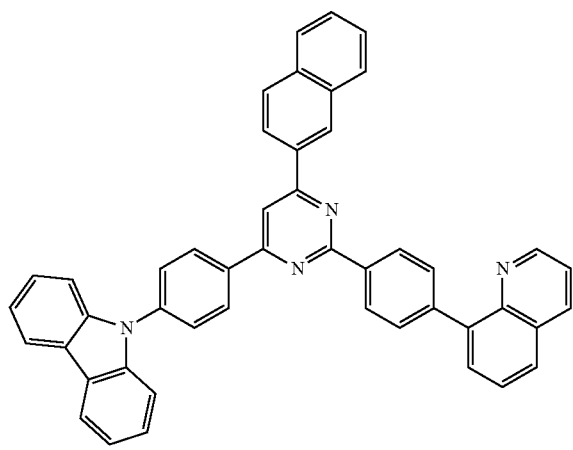
(72)
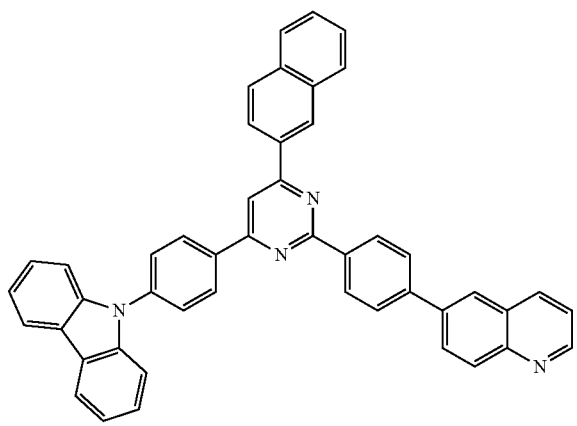
(73)
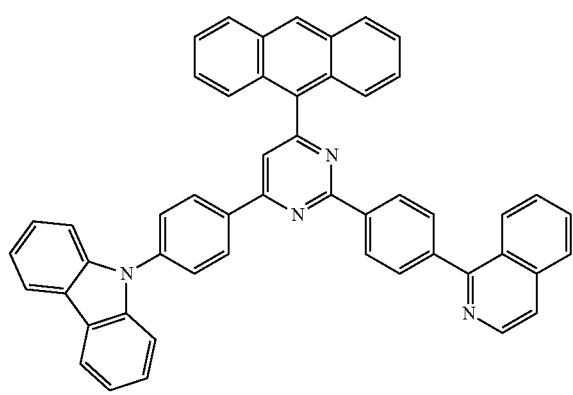
(74)
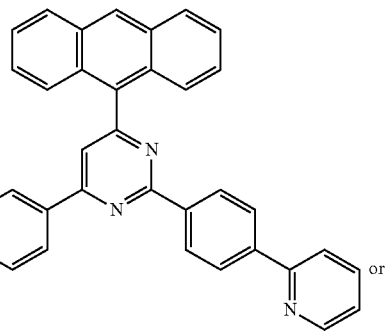
or
(75)
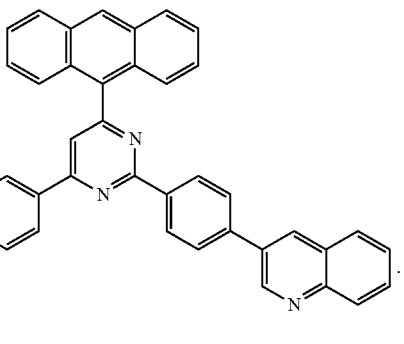
7. The material as claimed in claim 1, wherein the material includes at least one of the following compounds (76) to (90):
(76)
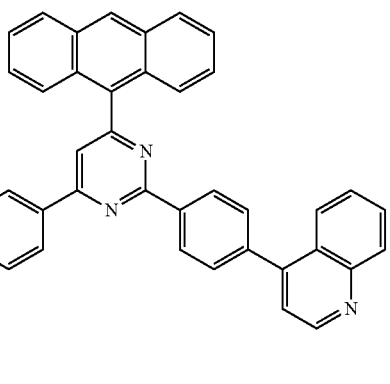

(77)
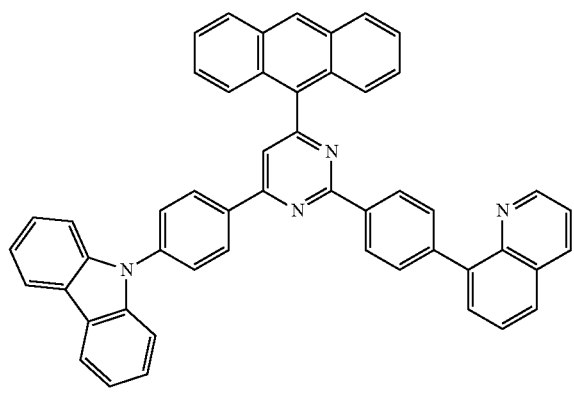
(80)
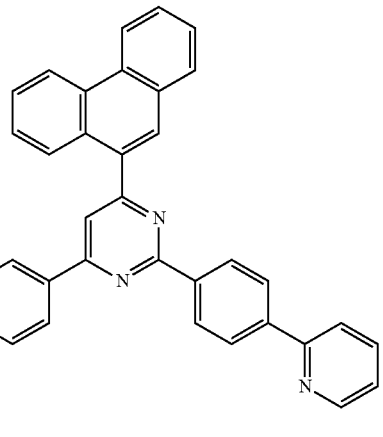
(78)
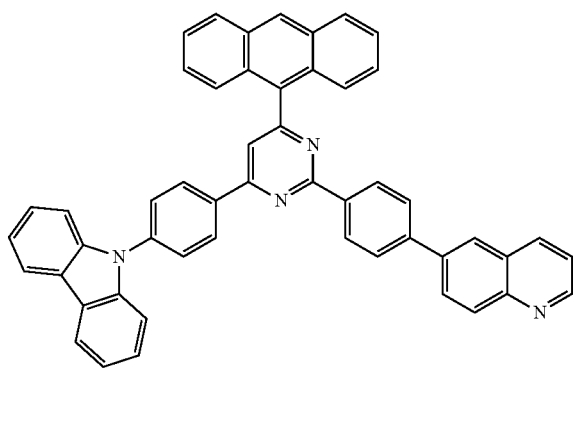
(81)
(79)
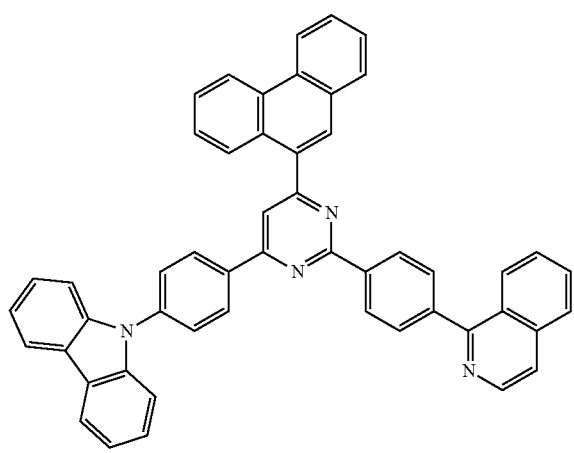
(82)
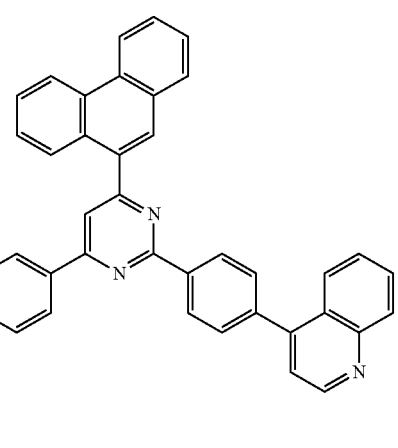

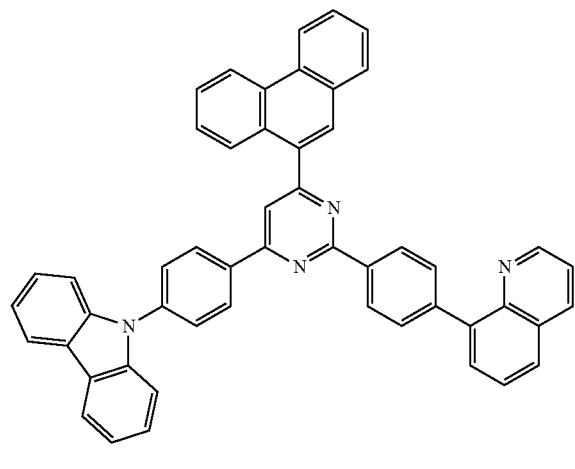
(83)
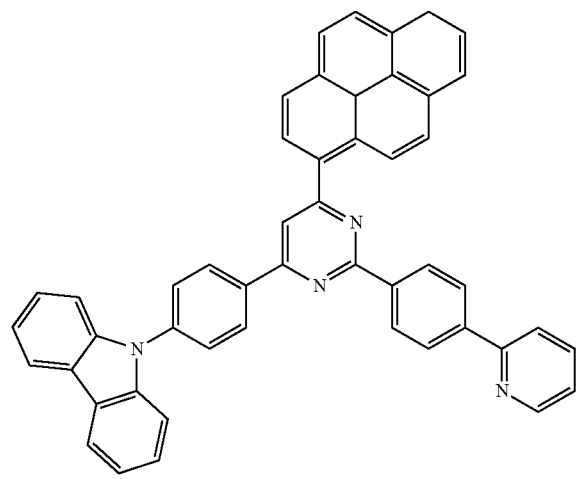
(86)
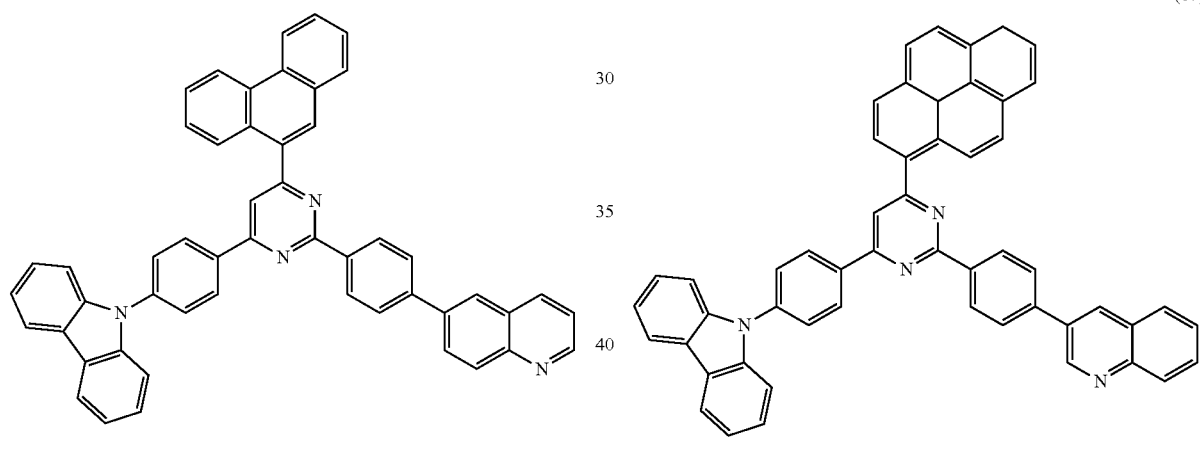
(84)
(87)
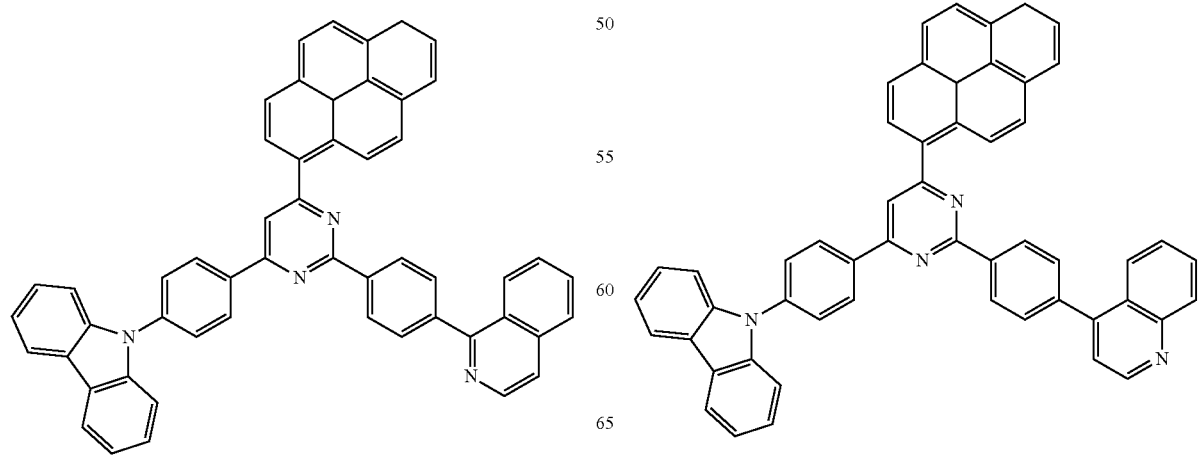
(85)
(88)

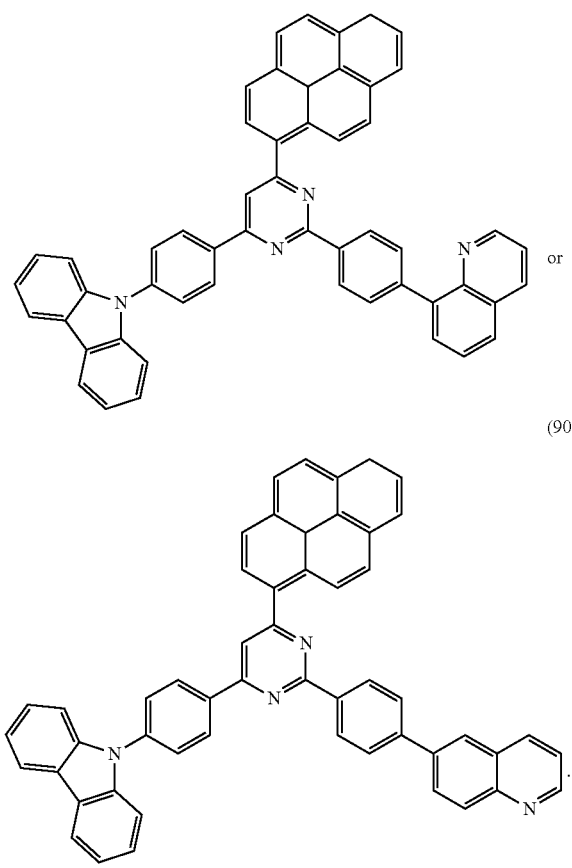

(89)

or (90).

8. An organic photoelectric device, comprising:
an anode,
a cathode, and
at least one organic thin layer between the anode and cathode,
wherein the at least one organic thin layer includes the material for an organic photoelectric device as claimed in claim 1.

9. The organic photoelectric device as claimed in claim 8, wherein the at least one organic thin layer includes an emission layer and at least one of a hole transport layer (HTL), a hole injection layer (HIL), an electron injection layer (EIL), and a hole blocking layer.

10. The organic photoelectric device as claimed in claim 8, wherein:
the at least one organic thin layer includes an electron transport layer (ETL) or an electron injection layer (EIL), and
the material for an organic photoelectric device is included in the electron transport layer (ETL) or the electron injection layer (EIL).

11. The organic photoelectric device as claimed in claim 8, wherein:
the at least one organic thin layer includes an emission layer, and
the material for an organic photoelectric device is included in the emission layer.

12. The organic photoelectric device as claimed in claim 8, wherein:
the at least one organic thin layer includes an emission layer, and
the material for an organic photoelectric device is a phosphorescent or fluorescent host in the emission layer.

13. The organic photoelectric device as claimed in claim 8, wherein:
the at least one organic thin layer includes an emission layer, and
the material for an organic photoelectric device is a fluorescent blue dopant in the emission layer.

14. The organic photoelectric device as claimed in claim 8, wherein the organic photoelectric device is one of an organic light emitting diode, an organic solar cell, an organic transistor, an organic photo-conductor drum, or an organic memory device.

15. A display device comprising the organic photoelectric device as claimed in claim 8.

16. An organic photoelectric device, comprising:
an anode,
a cathode, and
at least one organic thin layer between the anode and cathode,
wherein the at least one organic thin layer includes a material for an organic photoelectric device, the material including an asymmetric compound represented by the following Chemical Formula 1:

Chemical Formula 1

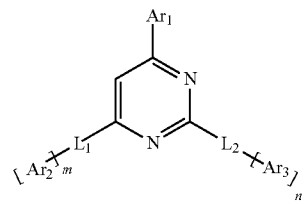

wherein, in Chemical Formula 1,
$Ar_1$ is hydrogen or a substituted or unsubstituted aryl, provided that when $Ar_1$ is a substituted aryl having a substituent, $Ar_2$ is not the same as the substituent of $Ar_1$ and the substituent is one of a C1 to C30 alkyl, a C1 to C10 heteroalkyl, a C3 to C30 cycloalkyl, a C6 to C30 aryl, a C1 to C30 alkoxy, a fluoro, and a cyano,
$Ar_2$ and $Ar_3$ are each independently a substituted or unsubstituted carbazolyl, a substituted or unsubstituted C2 to C30 heteroaryl, a substituted or unsubstituted C2 to C30 arylamine, or a substituted or unsubstituted C2 to C30 heteroarylamine,
$L_1$ and $L_2$ are each independently a substituted or unsubstituted phenylene, a substituted or unsubstituted naphthylene, or a substituted or unsubstituted anthracene, and
m and n are each independently integers of 1 to 4, and
wherein:
the at least one organic thin layer includes an electron transport layer (ETL) or an electron injection layer (EIL), and
the material for an organic photoelectric device is included in the electron transport layer (ETL) or the electron injection layer (EIL).

17. A display device comprising the organic photoelectric device as claimed in claim 16.

* * * * *